US012574050B2

(12) United States Patent
Galvin

(10) Patent No.: US 12,574,050 B2
(45) Date of Patent: Mar. 10, 2026

(54) FEDERATED LATENT TRANSFORMER DEEP LEARNING CORE

(71) Applicant: AtomBeam Technologies Inc., Moraga, CA (US)

(72) Inventor: Brian Galvin, Silverdale, WA (US)

(73) Assignee: AtomBeam Technologies Inc., Moraga, CA (US)

( * ) Notice: Subject to any disclaimer, the term of this patent is extended or adjusted under 35 U.S.C. 154(b) by 0 days.

(21) Appl. No.: 19/026,329

(22) Filed: Jan. 16, 2025

(65) Prior Publication Data

US 2025/0167802 A1 May 22, 2025

Related U.S. Application Data

(63) Continuation of application No. 18/919,394, filed on Oct. 17, 2024, now Pat. No. 12,231,151, which is a
(Continued)

(51) Int. Cl.
H03M 7/00 (2006.01)
G06N 20/00 (2019.01)
H03M 7/30 (2006.01)

(52) U.S. Cl.
CPC .......... H03M 7/3059 (2013.01); G06N 20/00 (2019.01); H03M 7/6005 (2013.01)

(58) Field of Classification Search
CPC ... H03M 7/3059; H03M 7/6005; G06N 20/00
See application file for complete search history.

(56) References Cited

U.S. PATENT DOCUMENTS 8,555,400 B2 10/2013 Shi et al.
10,091,529 B2 10/2018 Lee et al.
(Continued)

OTHER PUBLICATIONS

Gilard-Bachrach et al. ("Cryptonets: Applying Neural Networks to encrypted data with high throughput and Accuracy." International Conference on Machine learning, New York, 1016) (Year: 2016).*
(Continued)

*Primary Examiner* — Jean B Jeanglaude
(74) *Attorney, Agent, or Firm* — GALVIN PATENT LAW LLC; Brian R. Galvin

(57) ABSTRACT

A system and method for a federated deep learning platform utilizing homomorphically-compressed and encrypted data. The system comprises multiple client devices, each with a local dataset, and a central server hosting a deep learning core. Client devices convert local data into codewords, which are also homomorphically encrypted. The central server processes these encrypted codewords without decryption, preserving data privacy. The platform supports at least two architectural variants: a conventional Transformer trained on codewords, and a Latent Transformer operating on latent space vectors. Both variants eliminate the need for embedding and positional encoding layers. The system aggregates encrypted model updates from clients, enabling collaborative learning while maintaining data confidentiality. Additional features comprise differential privacy implementation and adaptive federated optimization techniques. This innovative approach allows for efficient, privacy-preserving distributed learning across diverse datasets, addressing key challenges in federated learning such as data heterogeneity, non-IID distributions, and communication efficiency.

13 Claims, 27 Drawing Sheets

Related U.S. Application Data continuation-in-part of application No. 18/898,608, filed on Sep. 26, 2024, and a continuation-in-part of application No. 18/893,984, filed on Sep. 24, 2024, said application No. 18/898,608 is a continuation-in-part of application No. 18/890,748, filed on Sep. 19, 2024, said application No. 18/919,394 is a continuation-in-part of application No. 18/770,652, filed on Jul. 12, 2024, said application No. 18/893,984 is a continuation-in-part of application No. 18/770,652, filed on Jul. 12, 2024, said application No. 18/919, 394 is a continuation-in-part of application No. 18/737,906, filed on Jun. 7, 2024, and a continuation-in-part of application No. 18/736,498, filed on Jun. 6, 2024, said application No. 18/890,748 is a continuation-in-part of application No. 18/623,018, filed on Mar. 31, 2024, now Pat. No. 12,119,848, said application No. 18/770,652 is a continuation-in-part of application No. 18/503,135, filed on Nov. 6, 2023, now Pat. No. 12,237,848, which is a continuation of application No. 18/305,305, filed on Apr. 21, 2023, now Pat. No. 11,811,428, which is a continuation-in-part of application No. 18/190,044, filed on Mar. 24, 2023, now Pat. No. 11,831,343, which is a continuation-in-part of application No. 17/875,201, filed on Jul. 27, 2022, now Pat. No. 11,700,013, and a continuation-in-part of application No. 17/727,913, filed on Apr. 25, 2022, now Pat. No. 11,620,051, said application No. 17/875,201 is a continuation of application No. 17/514,913, filed on Oct. 29, 2021, now Pat. No. 11,424,760, and a continuation of application No. 17/458,747, filed on Aug. 27, 2021, now Pat. No. 11,422,978, said application No. 17/727,913 is a continuation of application No. 17/404,699, filed on Aug. 17, 2021, now Pat. No. 11,385,794, said application No. 17/514,913 is a continuation-in-part of application No. 17/404,699, filed on Aug. 17, 2021, now Pat. No. 11,385,794, said application No. 18/305,305 is a continuation-in-part of application No. 17/234,007, filed on Apr. 19, 2021, now Pat. No. 11,782,879, which is a continuation-in-part of application No. 17/180,439, filed on Feb. 19, 2021, now Pat. No. 11,366,790, which is a continuation-in-part of application No. 16/923,039, filed on Jul. 7, 2020, now Pat. No. 11,232,076, said application No. 17/458,747 is a continuation-in-part of application No. 16/923,039, filed on Jul. 7, 2020, now Pat. No. 11,232,076, which is a continuation-in-part of application No. 16/716,098, filed on Dec. 16, 2019, now Pat. No. 10,706,018, which is a continuation of application No. 16/455,655, filed on Jun. 27, 2019, now Pat. No. 10,509,771, said application No. 17/404,699 is a continuation-in-part of application No. 16/455, 655, filed on Jun. 27, 2019, now Pat. No. 10,509,771, which is a continuation-in-part of application No. 16/200,466, filed on Nov. 26, 2018, now Pat. No. 10,476,519, which is a continuation-in-part of application No. 15/975,741, filed on May 9, 2018, now Pat. No. 10,303,391.

(60) Provisional application No. 63/651,359, filed on May 23, 2024, provisional application No. 63/485,518, filed on Feb. 16, 2023, provisional application No. 63/388,411, filed on Jul. 12, 2022, provisional application No. 63/232,041, filed on Aug. 11, 2021, provisional application No. 63/140,111, filed on Jan. 21, 2021, provisional application No. 63/027,166, filed on May 19, 2020, provisional application No. 62/926,723, filed on Oct. 28, 2019, provisional application No. 62/578,824, filed on Oct. 30, 2017.

(56) References Cited

U.S. PATENT DOCUMENTS

| | | | | |
|---|---|---|---|---|
| 11,276,001 | B1* | 3/2022 | Sutherland | G06F 21/6254 |
| 11,461,690 | B2 | 10/2022 | Szeto et al. | |
| 2015/0154646 | A1* | 6/2015 | Mishra | G16H 50/30 |
| | | | | 705/3 |
| 2019/0026489 | A1* | 1/2019 | Nerurkar | G16H 10/60 |
| 2022/0156631 | A1 | 5/2022 | Kanso et al. | |
| 2023/0019128 | A1* | 1/2023 | Zeghidour | H03M 7/3082 |
| 2023/0131694 | A1 | 4/2023 | Saber et al. | |
| 2023/0169709 | A1 | 6/2023 | Im et al. | |
| 2023/0222334 | A1 | 7/2023 | Clement et al. | |
| 2024/0185037 | A1 | 6/2024 | Park et al. | |
| 2024/0195438 | A1 | 6/2024 | Isik et al. | |
| 2024/0220829 | A1 | 7/2024 | Hu et al. | |
| 2024/0370464 | A1 | 11/2024 | Lehmann et al. | |

OTHER PUBLICATIONS

Worrall et al. (Interpretable transforms with encoder-decoder networks. Proceedings of the IEEE International Conference on Computer Vision, 2017, pp. 5726-5735. (Year: 2017).*

Balaneshin-Kordan, Saeid et al., "Deep Neural Architecture for Multi-Modal Retrieval based on Joint Embedding Space for Text and Images", Association for Computing Machinery, Feb. 5-9, 2018, pp. 1-9, Marina Del Rey, CA, USA.

Khan, Abdul Rafae et al, "Coding Textual Inputs Boosts the Accuracy of Neural Networks", 2020 Conference on Empirical Methods in Natural Language Processing, Nov. 16-20, 2020, pp. 1350-1360.

Messina, Nicola et al., "Towards Efficient Cross-Modal Visual Textual Retrieval using Transformer-Encoder Deep Features", 2021 International Conference on Content-Based Multimedia Indexing, 2021, pp. 1-6, United States.

Pagnoni et al; "Byte Latent Transformer: Patches Scale Better Than Tokens", FAIR at Meta, 2024.

Seo, Beomseok et al., "How Does A Transformer Learn Compression? An Attention Study on Huffman and LZ4", Department of Electronic and Electrical Engineering, Dec. 12, 2023, pp. 1-10, vol. 11, Seoul, South Korea.

Tjandra et al; "Speech-to-Speech Translation Between Untranscribed Unknown Languages", IEEE, Nara Institute of Science and Technology Japan, 2019.

Vaswani, Ashish et al., "Attention is All You Need", 31st Conference on Neural Information Processing Systems, 2017, pp. 1-11, Long Beach, CA, USA.

Wang, Tianming et al., "T-CVAE: Transformer-Based Conditioned Variational Autoencoder for Story Completion", Proceedings of the Twenty-Eigth Joint Conference on Artificial Intelligence, pp. 5233-5239.

Wieting, John et al., "A Bilingual Generative Transformer for Semantic Sentence Embedding", Nov. 19, 2020, pp. 1-14.

* cited by examiner

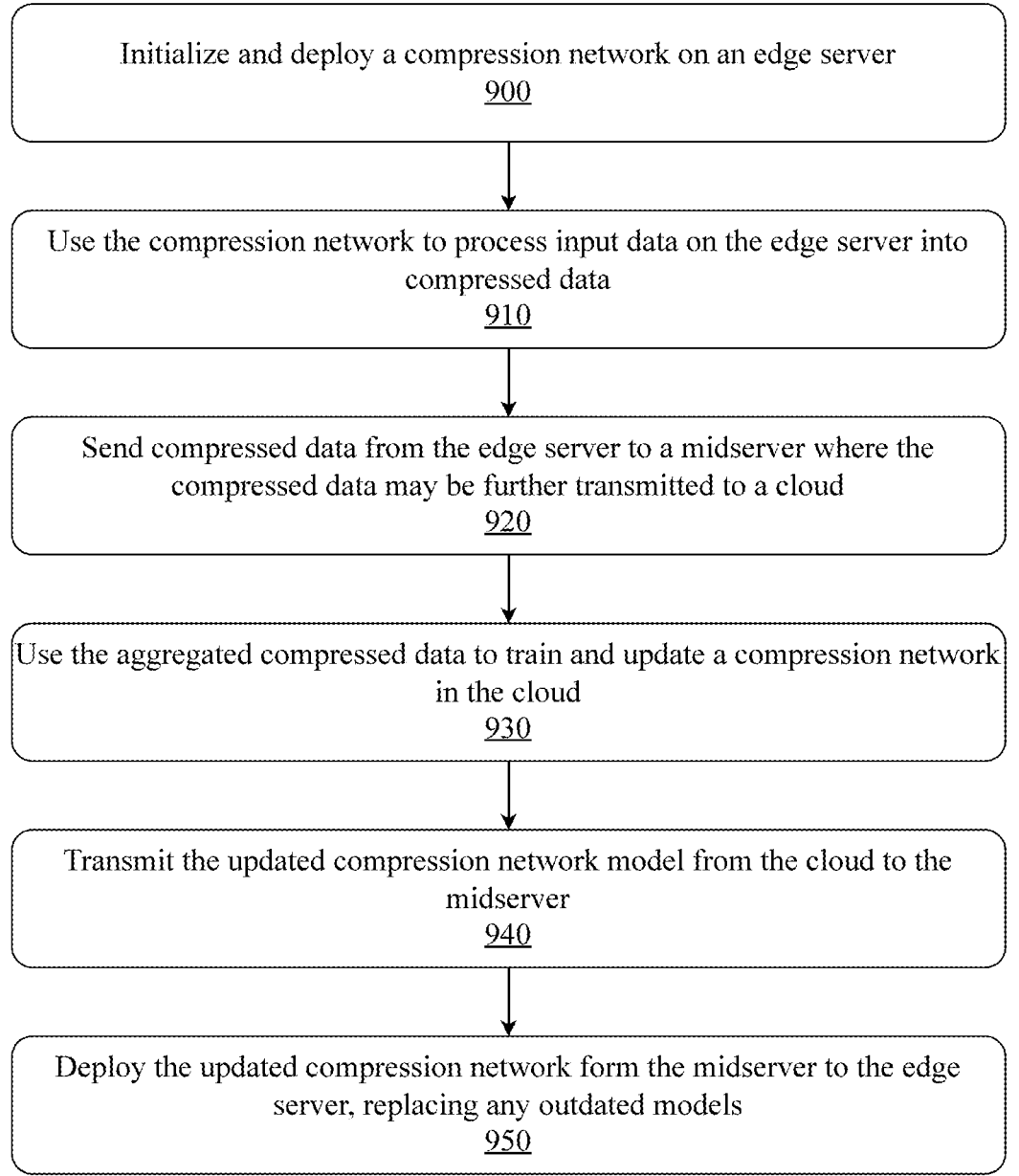

Initialize and deploy a compression network on an edge server
900

Use the compression network to process input data on the edge server into compressed data
910

Send compressed data from the edge server to a midserver where the compressed data may be further transmitted to a cloud
920

Use the aggregated compressed data to train and update a compression network in the cloud
930

Transmit the updated compression network model from the cloud to the midserver
940

Deploy the updated compression network form the midserver to the edge server, replacing any outdated models
950

FIG. 9

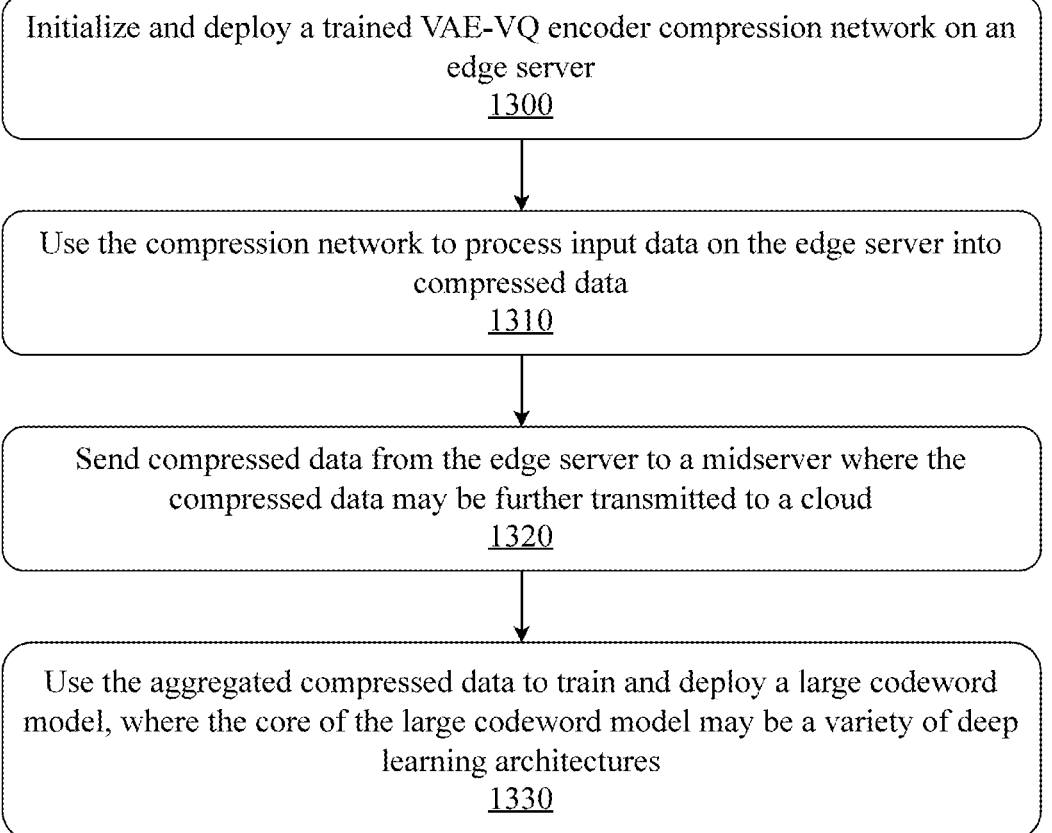

Initialize and deploy a trained VAE-VQ encoder compression network on an
edge server
1300

Use the compression network to process input data on the edge server into
compressed data
1310

Send compressed data from the edge server to a midserver where the
compressed data may be further transmitted to a cloud
1320

Use the aggregated compressed data to train and deploy a large codeword
model, where the core of the large codeword model may be a variety of deep
learning architectures
1330

FIG. 13

A client device, of a plurality of client devices, preprocesses its local dataset
2301

Initialize a deep learning core
2302

Transmit current model parameters to client devices
2303

Client devices perform local training on their encrypted codewords
2304

Client devices send encrypted gradients to central server
2305

Update global model in deep learning core
2306

2300

FEDERATED LATENT TRANSFORMER DEEP LEARNING CORE

CROSS-REFERENCE TO RELATED APPLICATIONS

Priority is claimed in the application data sheet to the following patents or patent applications, each of which is expressly incorporated herein by reference in its entirety:

Ser. No. 18/919,394
Ser. No. 18/898,608
Ser. No. 18/890,748
Ser. No. 18/623,018
Ser. No. 18/893,984
Ser. No. 18/770,652
Ser. No. 18/503,135
Ser. No. 18/305,305
Ser. No. 18/190,044
Ser. No. 17/875,201
Ser. No. 17/514,913
Ser. No. 17/404,699
Ser. No. 16/455,655
Ser. No. 16/200,466
Ser. No. 15/975,741
62/578,824
Ser. No. 17/458,747
Ser. No. 16/923,039
63/027,166
Ser. No. 16/716,098
62/926,723
63/388,411
Ser. No. 17/727,913
63/485,518
63/232,041
Ser. No. 17/234,007
Ser. No. 17/180,439
63/140,111
Ser. No. 18/737,906
Ser. No. 18/736,498
63/651,359

BACKGROUND OF THE INVENTION

Field of the Art

The present invention is in the field of data compression, and more particularly is directed to the problem of efficiently compressing large sets of data without losing information.

Discussion of the State of the Art

Data compression plays an integral part in manipulating vast sets of information. The process allows data to be compressed into a smaller, more manageable format which allows the data to be analyzed, processed, and transferred. An ideal method for data compression attempts to preserve as much of the original information as possible while also being fast and efficient. Generally, there are two main categories of data compression: lossless compression and lossy compression.

Lossless data compression is a process where none of the original information is sacrificed in the compression process. Information that has been compressed using a lossless compression algorithm will be exactly reproduced when the information is decompressed. This process is typically used for data types such as text files, executable programs, and some images. By contrast, lossy data compression algorithms sacrifice some of the original information in the compression process to achieve higher compression ratios. When information that has been compressed using a lossy compression algorithm is decompressed, the resulting file will be similar to the original information, but some portions of the original information may be missing. This method is generally reserved for file types such as Joint Photographic Experts Groups (JPEGs), Moving Picture Experts Groups (MPEGs), and MPEG Audio Layer III (MP3) files. With JPEGs, MPEGs, and MP3s, original information can still be identified even if some information is lost after the compression and decompression process. A third approach to data compression is transform coding where information is translated into a domain separate from the original domain. This process includes processes such as Discrete Cosine Transforms (DCT) and Discrete Wavelet Transforms (DWT) which are most commonly associated with the compression of images and audio files.

One area where data compression has become exceedingly important is related to telemetry, tracking, and command (TT&C) subsystems which are used in satellite systems. TT&C subsystems play a crucial role in facilitating essential communications between satellites and ground stations. In many cases, TT&C subsystems are the sole means through which satellites' operations and status can be monitored and controlled remotely from earth. Many satellite systems demand transmitting massive quantities of information over large distances; a process which becomes exponentially easier when the information is compressed.

What is needed is a system and method for learning-based lossless data compression where information can be reliably and efficiently compressed with low-latency and without the loss of information during compression. By integrating a plurality of neural networks into a compression system and method, information can be reliably compressed with low-latency and high efficiency all while keeping the original information intact throughout the process.

SUMMARY OF THE INVENTION

Accordingly, the inventor has conceived and reduced to practice, a system and method for a federated deep learning platform utilizing homomorphically-compressed and encrypted data. The system comprises multiple client devices, each with a local dataset, and a central server hosting a deep learning core. Client devices convert local data into codewords, which are also homomorphically encrypted. The central server processes these encrypted codewords without decryption, preserving data privacy. The platform supports at least two architectural variants: a conventional Transformer trained on codewords, and a Latent Transformer operating on latent space vectors. Both variants eliminate the need for embedding and positional encoding layers. The system aggregates encrypted model updates from clients, enabling collaborative learning while maintaining data confidentiality. Additional features comprise differential privacy implementation and adaptive federated optimization techniques.

According to a preferred embodiment, a system for federated deep learning using homomorphically-compressed and encrypted data is disclosed, comprising: a computing device comprising at least a memory and a processor; a plurality of programming instructions stored in the memory and operable on the processor, wherein the plurality of programming instructions, when operating on the processor, cause the computing device to: receive encrypted codewords from a plurality of client devices, each client device having:

a local dataset; and a compression network that converts the local dataset into a plurality of homomorphically encrypted codewords; process the encrypted codewords using a deep learning core without decrypting the codewords; aggregate encrypted model updates from the plurality of client devices; update the deep learning core based on the aggregated encrypted model updates; train the deep learning core using the homomorphically encrypted codewords from the plurality of client devices; and facilitate federated learning by iteratively updating the deep learning core based on encrypted updates from the client devices.

According to another preferred embodiment, a method for federated deep learning using homomorphically-compressed and encrypted data is disclosed, comprising the steps of: receiving encrypted codewords from a plurality of client devices, each client device having: a local dataset; and a compression network that converts the local dataset into a plurality of homomorphically encrypted codewords; processing the encrypted codewords using a deep learning core without decrypting the codewords; aggregating encrypted model updates from the plurality of client devices; updating the deep learning core based on the aggregated encrypted model updates; training the deep learning core using the homomorphically encrypted codewords from the plurality of client devices; and facilitating federated learning by iteratively updating the deep learning core based on encrypted updates from the client devices.

According to an aspect of an embodiment, the deep learning core comprises a transformer-based machine learning architecture.

According to an aspect of an embodiment, each client device further comprises a codebook generation subsystem that generates a codebook mapping sourceblocks to codewords.

According to an aspect of an embodiment, the codeword allocator assigns codewords to sourceblocks based on the codebook.

According to an aspect of an embodiment, the transformer-based machine learning architecture comprises: an embedding layer; a positional encoding layer; a multi-head attention mechanism; and a feed-forward network.

According to an aspect of an embodiment, the deep learning core comprises a latent transformer architecture.

According to an aspect of an embodiment, each client device further comprises a variational autoencoder encoder that generates latent space vectors from the plurality of codewords.

According to an aspect of an embodiment, the latent transformer architecture processes the latent space vectors without using an embedding layer and a positional encoding layer.

According to an aspect of an embodiment, the computing device further comprises a variational autoencoder decoder that generates output vectors from processed latent space vectors.

According to an aspect of an embodiment, the plurality of programming instructions further cause the computing device to: implement differential privacy by: adding calibrated noise to the encrypted model updates before aggregation; enforcing a privacy budget across multiple rounds of federated learning; and dynamically adjusting the level of noise based on the privacy budget consumption; thereby enhancing privacy guarantees for individual client datasets while maintaining model utility.

BRIEF DESCRIPTION OF THE DRAWING FIGURES

FIG. 9 is a flow diagram illustrating an exemplary method for a training and utilizing a compression network on an edge server.

FIG. 13 is a flow diagram illustrating an exemplary method for federated two-state compression with federated joint learning using a VAE-VQ and a transformer.

DETAILED DESCRIPTION OF THE INVENTION

Figure 1:
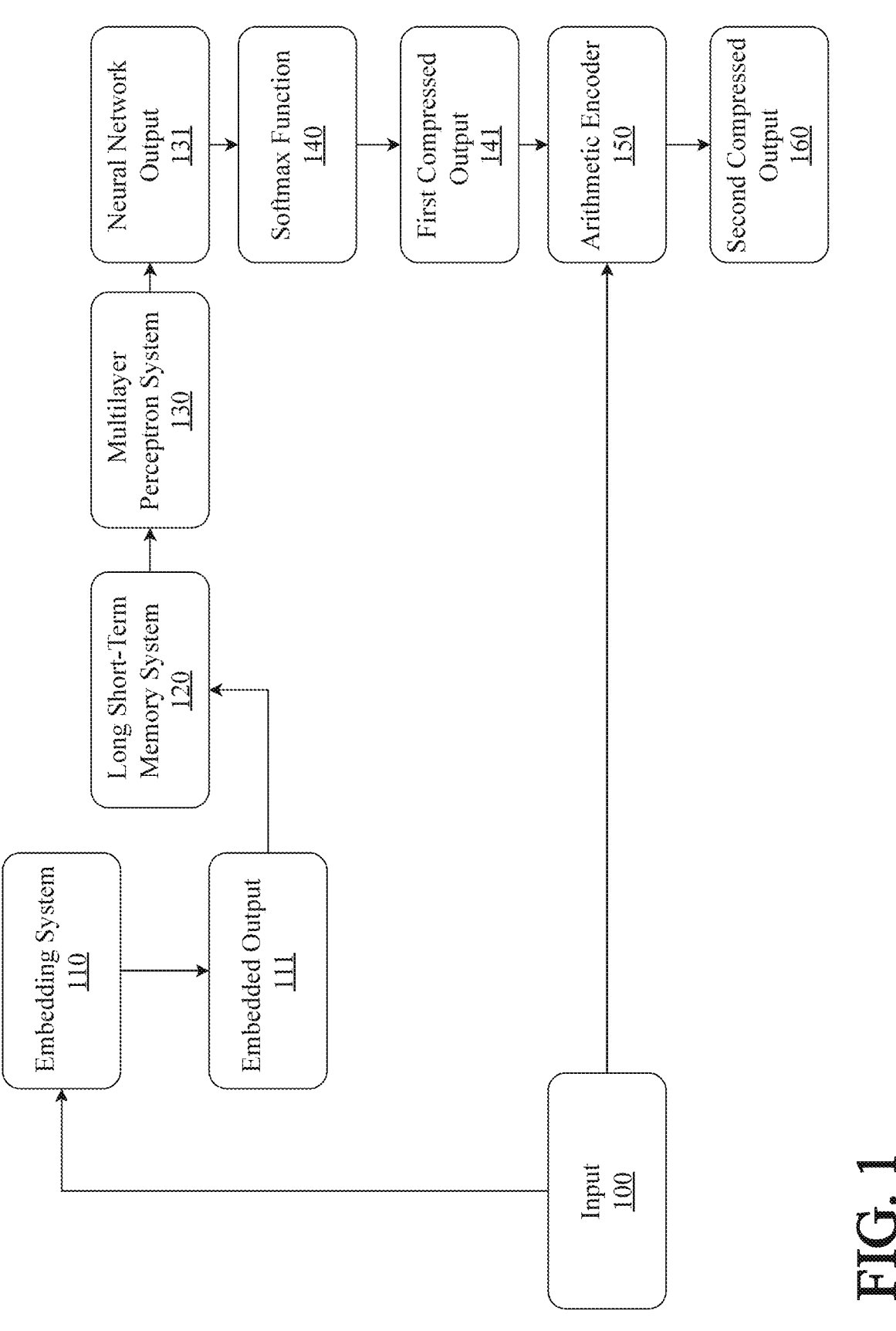
FIG. 1 is a block diagram illustrating an exemplary system architecture for learning-based lossless data compression.

The inventor has conceived, and reduced to practice, a system and method for a federated deep learning platform utilizing homomorphically-compressed and encrypted data. The system comprises multiple client devices, each with a local dataset, and a central server hosting a deep learning core. Client devices convert local data into codewords, which are also homomorphically encrypted. The central server processes these encrypted codewords without decryption, preserving data privacy. The platform supports at least two architectural variants: a conventional Transformer trained on codewords, and a Latent Transformer operating on latent space vectors. Both variants eliminate the need for embedding and positional encoding layers. The system aggregates encrypted model updates from clients, enabling collaborative learning while maintaining data confidentiality. Additional features comprise differential privacy implementation and adaptive federated optimization techniques.

One or more different aspects may be described in the present application. Further, for one or more of the aspects described herein, numerous alternative arrangements may be described; it should be appreciated that these are presented for illustrative purposes only and are not limiting of the aspects contained herein or the claims presented herein in any way. One or more of the arrangements may be widely applicable to numerous aspects, as may be readily apparent from the disclosure. In general, arrangements are described in sufficient detail to enable those skilled in the art to practice one or more of the aspects, and it should be appreciated that other arrangements may be utilized and that structural, logical, software, electrical and other changes may be made without departing from the scope of the particular aspects. Particular features of one or more of the aspects described herein may be described with reference to one or more particular aspects or figures that form a part of the present disclosure, and in which are shown, by way of illustration, specific arrangements of one or more of the aspects. It should be appreciated, however, that such features are not limited to usage in one or more particular aspects or figures with reference to which they are described. The present disclosure is neither a literal description of all arrangements of one or more of the aspects nor a listing of features of one or more of the aspects that must be present in all arrangements.

Headings of sections provided in this patent application and the title of this patent application are for convenience only and are not to be taken as limiting the disclosure in any way.

Devices that are in communication with each other need not be in continuous communication with each other, unless expressly specified otherwise. In addition, devices that are in communication with each other may communicate directly or indirectly through one or more communication means or intermediaries, logical or physical.

A description of an aspect with several components in communication with each other does not imply that all such components are required. To the contrary, a variety of optional components may be described to illustrate a wide variety of possible aspects and in order to more fully illustrate one or more aspects. Similarly, although process steps, method steps, algorithms or the like may be described in a sequential order, such processes, methods, and algorithms may generally be configured to work in alternate orders, unless specifically stated to the contrary. In other words, any sequence or order of steps that may be described in this patent application does not, in and of itself, indicate a requirement that the steps be performed in that order. The steps of described processes may be performed in any order practical. Further, some steps may be performed simultaneously despite being described or implied as occurring non-simultaneously (e.g., because one step is described after the other step). Moreover, the illustration of a process by its depiction in a drawing does not imply that the illustrated process is exclusive of other variations and modifications thereto, does not imply that the illustrated process or any of its steps are necessary to one or more of the aspects, and does not imply that the illustrated process is preferred. Also, steps are generally described once per aspect, but this does not mean they must occur once, or that they may only occur once each time a process, method, or algorithm is carried out or executed. Some steps may be omitted in some aspects or some occurrences, or some steps may be executed more than once in a given aspect or occurrence.

When a single device or article is described herein, it will be readily apparent that more than one device or article may be used in place of a single device or article. Similarly, where more than one device or article is described herein, it will be readily apparent that a single device or article may be used in place of more than one device or article.

The functionality or the features of a device may be alternatively embodied by one or more other devices that are not explicitly described as having such functionality or features. Thus, other aspects need not include the device itself.

Techniques and mechanisms described or referenced herein will sometimes be described in singular form for clarity. However, it should be appreciated that particular aspects may include multiple iterations of a technique or multiple instantiations of a mechanism unless noted otherwise. Process descriptions or blocks in figures should be understood as representing modules, segments, or portions of code which include one or more executable instructions for implementing specific logical functions or steps in the process. Alternate implementations are included within the scope of various aspects in which, for example, functions may be executed out of order from that shown or discussed, including substantially concurrently or in reverse order, depending on the functionality involved, as would be understood by those having ordinary skill in the art.

Definitions

As used herein, "sourceblock" to a semantically meaningful unit of text that is derived from the input data through a process called syntactic splitting. Syntactic splitting involves breaking down the input text into smaller chunks along syntactic boundaries, such as those between words or tokens. These resulting chunks, or sourceblocks, serve as the basic units of representation in Large Codeword Model (LCM), replacing the traditional word or subword tokens used in Large Language Models (LLMs). Each sourceblock is then assigned a unique codeword from a codebook, which allows for efficient compression and processing of the text data. By preserving syntactic and semantic information within sourceblocks, LCMs aim to capture the inherent structure and meaning of the language more effectively while achieving higher compression ratios compared to LLMs.

As used herein, "machine learning core" refers to the central component responsible for processing and learning from the codeword representations derived from the input data. This core can consist of one or more machine learning architectures, working individually or in combination, to capture the patterns, relationships, and semantics within the codeword sequences. Some common architectures that can be employed in the machine learning core of LCMs include but are not limited to transformers, variational autoencoders (VAEs), recurrent neural networks (RNNs), convolutional neural networks (CNNs), and attention mechanisms. These architectures can be adapted to operate directly on the codeword representations, with or without the need for traditional dense embedding layers. The machine learning core learns to map input codeword sequences to output codeword sequences, enabling tasks such as language modeling, text generation, and classification. By leveraging the compressed and semantically rich codeword representations, the machine learning core of LCMs can potentially achieve more efficient and effective learning compared to traditional token-based models. The specific choice and configuration of the machine learning architectures in the core can be tailored to the characteristics of the input data and the desired output tasks, allowing for flexibility and adaptability in the design of LCMs.

As used herein, "codeword" refers to a discrete and compressed representation of a sourceblock, which is a meaningful unit of information derived from the input data. Codewords are assigned to sourceblocks based on a codebook generated by a codebook generation system. The codebook contains a mapping between the sourceblocks and their corresponding codewords, enabling efficient representation and processing of the data. Codewords serve as compact and encoded representations of the sourceblocks, capturing their essential information and characteristics. They are used as intermediate representations within the LCM system, allowing for efficient compression, transmission, and manipulation of the data.

Conceptual Architecture

Figure 14:
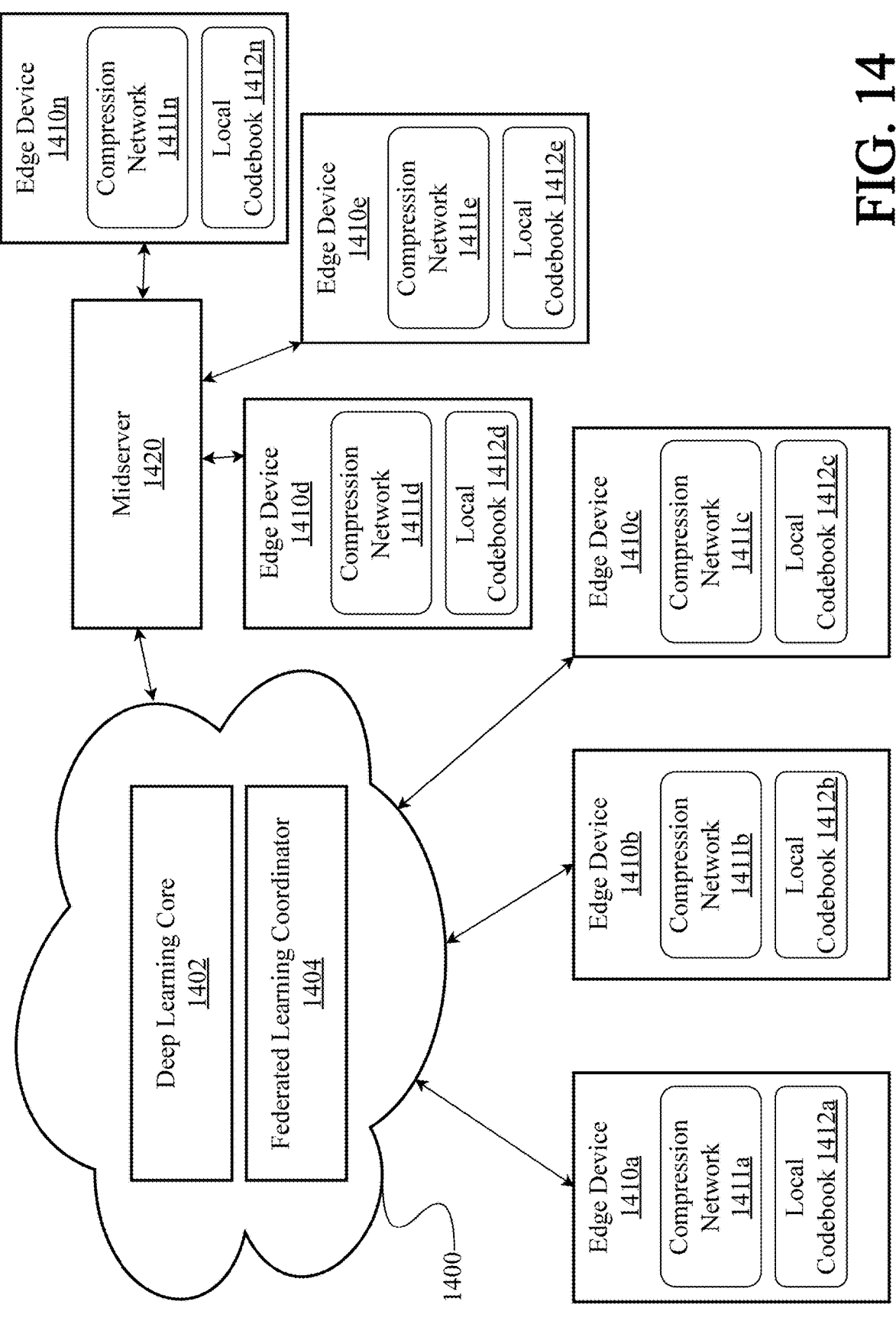
FIG. 14 is a block diagram illustrating an exemplary system architecture for a federated large codeword model deep learning platform with homomorphic compression and encryption, according to an embodiment.

FIG. 14 is a block diagram illustrating an exemplary system architecture for a federated large codeword model deep learning platform with homomorphic compression and encryption, according to an embodiment. According to the embodiment, the deep learning platform 1400 comprises a central deep learning core 1402 comprising one or more models configured to process and operate on encrypted codewords and a federated learning coordinator system 1404 which acts as a central orchestrator for various distributed learning processes. As shown, the federated system further comprises multiple distributed nodes represented as a plurality of edge devices 1410a-n. Each edge device has local data, a homomorphic compression and encryption network 1411a-n, and a local instance of a secure codebook 1412a-n. Edge devices 1410a-n may further comprise a local instance of the central deep learning model. In some implementations, deep learning platform 1400 may comprise one or more of a universal codebook 623, universal codewords 622, and large codeword model 621 or other deep learning core model. According to an embodiment, the compression network is a local instance of the central deep learning model operating in the cloud on platform 1400.

In essence, the compression and encryption network acts as a secure preprocessor for the central deep learning model, transforming the data into a form that preserves privacy while still allowing for effective learning. The central deep learning model, in turn, is specifically designed to work with this transformed data, enabling secure and efficient distributed learning across the federated system. The deep learning model can train on sensitive data without ever seeing it in its raw form, as it operates on the compressed and encrypted version. The compression reduces the data size, allowing for more efficient processing by the deep learning model, especially in a distributed setting. When aggregating model updates from different nodes, the system can work directly with the compressed and encrypted representations, maintaining privacy throughout the process. The deep learning model can perform operations like addition and multiplication on the encrypted data, which are essential for many learning algorithms. This relationship enables nodes to contribute to the learning process without sharing raw data, only sharing the encrypted, compressed updates to the model.

In some embodiments, a midserver 1420 may be present and configured to act as an intermediary data processing system which can aggregate data from connected nodes, disseminate model updates to connected nodes, and communicate with federated deep learning platform 1400. Midserver 1420 may comprise one or more codebooks, codewords, compression networks, and coordinator modules, depending upon the embodiment.

According to an embodiment, the central deep learning core/model is a conventional transformer trained on codewords.

According to an embodiment, the central deep learning core/model is a latent transformer operating on latent space representations of codewords.

According to an embodiment, the homomorphic compression and encryption network comprises a variational autoencoder for compression.

According to an embodiment, the secure local codebooks are updated periodically based on federated learning results.

According to an embodiment, compression and encryption network performs data encryption by applying a dyadic distribution-based algorithm to the local data on an edge device. In such embodiments, a compression network (e.g., VAE, quantizer, etc.) may process the dyadically transformed data to produce compressed data.

The federated learning coordinator 1404 manages the overall learning process across distributed nodes, facilitating model updates, ensuring security, and maintaining system integrity without directly accessing the raw data on individual nodes. The coordinator is responsible for central orchestration, initiating and managing learning rounds, and determining which nodes participate based on their availability and data quality. It maintains and distributes the global model to participating nodes, ensuring all have the latest version before each learning round. After local training, the coordinator receives model updates from participating nodes and aggregates these updates securely, possibly using homomorphic encryption techniques, before applying them to the global model. According to an embodiment, federated learning coordinator 1404 aggregates encrypted model updates from distributed nodes.

Security management is a key function of the coordinator. It may be configured to verify the integrity and authenticity of participating nodes, manage encryption keys for secure communication and homomorphic operations, and enforce access controls based on security clearance levels. According to an embodiment, the coordinator also manages a global secure codebook with encrypted dictionaries, coordinating the process of adding new entries as proposed by nodes and ensuring all nodes have synchronized, up-to-date codebooks.

In an implementation, performance monitoring is supported by the coordinator. The coordinator can track the performance of the global model and individual node contributions, detecting and mitigating potential issues like model divergence or adversarial attacks. It may implement, for example, differential privacy techniques to add noise to aggregated updates, ensuring individual node contributions cannot be reverse-engineered from the global model. The coordinator also handles load balancing, distributing computational load across nodes based on their capabilities and data quality, and manages node participation to ensure fair and efficient use of resources.

The coordinator handles node failures or disconnections gracefully, ensuring learning progress can continue even if some nodes become unavailable. It may be configured to enforce data governance policies across the federated network and maintain audit logs for compliance and transparency.

Implementing this federated learning coordinator may comprise developing a secure communication protocol between the coordinator and nodes, creating a robust model versioning and distribution system, and implementing secure aggregation algorithms that work with homomorphically encrypted updates. In an implementation, coordinator 1404 utilizes a flexible scheduling system for managing learning rounds and node participation, implementing a secure key management system for encryption and authentication, and developing monitoring and logging systems for performance tracking and auditing.

The federated learning coordinator provides numerous benefits, including centralized control, enhanced security, efficient learning, scalability, and compliance. According to various embodiments, it provides a single point of management for the entire federated learning process, manages security protocols and access controls across the network, optimizes the learning process by intelligently managing node participation and update aggregation, allows for easy addition or removal of nodes from the federated network, and ensures the system adheres to data protection regulations and organizational policies.

In some implementations, secure codebooks with encrypted dictionaries are a feature that can enhance the security and efficiency of the federated system. This allows multiple nodes in the federated system to collaboratively learn and update a shared vocabulary (codebook) without directly exposing the raw data or the full codebook contents to each other. In this system, each node maintains a local copy of the codebook 1412*a-n*. In an embodiment, the local codebook is divided into sections corresponding to different security clearance levels. In an embodiment, the dictionary within each section is encrypted using homomorphic encryption, allowing for secure operations without decryption.

According to an embodiment, each entry in the dictionary comprises an encrypted key-value pair, where the key may be a hash of the original data chunk and the value is the corresponding codeword. This encryption allows for comparison and matching operations without the need for decryption, maintaining data security throughout the process. During the joint learning process, when nodes encounter new data patterns, they may be configured to generate hashes for these patterns and compare them against their local encrypted dictionary (codebook). If no match is found, the node proposes a new entry to the federated system.

The secure codebook update process is carefully managed. Proposed new entries are sent to central coordinator 1404 or processed through a secure multi-party computation protocol or in some implementations a midserver 1420. Other nodes can verify the uniqueness of the proposed entry without seeing the raw data. If approved, the new entry is encrypted and added to all nodes' codebooks. This process ensures that the codebook evolves to reflect new data patterns while maintaining security.

Nodes can perform operations on the encrypted dictionary entries, allowing for tasks like frequency counting or similarity measurements without decrypting the entries. This capability helps to maintain privacy while still enabling meaningful analysis and learning. The system may be further configured to implement hierarchical access, where nodes or users with higher security clearance have access to more sections of the codebook, while lower-clearance entities can still participate in learning without accessing higher-security sections.

Version control and synchronization are important aspects of managing the secure codebooks. According to an aspect, platform 1400 maintains a versioned history of codebook updates, and periodic synchronization ensures all nodes have the latest approved version of the codebook. This approach maintains consistency across the federated system while allowing for the codebook's evolution over time. Secure aggregation can be used, where the system uses the secure codebook to translate between different nodes' representations when aggregating model updates. This allows for model improvement without directly sharing raw data or model parameters.

The central deep learning model in the federated system can uses new entries from the nodes to update itself. Each node in the federated system performs local training on its own data using the current version of the model. During this local training, nodes may encounter new patterns or data that aren't represented in the current codebook, which become potential new entries. These new entries are securely proposed to the federated learning coordinator using the secure codebooks with encrypted dictionaries mechanism. The coordinator, along with other nodes, verifies the uniqueness and relevance of these proposed entries without accessing the raw data.

If approved, these new entries are added to the global codebook, which is then synchronized across all nodes. The central deep learning model is then updated to incorporate these new entries. This could involve expanding the model's vocabulary (in the case of an LCM), adjusting the model's parameters to account for the new patterns, or retraining certain parts of the model to optimize for the new entries. The federated learning coordinator aggregates these updates from all nodes, including the new entries and their impact on the model. Finally, the updated central model, now incorporating the learning from the new entries, is distributed back to all nodes for the next round of training.

This process allows the central deep learning model to continuously evolve and improve based on the collective learning of all nodes in the system. It can adapt to new patterns and data distributions without directly accessing raw data from any node. This approach combines the benefits of federated learning (privacy, distributed computation) with the advantages of the large codeword model and secure codebook system. It allows the model to grow and adapt based on diverse data sources while maintaining data privacy and security.

By implementing secure codebooks with encrypted dictionaries, the federated system can achieve enhanced privacy, as raw data and full codebook contents are never directly exposed. It also enables efficient learning, as nodes can collaboratively improve the shared vocabulary. The system is scalable, allowing new nodes to join and immediately benefit from the existing codebook. Finally, it offers flexibility in handling varying security clearance levels among participants. This approach may be implemented using elements from the large codeword model or the latent transformer core.

FIG. 1 is a block diagram illustrating an exemplary system architecture for learning-based lossless data compression. In one embodiment, the system and method may comprise an input 100, an embedding system 110, an embedded output 111, a long short-term memory system (LSTM) 120, a multilayer perceptron system 130, a neural network output 131, a SoftMax function 140, a first compressed output 141, an arithmetic encoder 150, and a second compressed output 160. In one embodiment, the embedding system 110 receives the input 100 or plurality of inputs 100 from a source. The input 100 may include, but is not limited to a text file, a video file, an audio file, or any other file which includes a plurality of information. The embedding system 110 prepares an input 100 for further processing by a plurality of neural network systems. The embedding system 110 turns the input 100 into an embedded output 111 which may then be processed by a long short-term memory system 120.

In one embodiment, the long short-term memory system 120 is a plurality of recurring neural network architectures which further processes the embedded output 111 for compression. The LSTM 120 is a special kind of recurring neural network where the present output depends on the LSTM's understanding of the previous output. The LSTM 120 is capable of learning long term dependency through the use of a plurality of gates that allows the LSTM 120 to add and remove information to a cell state. After an embedded output 111 is processed by the LSTM 120, the embedded output 111 is processed by the multilayer perceptron system 130. The multilayer perceptron system (MLP) 130 is a neural network which uses a PAQ algorithm to achieve data compression. A PAQ algorithm refers to a plurality of lossless data compression algorithms which are exceptionally effective and have high compression ratios for many different data types. In one embodiment, the MLP 130 may be a shallow MLP where a plurality of inputs are operated on by a plurality of weights which creates a large linear plurality of hidden nodes which are grouped into sets. The plurality of hidden nodes may be operated on a small plurality of additional weights which converges the hidden nodes into a single output node. A key feature of a shallow MLP 130 is that the plurality of hidden nodes are operated on by the additional weights in one step, rather than a plurality of steps. In one embodiment, the embedded output 111 which has been processed by the LSTM 120 is transformed by the MLP 130 which may be a shallow MLP 130 into a neural network output 131. The neural network output 131 may then be operated on by a SoftMax function 140 which generates a compressed output 141. The compressed output 141 is a compressed version of the input 100 where no information has been lost during the compression process.

In another embodiment, the first compressed output 141 may then be passed to an arithmetic encoder 150 which may also receive the input 100. The arithmetic encoder 150 may generate a probability output by analyzing and processing the input 100 and the first compressed output 141. The arithmetic encoder 150 may also receive the input 100 and the first compressed output 141 where it generates a second compressed output 160. Generally, an arithmetic encoder receives a string with a length which is compressed to the shortest byte string which represents a number (X) within a particular range. In some embodiments, the arithmetic encoder 150 may be an arithmetic encoder in PAQ. An arithmetic encoder in PAQ maintains for each prediction an upper and lower limit on X. Concluding each prediction, the current range of X is split into parts representing the probabilities that the next bit of the string is either a 0 or a 1, which may be based on previous bits of the string. The next bit may then be encoded by selecting a new range to take place of the previous range of X. Generally, the upper and lower limits are represented in three segments. The first segment generally has the same base-256 digits and are often presented as the leading bytes of X. The next segment is generally stored in memory which the first digit in the segment varies from the remaining digits. The remaining segment is generally assumed to be zeros for the lower limit and ones for the upper limit. In one embodiment, compression may cease when one or more bytes are written from the lower bound of X.

Figure 2:
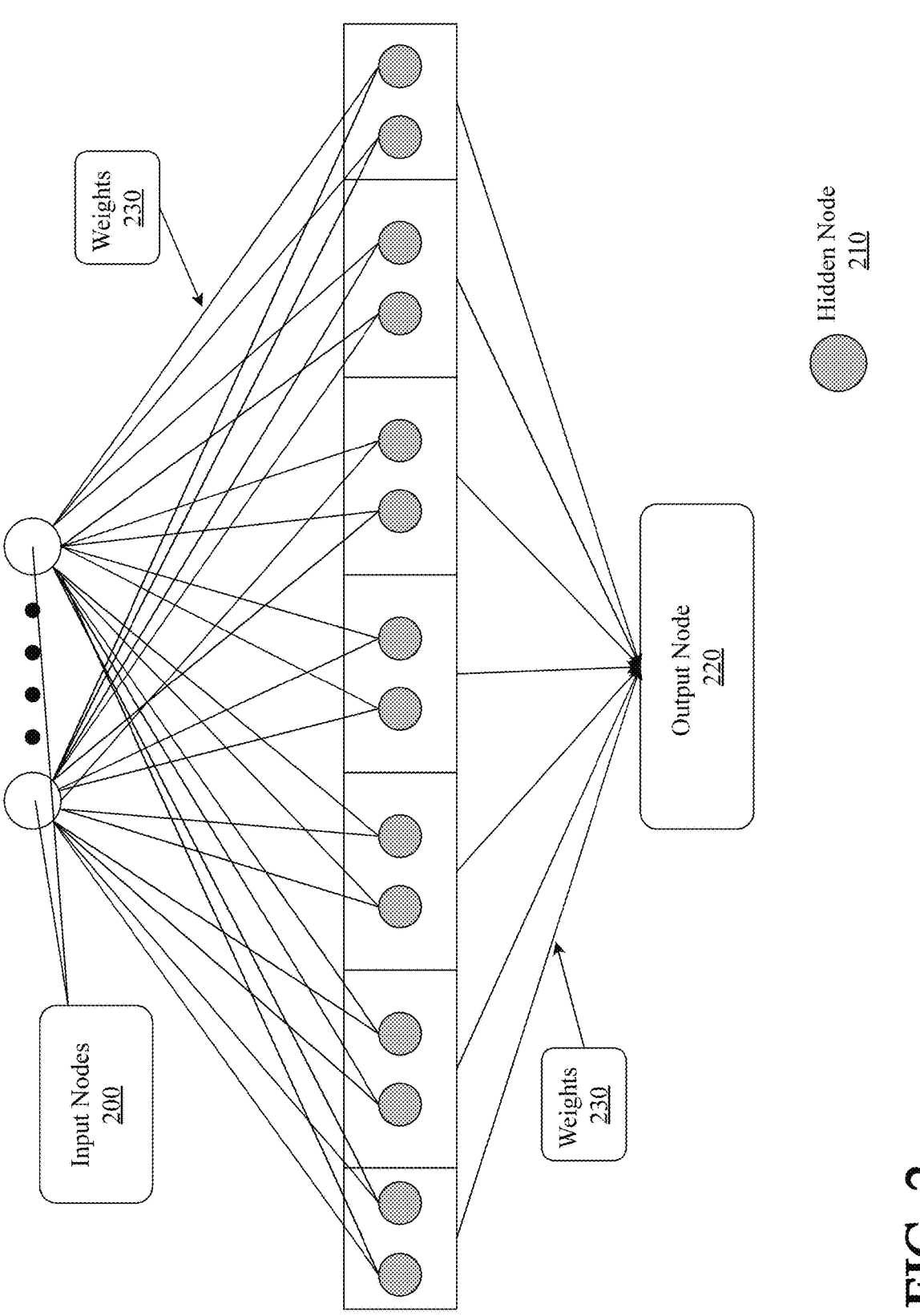
FIG. 2 is a block diagram illustrating an exemplary architecture for a subsystem of the system for learning-based lossless data compression, a multilayer perceptron system.

FIG. 2 is a block diagram illustrating an exemplary architecture for a subsystem of the system for learning-based lossless data compression, a multilayer perceptron system 130. In an embodiment, the multilayer perceptron system 130 may receive a plurality of inputs which begin as input nodes 200. The plurality of input nodes 200 are operated on by a plurality of predetermined weights. The plurality of predetermined weights 230 creates a plurality of hidden nodes 210 which may exist in a grouped sequence. In one embodiment, there may be 552 input nodes where are operated on by 3080 weights. This creates 3080 new hidden nodes which exist in seven sets, each set containing a plurality of hidden nodes 210. Each set of hidden nodes 210 is then operated on by an additional layer of weights 230 which may or may not be similar to the weights used on the input nodes. In embodiment where the hidden nodes 210 exist in seven sets, there will be seven additional weights. The additional weights act on the sets of hidden nodes 210 to create a plurality of output nodes 220.

Figure 3:
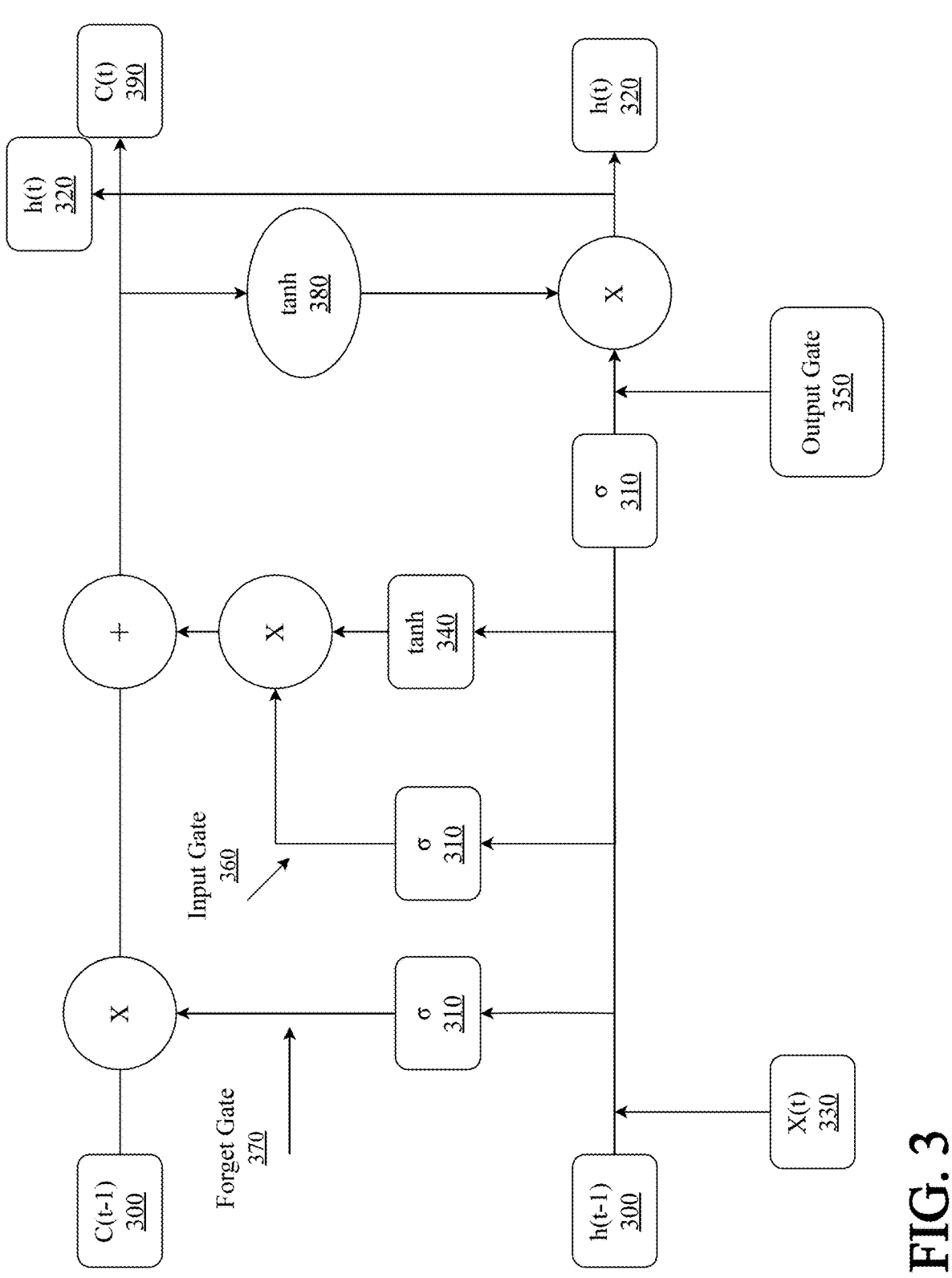
FIG. 3 is a block diagram illustrating an exemplary architecture for a subsystem of the system for learning-based lossless data compression, a long short-term memory system.

FIG. 3 is a block diagram illustrating an exemplary architecture for a subsystem of the system for learning-based lossless data compression, a long short-term memory system 120. In one embodiment, the LSTM system 120 is further comprised of a plurality of functions where the present output depends on understanding the previous output. The LSTM system 120 is capable of learning long term dependency and a plurality of gates allow the system to add and remove information to a cell state. The flow state in FIG. 4 may be governed by the following functions in one embodiment:

$$i_t = \sigma(W_{ix}x_t + W_{ih}h_{t-1} + b_i)$$

$$f_t = \sigma(W_{fx}x_t + W_{fh}h_{t-1} + b_f)$$

$$O_t = \sigma(W_{ox}x_t + W_{oh}h_{t-1} + b_o)$$

$$c_t = f_t \odot c_{t-1} + i_t \odot \tanh(W_{cx}x_t + W_{ch}h_{t-1} + b_c)$$

$$h_t = O_t \odot \tanh(c_t)$$

Where $i_t$ represents an input gate 360, $f_t$ represents a forget gate 370, and $O_t$ represents an output gate 350. The forget gate 370 allows the system to remove information from a cell state, the input gate 360 allows the system to add information to a cell state, and the output gate 350 allows the system to output information from a cell state.

Detailed Description of Exemplary Aspects

Figure 4:
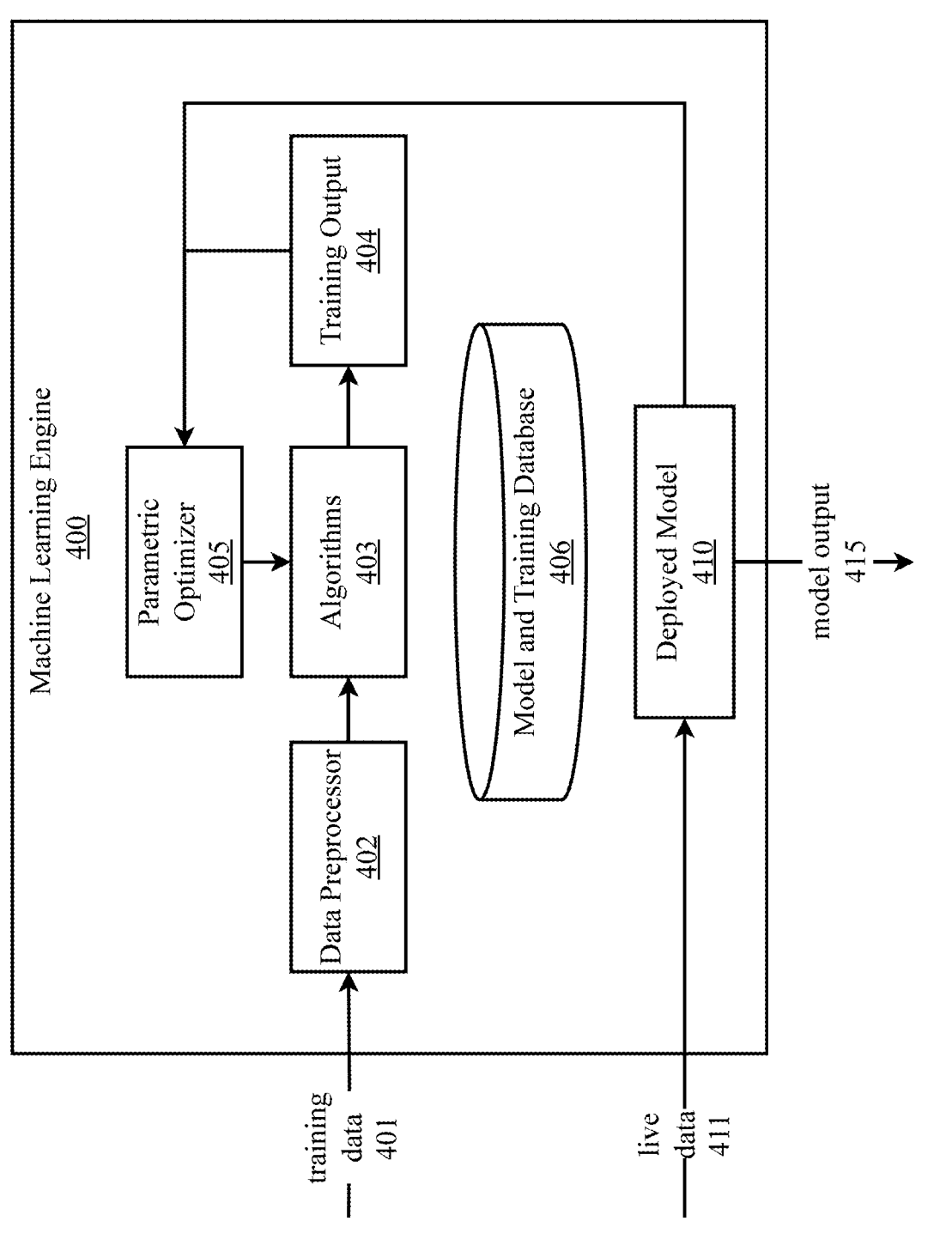
FIG. 4 is a block diagram illustrating an exemplary machine learning model for either the multilayer perceptron system or the long short-term memory system.

FIG. 4 is a block diagram illustrating an exemplary machine learning model for either the multilayer perceptron system or the long short-term memory system. According to the embodiment, the multilayer perceptron system 130 or the long short-term memory system 120 may comprise a machine learning engine 400 which may further comprise a model training stage comprising a data preprocessor 402, one or more machine and/or deep learning algorithms 403, training output 404, and a parametric optimizer 405, and a model deployment stage comprising a deployed and fully trained model 410 configured to perform tasks described herein such as transcription, summarization, agent coaching, and agent guidance. Machine learning engine 400 may be used to train and deploy a long short-term memory system 120 and the multilayer perceptron system 130 in order to support the services provided by the lossless data compression system.

At the model training stage, a plurality of training data 401 may be received by the machine learning engine 400. In some embodiments, the plurality of training data may be obtained from one or more database(s) 108 and/or directly from various information sources such as a plurality of contact centers 120. In a use case, a plurality of training data may be sourced TT&C satellite subsystems. It could include text files, audio or video files, or other forms of data. Data preprocessor 402 may receive the input data and perform various data preprocessing tasks on the input data to format the data for further processing. For example, data preprocessing can include, but is not limited to, tasks related to data cleansing, data deduplication, data normalization, data transformation, handling missing values, feature extraction and selection, mismatch handling, and/or the like. Data preprocessor 402 may also be configured to create training dataset, a validation dataset, and a test set from the plurality of input data 401. For example, a training dataset may comprise 80% of the preprocessed input data, the validation set 10%, and the test dataset may comprise the remaining 10% of the data. The preprocessed training dataset may be fed as input into one or more machines and/or deep learning algorithms 403 to train a predictive model for object monitoring and detection.

During model training, training output 404 is produced and used to measure the accuracy and usefulness of the predictive outputs. During this process a parametric optimizer 405 may be used to perform algorithmic tuning between model training iterations. Model parameters and hyperparameters can include, but are not limited to, bias, train-test split ratio, learning rate in optimization algorithms (e.g., gradient descent), choice of optimization algorithm (e.g., gradient descent, stochastic gradient descent, of Adam optimizer, etc.), choice of activation function in a neural network layer (e.g., Sigmoid, ReLu, Tanh, etc.), the choice of cost or loss function the model will use, number of hidden layers in a neural network, number of activation unites in each layer, the drop-out rate in a neural network, number of iterations (epochs) in a training the model, number of clusters in a clustering task, kernel or filter size in convolutional layers, pooling size, batch size, the coefficients (or weights) of linear or logistic regression models, cluster centroids, and/or the like. Parameters and hyperparameters may be tuned and then applied to the next round of model training. In this way, the training stage provides a machine learning training loop. In some implementations, various accuracy metrics may be used by machine learning engine 400 to evaluate a model's performance. Metrics can include, but are not limited to, information loss, latency, and resource consumption.

A model and training database 406 is present and configured to store training/test datasets and developed models. Database 406 may also store previous versions of models. According to some embodiments, the one or more machine and/or deep learning models may comprise any suitable algorithm known to those with skill in the art including, but not limited to: LLMs, generative transformers, transformers, supervised learning algorithms such as: regression (e.g., linear, polynomial, logistic, etc.), decision tree, random forest, k-nearest neighbor, support vector machines, Naïve-Bayes algorithm; unsupervised learning algorithms such as clustering algorithms, hidden Markov models, singular value decomposition, and/or the like. Alternatively, or additionally, algorithms 403 may comprise a deep learning algorithm such as neural networks (e.g., recurrent, convolutional, long short-term memory networks, etc.).

In some implementations, ML engine 400 automatically generates standardized model scorecards for each model produced to provide rapid insights into the model and training data, maintain model provenance, and track performance over time. These model scorecards provide insights into model framework(s) used, training data, training data specifications such as chip size, stride, data splits, baseline hyperparameters, and other factors. Model scorecards may be stored in model and training database 406.

Figure 5:
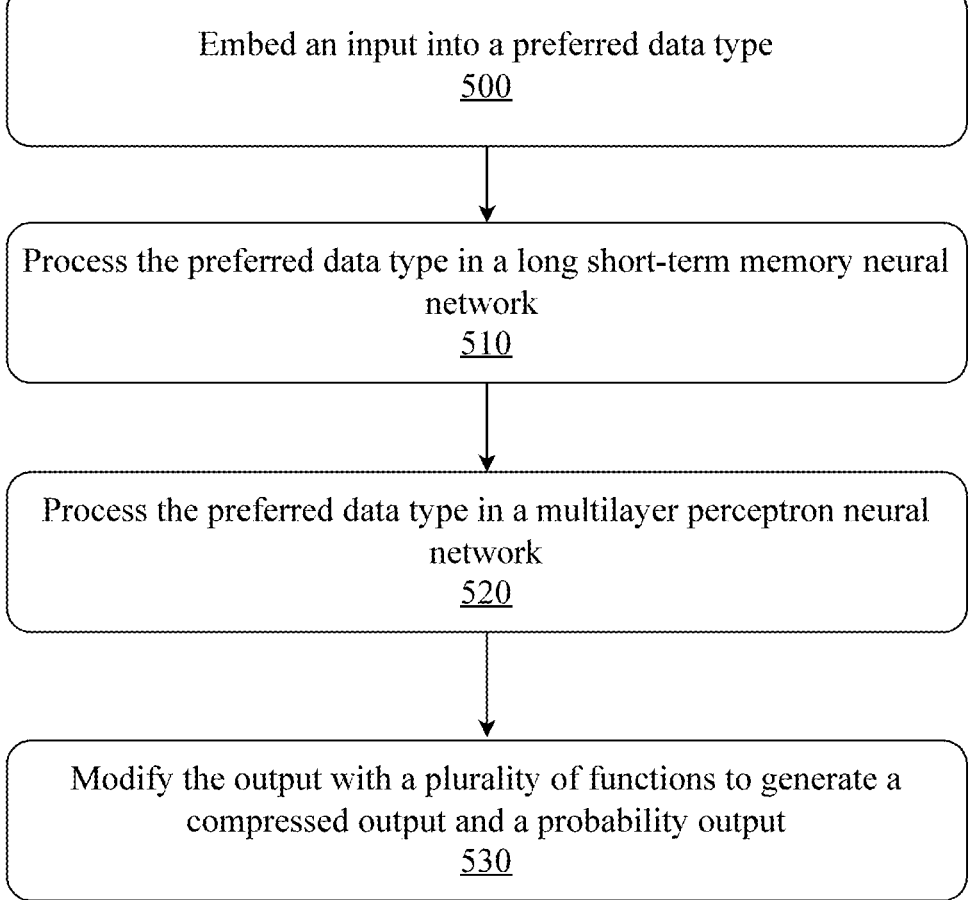
FIG. 5 is a flow diagram illustrating an exemplary method of learning-based data compression.

FIG. 5 is a flow diagram illustrating an exemplary method of learning-based data compression. In a first step 500, embed an input into a preferred data type. The input may be a data type including but not limited to, text files, audio files, video files, and any other data type which carries information. In a step 510, process the preferred data type in a long short-term memory neural network. In a step 520, process the preferred data type in a multilayer perceptron neural network which creates an output. In a step 530, modify the output with a plurality of functions to generate a compressed output and a probability output. The plurality of functions may include a SoftMax function and an arithmetic encoding algorithm.

Figure 6:
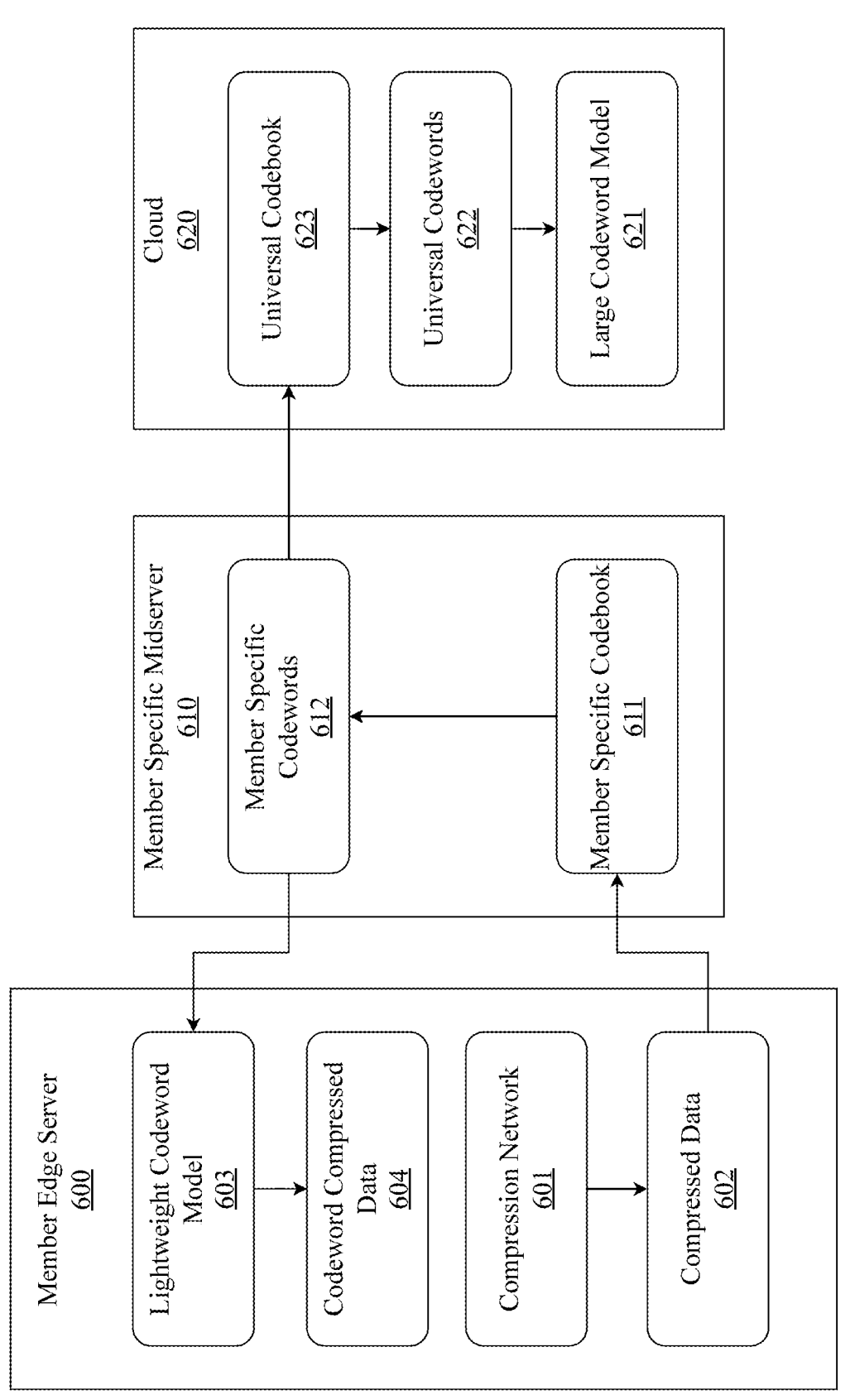
FIG. 6 is a block diagram illustrating an exemplary system architecture for a system and for federated two-stage compression with federated joint learning.

FIG. 6 is a block diagram illustrating an exemplary system architecture for a system and for federated two-stage compression with federated joint learning. Illustrated is an expanded system architecture for learning-based lossless data compression, building upon the original MLP-LSTM compression framework. The system comprises three main components: a member edge server 600, a member specific midserver 610, and a cloud 620. At the member edge server 600, a compression network 601, which may utilize the MLP-LSTM compression technique utilized in the system for learning-based lossless data compression, processes input data to generate compressed data 602. This compressed data is then sent to the member specific midserver 610 for further processing.

The member specific midserver 610 employs a member specific codebook 611 to convert the compressed data into member specific codewords 612. These codewords represent a more compact and specialized form of the original data, tailored to the specific member's data characteristics. The member specific codewords are then relayed back to the member edge server 600, where they are used to train a lightweight codeword model 603. This model is specifically designed to handle tasks relevant to the edge server, allowing for even greater compression efficiency due to its specialized nature.

The term "lightweight codeword model" is used to describe a specialized model designed to operate efficiently on edge servers with limited computational resources. This model is considered "lightweight" because it is tailored to handle a specific, narrow set of tasks relevant to the particular edge server, rather than being a comprehensive model capable of processing a wide range of data types. The model is "codeword-based" because it operates on the codewords generated from the compressed data, which represent a more compact and efficient form of the original information.

The specialization of the lightweight codeword model to the edge server's specific data and tasks allows for greater efficiency and compression. For example, an edge server in a smart factory might have a lightweight codeword model specialized for processing sensor data from manufacturing equipment. This model would be highly efficient at compressing and analyzing data related to machine performance, temperature readings, and production metrics, but it wouldn't need to handle unrelated tasks like image recognition or natural language processing. Similarly, an edge server in an autonomous vehicle might have a lightweight codeword model optimized for processing real-time data from various sensors, cameras, and GPS systems. This model would be extremely efficient at compressing and analyzing data related to vehicle position, obstacle detection, and traffic conditions, but it wouldn't need to handle tasks irrelevant to driving. In both cases, the lightweight nature of the model, combined with its specialization to a specific set of codewords representing compressed data from a narrow domain, allows for rapid processing and highly efficient compression on resource-constrained edge devices.

In another example, an edge server in a smart home environment might use its lightweight codeword model to efficiently process and compress sensor data from various IoT devices. Another instance could be a mobile edge server utilizing its lightweight model to compress and analyze user interaction data in real-time, optimizing app performance and responsiveness.

In addition to training the lightweight model, the member specific codewords may also sent to the cloud 620 for broader analysis and model training. The cloud environment contains a universal codebook 623 that integrates the member specific codewords from various sources into a comprehensive set of universal codewords 622. These universal codewords serve as input for training a large codeword model 621 in the cloud. This larger model has broader implications and can capture patterns and insights across multiple members or data sources.

The system also allows for bidirectional flow of information. The lightweight codeword model on the edge server can be updated based on insights from the large codeword model in the cloud, ensuring that edge processing remains efficient and up-to-date. Similarly, the cloud model continuously evolves as it receives new codewords from various member specific midservers. The system is designed to support federated learning, allowing multiple member edge servers and their associated midservers to collaboratively train and improve the compression models without sharing raw data. This federated approach ensures data privacy while leveraging the collective knowledge of all participants.

In the federated learning process, each member edge server 600 trains its own version of the compression network 601 and lightweight codeword model 603 on its local data. Instead of sharing the raw data or compressed data, only the model updates (such as weights or gradients) may be sent to the cloud 620. The cloud aggregates these updates from multiple members to improve the large codeword model 621, which serves as the global model in this federated system.

The system also enables federated joint learning, where the entire pipeline—from the initial compression network to the final large codeword model—is optimized end-to-end across all participating members. This joint learning process allows the system to find the optimal balance between compression efficiency at the edge, codeword generation at the midserver, and global model performance in the cloud. During federated joint learning, the cloud 620 periodically sends updates to the member specific midservers 610 and edge servers 600. These updates help refine the member specific codebooks 611 and improve the performance of the lightweight codeword models 603 on the edge servers. This bidirectional flow of model updates ensures that each component of the system benefits from the collective learning process while maintaining the privacy of individual member data.

The federated joint learning approach also allows for personalization. While the large codeword model 621 in the cloud captures general patterns across all members, each member's lightweight codeword model 603 can be fine-tuned to its specific data distribution and tasks. This personalization improves the efficiency of edge processing while still benefiting from the broader knowledge captured in the global model.

By combining federated learning with joint optimization, this system achieves a balance between local efficiency, global performance, and data privacy. It enables collaborative learning across multiple members or organizations without the need to centralize sensitive data, making it particularly suitable for applications where data privacy and edge computing efficiency are crucial. This multi-tiered approach combines the benefits of edge computing, specialized compression, and cloud-based large-scale modeling. It enables efficient data processing and compression at the edge, while also facilitating broader analysis and model development in the cloud, all while maintaining data privacy through the use of codewords rather than raw data.

Figure 7:
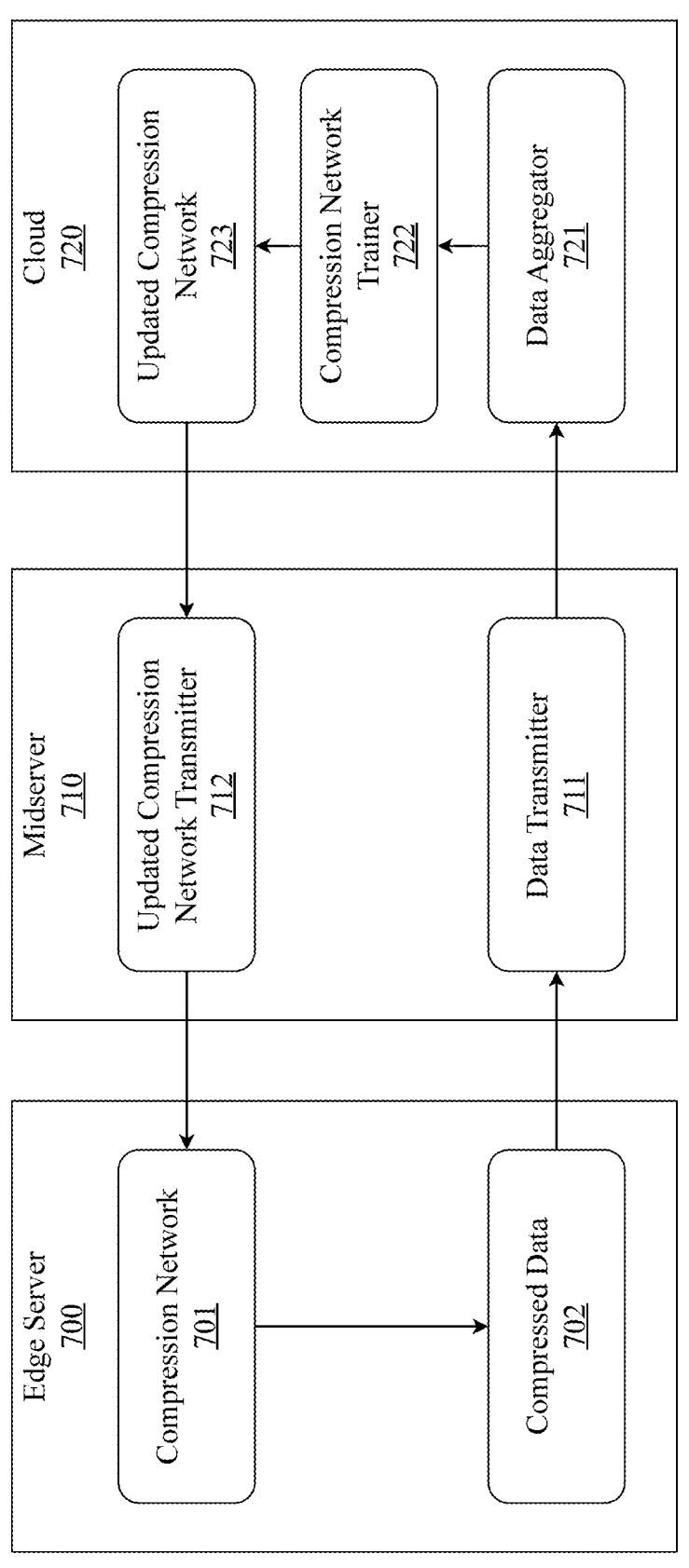
FIG. 7 is a block diagram illustrating an exemplary system architecture for a trainable compression network on an edge server.

FIG. 7 is a block diagram illustrating an exemplary system architecture for a trainable compression network on an edge server. Depicted is a training cycle for a learning-based lossless data compression system, comprising three main components: an edge server 700, a midserver 710, and a cloud environment 720. This system demonstrates how compressed data from the edge is used to update the compression model, which is then redistributed back to the edge.

At the edge server 700, a compression network 701 processes input data to generate compressed data 702. The compression network may utilize advanced techniques such as the MLP-LSTM framework disclosed in the lossless data compression system. The compressed data 702 represents a compact form of the original information, optimized for efficient storage and transmission.

The compressed data 702 is then sent to the midserver 710, which acts as an intermediary between the edge and the cloud. The midserver contains a data transmitter 711 that securely forwards the compressed data to the cloud environment. This transmission step ensures that only the compressed form of the data, rather than raw information, leaves the edge server, enhancing data privacy and reducing bandwidth requirements. In the cloud environment 720, a data aggregator 721 collects compressed data from multiple sources, potentially including various edge servers and midservers. This aggregated data serves as input for the compression network trainer 722. The trainer analyzes the compressed data to identify patterns, inefficiencies, or areas for improvement in the current compression model.

Based on this analysis, the compression network trainer 722 updates the existing model, producing an updated compression network 723. This updated network incorporates learnings from the aggregated compressed data, potentially improving compression efficiency, accuracy, or adaptability to different types of input data. The updated compression network 723 is then sent back to the midserver 710, where an updated compression network transmitter 712 manages its secure distribution back to the edge server 700. Once received, the edge server can replace its existing compression network 701 with the updated version, completing the training cycle.

This cyclical process allows for continuous improvement of the compression model based on real-world data. By aggregating compressed data from multiple sources in the cloud, the system can learn from a diverse range of inputs, potentially leading to a more robust and efficient compression network. At the same time, by only transmitting compressed data and updated models, rather than raw data, the system maintains a high level of data privacy and efficiency. The use of a midserver 710 as an intermediary adds an extra layer of security and control, potentially allowing for additional data processing or filtering steps between the edge and the cloud. This architecture also provides flexibility, as the midserver could be tailored to specific organizational needs or regulatory requirements.

Figure 8:
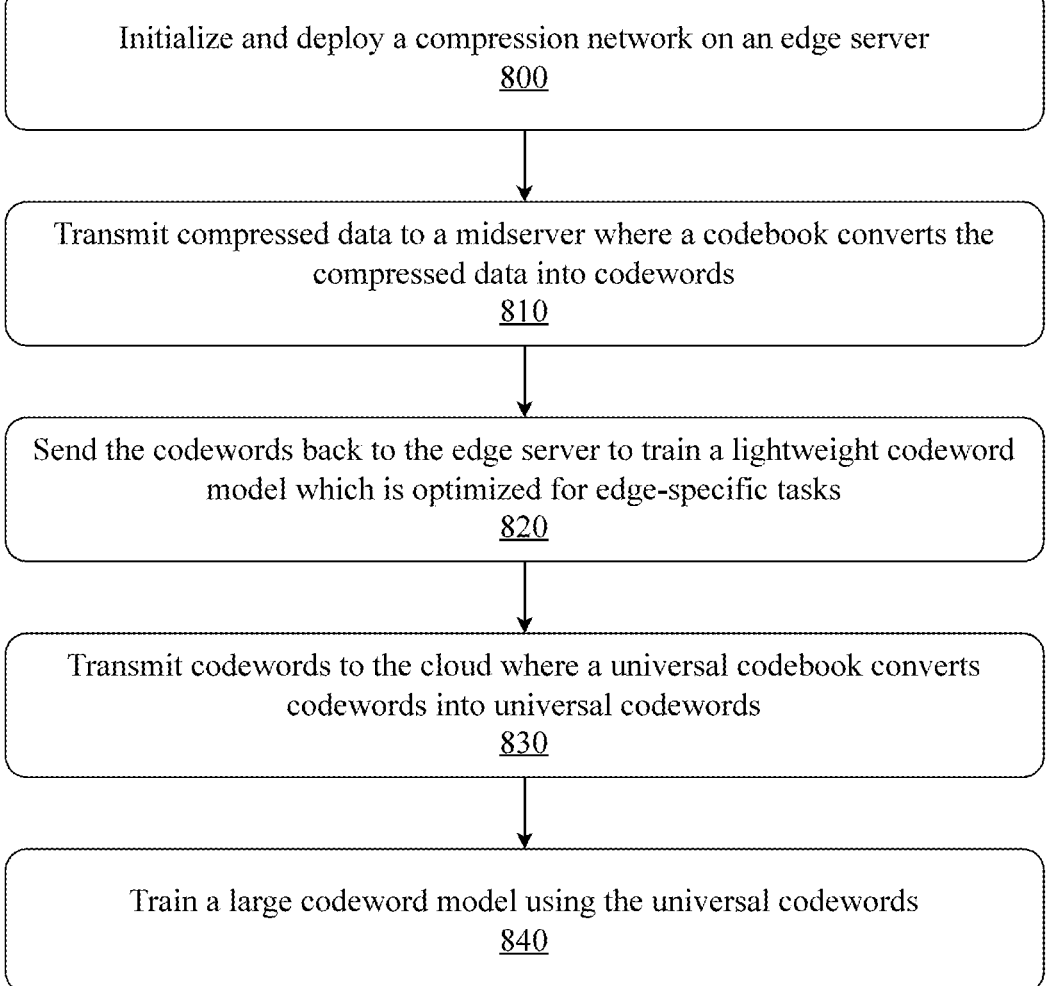
FIG. 8 is a flow diagram illustrating an exemplary method for federated two-state compression with federated joint learning.

FIG. 8 is a flow diagram illustrating an exemplary method for federated two-state compression with federated joint learning. In a first step 800, a compression network is initialized and deployed on an edge server. This step involves setting up the initial architecture of the compression network, which could be based on the MLP-LSTM framework mentioned in the original patent. The network is configured to efficiently compress data specific to the edge server's tasks. For example, in a smart home system, this network might be optimized to compress data from various IoT devices such as thermostats, security cameras, and energy meters.

In a step 810, the compressed data is transmitted to a midserver where a codebook converts the compressed data into codewords. This step involves sending the output of the compression network to a separate server that acts as an intermediary. The midserver uses a predefined codebook to transform the compressed data into a series of codewords. These codewords represent a more compact form of the data, further reducing its size while maintaining its essential information. For instance, in our smart home example, a sequence of compressed temperature readings might be converted into a single codeword representing a specific temperature pattern.

In a step 820, the codewords are sent back to the edge server to train a lightweight codeword model which is optimized for edge-specific tasks. This step is crucial for improving the efficiency of edge processing. The lightweight model learns to interpret and work directly with the codewords, allowing for faster processing and decision-making at the edge. In our smart home scenario, this model might learn to quickly identify unusual temperature patterns or predict energy usage based on the codewords, without needing to decompress the full data.

In a step 830, the codewords are transmitted to the cloud where a universal codebook converts them into universal codewords. This step broadens the scope of the data representation. The universal codebook in the cloud can interpret codewords from multiple sources and convert them into a standardized format. For example, it might convert temperature pattern codewords from various smart home systems into universal codewords that represent general climate trends.

In a step 840, a large codeword model is trained using the universal codewords. This step involves using the standardized, universal codewords to train a more comprehensive model in the cloud. This model can capture broader patterns and insights across multiple edge servers or even different types of systems. In the ongoing example, this large model might learn to identify correlations between temperature patterns, energy usage, and other factors across many smart homes, potentially leading to improved energy management strategies or predictive maintenance for HVAC systems.

FIG. 9 is a flow diagram illustrating an exemplary method for a training and utilizing a compression network on an edge server. In a first step 900, a compression network is initialized and deployed on an edge server. This step involves setting up the initial architecture of the compression network, which could be based on advanced techniques such as the MLP-LSTM framework. The network is configured to efficiently compress data specific to the edge server's tasks and environment. For instance, in a smart city traffic management system, this network might be optimized to compress data from traffic cameras, speed sensors, and vehicle counters.

In a step 910, the compression network is used to process input data on the edge server, generating compressed data. This step involves applying the current version of the compression network to incoming data streams, reducing their size while preserving essential information. In the smart city example, the network might compress real-time traffic flow data, reducing high-resolution video feeds to key metrics like vehicle count, average speed, and lane occupancy.

In a step 920, the compressed data is sent from the edge server to a midserver where it may be further transmitted to a cloud. The midserver acts as an intermediary, facilitating secure and efficient data transfer between the edge and the cloud. This step ensures that only compressed, privacy-preserving data leaves the edge environment. In the traffic management scenario, the midserver might aggregate compressed data from multiple intersections before sending it to the cloud.

In a step 930, the aggregated compressed data is used to train and update a compression network in the cloud. A compression network trainer in the cloud analyzes the collected data from multiple sources, identifying patterns and areas for improvement in the current model. For the smart city example, this might involve learning new patterns in traffic flow across different times of day, weather conditions, or special events, allowing the model to more efficiently compress and represent these scenarios.

In a step 940, the updated compression network model is transmitted from the cloud back to the midserver. This step involves securely sending the newly trained model through the network for distribution to edge servers. The updated model incorporates learnings from a wide range of data sources, potentially improving its ability to compress diverse types of traffic data more efficiently. In a step 950, the updated compression network is deployed from the midserver to the edge server, replacing any outdated models. This completes the training cycle, with the edge server now using an improved model based on aggregated data from multiple sources. In our traffic management system, this could result in more efficient compression of traffic data, potentially allowing for real-time analysis of more data streams or freeing up computational resources for other tasks.

This cyclical process allows for continuous improvement of the compression model, leveraging both edge and cloud computing resources to optimize performance and efficiency over time. It enables the system to adapt to changing data patterns and improve its compression capabilities without requiring manual intervention at each edge server. The use of midservers adds an extra layer of security and control, potentially allowing for additional data processing or filtering steps between the edge and the cloud.

Figure 10:
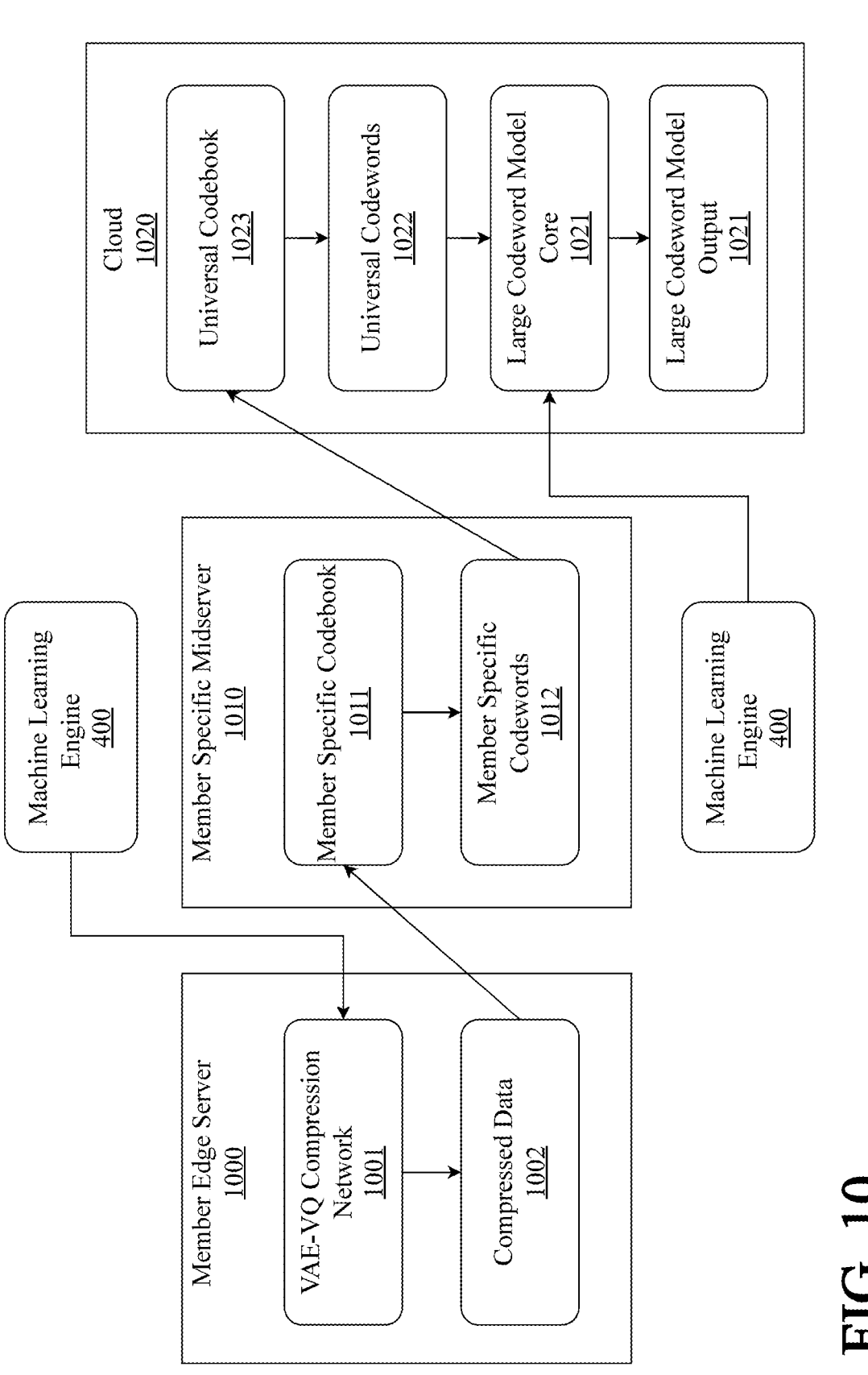
FIG. 10 is a block diagram illustrating an exemplary system architecture for a system for federated two-stage compression with federated joint learning that uses a VAE-VQ and a transformer based large codeword core.

FIG. 10 is a block diagram illustrating an exemplary system architecture for a system for federated two-stage compression with federated joint learning that uses a VAE-VQ and a transformer based large codeword core. The system comprises three main components: a member edge server 1000, a member specific midserver 1010, and a cloud environment 1020.

At the member edge server 1000, a Variational Autoencoder with Vector Quantization (VAE-VQ) compression network 1001 is employed to compress input data. This network combines a Variational Autoencoder (VAE) with Vector Quantization VQ to achieve efficient data compression. The VAE part of the network encodes input data into a latent space representation, which is then quantized using a discrete codebook in the VQ part. This process maps the continuous latent space to a finite set of discrete vectors, enabling more efficient compression. The VAE-VQ network is particularly effective for compressing complex, high-dimensional data while preserving important features. The compressed data 1002 produced by this network is then sent to the member specific midserver 1010 for further processing.

The member specific midserver 1010 employs a member specific codebook 1011 to convert the compressed data into member specific codewords 1012. This codebook is tailored to the specific data characteristics of the member, allowing for more efficient representation of the compressed data. The member specific codewords are then transmitted to the cloud 1020 for final processing.

In the cloud environment 1020, a universal codebook 1023 is used to transform the member specific codewords into universal codewords 1022. These universal codewords serve as the input for the large codeword model core 1021, which processes the data and produces a large codeword model output 1021.

The large codeword model core 1021 could be implemented using various deep learning architectures. One prominent example is a Transformer model, which has shown exceptional performance in processing sequential data. Transformers use self-attention mechanisms to capture long-range dependencies in the input data, making them well-suited for processing codeword sequences. Alternatively, the core could be implemented as a Diffusion model, which has shown promising results in generative tasks by learning to reverse a gradual noising process. Other potential architectures could include large language models (LLMs) adapted for codeword processing, or custom neural network designs optimized for the specific requirements of codeword-based data representation.

Both the member specific midserver 1010 and the cloud 1020 may be trained by the machine learning engine 400. This engine is responsible for training and updating the respective components of the system, including the member specific codebook, universal codebook, and the large codeword model core. The machine learning engine ensures that the system continually adapts and improves based on the processed data. Each machine learning component in the system may be jointly trained before development. Additionally, the system has the capability of individually training single systems as needed.

This multi-tiered approach combines the benefits of edge computing, specialized compression, and cloud-based large-scale modeling. It enables efficient data processing and compression at the edge using the VAE-VQ network, further compression and specialization at the midserver level, and sophisticated analysis and model development in the cloud. The use of codebooks and codewords at various stages allows for efficient data representation while maintaining privacy, as the original data is never directly shared beyond the edge server.

Figure 11:
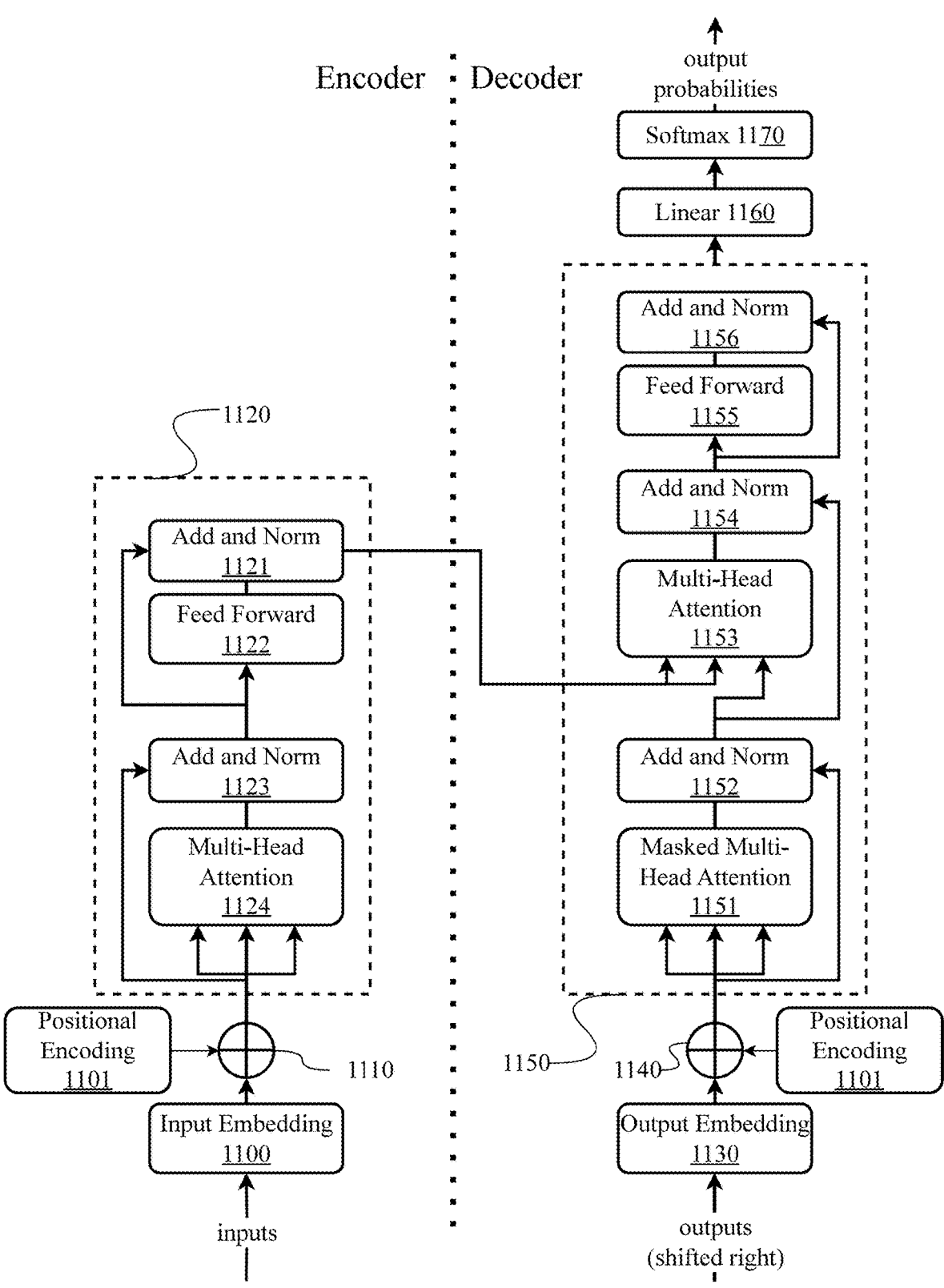
FIG. 11 is a block diagram illustrating an exemplary architecture for a subsystem of a system for federated two-stage compression with federated joint learning, a transformer based large codeword model core.

FIG. 11 is a block diagram illustrating an exemplary architecture for a subsystem of a system for federated two-stage compression with federated joint learning, a transformer based large codeword model core. In one embodiment, the large codeword model core may utilize a transformer based deep learning architecture. A Transformer generally comprises an Encoder (the components on the left side of the illustration) and a Decoder (the components on the right side of the illustration).

The illustrated Transformer comprises an Encoder and a Decoder. The Encoder takes input embeddings and processes them through a stack of layers (represented as dashed box 1120). Each layer consists of: positional encoding, which adds position information to the input embeddings; multi-head attention, which allows the model to attend to different parts of the input sequence; add and norm, which applies residual connection and layer normalization; feed forward, which is a fully connected feed-forward network; and add and norm which is another residual connection and layer normalization.

The power of the transformer model lies in the self-attention mechanism. This mechanism contributes to accelerated learning compared to traditional models such as long short-term memory models. Self-attention empowers the transformer model with the remarkable capability to meticulously scrutinize distinct segments of a given sequence or even encompass the entire contextual essence of a sentence. This profound contextual awareness enables the model to make predictions with an elevated degree of accuracy and relevance.

The input embedding 1100 to the Encoder is a sequence of tokens, typically represented as integers. Each token is mapped to a learnable embedding vector of a fixed size. The embedding layer is a lookup table that converts each token into its corresponding dense vector representation. The embeddings are learned during training and capture semantic and syntactic relationships between tokens.

A dense vector representation, also known as a dense embedding or a continuous vector representation, is a way of representing data, particularly words or tokens, as dense vectors in a high-dimensional continuous space. In the context of natural language processing (NLP) and language models, dense vector representations are used to capture semantic and syntactic information about words or tokens. Each word or token is mapped to a fixed-size vector of real numbers, typically with hundreds or thousands of dimensions. Each word or token is represented by a vector of a fixed size, regardless of the length of the input sequence. The size of the vector is a hyperparameter that is determined during model design. The vectors exist in a continuous high-dimensional space, where each dimension represents a latent feature or aspect of the word or token. The continuous nature allows for capturing fine-grained relationships and similarities between words. The dense vector representations are learned during the training process of the model. The model learns to assign similar vectors to words that have similar meanings or occur in similar contexts. The dense vector representations aim to capture semantic and syntactic relationships between words. Words that have similar meanings or are used in similar contexts tend to have similar vector representations. Dense vector representations allow for performing algebraic operations on words, such as addition and subtraction. These operations can capture analogies and relationships between words, such as "prince"−"man"+"woman"≈"princess". Dense vector representations serve as input features for various downstream NLP tasks, such as text classification, sentiment analysis, named entity recognition, and machine translation. The dense representations provide a rich and informative input to the models, enabling them to learn patterns and make predictions. Some popular examples of dense vector representations include, but are not limited to, Word2Vec, Global Vectors for Word Representations (GloVe), FastText, and BERT.

After the input embedding layer, positional encoding 1101 is added to the input embedding to provide position information to the model. The positional encoding 1101 and the input embedding 1100 may be added using a function 1110. Since the Transformer architecture doesn't have inherent recurrence or convolution, positional encodings help capture the order and relative positions of tokens. The positional encodings are typically sine and cosine functions of different frequencies, allowing the model to learn relative positions. The positional encodings have the same dimensionality as the input embeddings and are summed with them.

The Encoder utilizes a multi-head attention mechanism 1124 which is a key component of the Transformer architecture. It allows the Encoder to attend to different parts of the input sequence and capture dependencies between tokens. The attention mechanism computes three matrices: Query (Q), Key (K), and Value (V). The Query, Key, and Value matrices are obtained by linearly projecting the input embeddings using learned weight matrices. The attention scores are computed by taking the dot product of the Query matrix with the transpose of the Key matrix, followed by scaling and applying a softmax function. The attention scores determine the importance of each token in the input sequence for a given position. The Value matrix is then multiplied with the attention scores to obtain the weighted sum of the values, which forms the output of the attention mechanism. Multi-Head Attention splits the Query, Key, and Value matrices into multiple heads, allowing the model to attend to different aspects of the input simultaneously. The outputs from each head are concatenated and linearly projected to obtain the final output of the Multi-Head Attention layer 1124.

After the Multi-Head Attention layer, a residual connection is applied, followed by Layer Normalization at add and norm 1123. The residual connection adds the input embeddings to the output of the attention layer, helping the model learn faster and deeper. Layer Normalization normalizes the activations across the features, stabilizing the training process.

The Feed Forward layer 1122 is a fully connected neural network applied to each position of the Encoder's hidden states. It consists of two linear transformations with a Rectified Linear Unit (ReLU) activation function in between. The purpose of the Feed Forward layer is to introduce non-linearity and increase the model's capacity to learn complex representations. The output of the Feed Forward layer has the same dimensionality as the input embeddings. A residual connection and Layer Normalization 1121 are applied after the Feed Forward layer.

The Encoder layers 1120 are stacked Nx times, where N is a hyperparameter that determines the depth of the Encoder. Each layer follows the same structure: Multi-Head Attention, Add & Norm, Feed Forward, and Add & Norm. By stacking multiple Encoder layers, the model can capture hierarchical and long-range dependencies in the input sequence. The output of the final Encoder layer represents the encoded input sequence, which is then passed to the Decoder for generating the output sequence.

The Decoder generates the output probabilities. It has a similar structure to the Encoder, with a few additions. The Decoder takes output embeddings and processes them through a stack of layers (represented as dashed box 1150). The output embedding layer 1130 takes the previous output tokens (shifted right by one position) and converts them into dense vectors. Each token is mapped to a learnable embedding vector of a fixed size. The embedding vectors capture semantic and syntactic relationships between tokens.

Positional encoding 1101 is added to the output embedding 1130 to provide position information to the model. Positional encoding 1101 may be added to the output embedding 1130 through a function 1140. Since the Transformer architecture does not have inherent recurrence or convolution, positional encodings help capture the order and relative positions of tokens. The positional encodings are typically sine and cosine functions of different frequencies, allowing the model to learn relative positions.

The masked multi-head attention 1151 mechanism prevents the model form attending to future tokens. This layer performs self-attention on the Decoder's input sequence. It allows the Decoder to attend to different parts of its own input sequence. The attention is "masked" to prevent the Decoder from attending to future tokens, ensuring that the predictions are based only on the previously generated tokens. Multi-head attention splits the input into multiple heads, allowing the model to attend different aspect of the input simultaneously.

After the masked multi-head attention, a residual connection is applied follows by layer normalization via add and norm 1152. The residual connection adds the input to the output of the attention layer, helping the model learn faster and deeper. Layer normalization normalizes the activations across the features, stabilizing the training process.

The multi-head attention 1153 layer performs attention between the Decoder's hidden states and the Encoder's output. It allows the Decoder to attend to relevant parts of the input sequence based on the Encoder's representations.

The attention weights are computed based on the compatibility between the Decoder's hidden states and Encoder's outputs.

Another add and norm 1154 layer is then followed by feed forward network 1155. This a fully connected feed-forward network applied to each position of the Decoder's hidden states. It consists of two linear transformations with a Rectified Linear Unit (ReLU) activation in between. The feed forward layer helps the model capture non-linear interactions and increases the model's capacity.

Another add and norm 1156 layer is followed by linear 1160 and softmax 1170 layers. The final hidden states of the Decoder are passed through a linear transformation to project them into the vocabulary space. Vocabulary space refers to the set of all unique tokens or words that the model can generate or predict. In the context of language models, the vocabulary is a predefined set of tokens that the model is trained on and can output. When the Decoder's final hidden states are passed through a linear transformation, they are projected into a vector space with the same dimensionality as the size of the vocabulary. Each dimension in this space corresponds to a specific token in the vocabulary. For example, the model has a vocabulary of 10,000 unique tokens. The linear transformation would project the Decoder's hidden states into a 10,000-dimensional vector space. Each element in this vector represents the model's predicted probability or score for the corresponding token in the vocabulary.

A softmax function is applied to the projected values (vectors) to generate output probabilities over the vocabulary. The softmax function normalizes the values so that they sum up to 1, representing a probability distribution over the vocabulary. Each probability indicates the likelihood of a specific token being the next output token. The token with the highest probability is selected as the next output token. During the model's training, the objective is to maximize the probability of the correct next token given the input sequence and the previously generated tokens. The model learns to assign higher probabilities to the tokens that are more likely to appear based on the context. At inference time, the token with the highest probability in the vocabulary space is selected as the next output token. This process is repeated iteratively, with the generated token being fed back into the Decoder as input for the next step, until a stopping criterion is met (e.g., reaching a maximum length or generating an end-of-sequence token). The size and composition of the vocabulary can vary depending on the specific task and the data the model is trained on. It can include words, sub-words, or even characters, depending on the tokenization strategy used.

The Decoder layers 1150 can be stacked Nx times, allowing the model to capture complex dependencies and generate coherent output sequences.

This transformer architecture allows the model to process input sequences, capture long-range dependencies, and generate output sequence based on the encoded input and the previously generated codewords.

There are at least three variations of transformer architecture that may enable an LCM. A first such variation comprises Auto-Encoding Models. In autoencoders, the decoder portion of the transformer is discarded after pre-training and only the encoder is used to generate the output. The popular BERT and RoBERTa models are examples of models based on this architecture and perform well on sentiment analysis and text classification. These types of models may be trained using a process called masked language modeling (MLM).

The primary goal of an autoencoder is to learn efficient representations of input data by encoding the data into a lower-dimensional space and then reconstructing the original data from the encoded representation. Autoencoders are trained in an unsupervised manner, meaning they don't require labeled data. They learn to capture the underlying structure and patterns in the input data without explicit guidance. An autoencoder consists of two main components: an encoder and a decoder. The encoder takes the input data and maps it to a lower-dimensional representation, often referred to as the latent space or bottleneck. The decoder takes the latent representation and tries to reconstruct the original input data. Autoencoders can be used for dimensionality reduction by learning a compressed representation of the input data in the latent space. The latent space has a lower dimensionality than the input data, capturing the most salient features or patterns. The training objective of an autoencoder is to minimize the reconstruction error between the original input and the reconstructed output. The model learns to encode and decode the data in a way that preserves the essential information needed for reconstruction. Variants and extensions of autoencoders can include denoising autoencoders, variational autoencoders (VAEs) which introduce a probabilistic approach to autoencoders wherein they learn a probabilistic encoder and decoder, allowing for generating new samples from the learned latent space, and conditional autoencoders which incorporate additional conditions or labels as input to the encoder and decoder, enabling the generation of samples conditioned on specific attributes.

Autoencoders can have various applications. Autoencoders can be used to detect anomalies by measuring the reconstruction error. Anomalous samples tend to have higher reconstruction errors compared to normal samples. Autoencoders can be used as a pre-training step to learn meaningful features from unlabeled data. The learned features can then be used for downstream tasks like classification or clustering. Additionally, or alternatively, autoencoders, particularly VAEs, can be used as generative models to generate new samples similar to the training data by sampling from the learned latent space. It's worth noting that while autoencoders can be effective for certain tasks, they have some limitations. They may struggle to capture complex dependencies and may generate blurry or less sharp reconstructions compared to other generative models like Generative Adversarial Networks (GANs).

Another type of variation is the auto-regressive model which feature the use of only the decoder portion of the transformer architecture. In autoregressive architectures, the decoder portion of the transformer is retained and the encoder portion is not used after model pre-training. Auto-regressive models are a class of models that generate outputs by predicting the next element based on the previously generated elements. In the context of the Transformer architecture and language modeling, auto-regressive models are commonly used for tasks such as text generation, machine translation, and language understanding.

Auto-regressive models generate outputs sequentially, one element at a time. In the case of language modeling, the model predicts the next word or token based on the previous words or tokens in the sequence. The prediction of the next element is conditioned on the previously generated elements. The model learns the conditional probability distribution $P(x_t | x\_1, x\_2, \ldots, x\_{t-1})$, where $x_t$ is the element at position t, and $x\_1, x\_2, \ldots, x\_{t-1}$ are the previously generated elements. The Transformer architecture, particularly the Decoder component, is well-suited for auto-regressive modeling. The Decoder generates the output sequence one element at a time, conditioned on the previously generated elements and the encoded input sequence from the Encoder. In the Transformer Decoder, the self-attention mechanism is masked to prevent the model from attending to future positions during training. This masking ensures that the model relies only on the previously generated elements to make predictions, following the auto-regressive property. During training, the Transformer Decoder uses a technique called teacher forcing. Instead of feeding the model's own predictions as input for the next step, the ground truth target sequence is used. This helps the model learn to generate the correct output sequence based on the input sequence and the previous target tokens. During inference or generation, the Transformer Decoder generates the output sequence one element at a time. At each step, the model takes the previously generated elements as input and predicts the next element. This process continues until a stopping criterion is met, such as reaching a maximum sequence length or generating an end-of-sequence token. Auto-regressive models, including the Transformer, have achieved state-of-the-art performance in language modeling tasks. They excel at capturing the statistical properties and dependencies in sequential data, making them effective for generating coherent and fluent text.

While text generation is the most suitable use case of auto-regressors, they perform exceptionally well on a wide variety of tasks. Most modern LLMs are auto-regressors including, for example, the popular GPT series of LLMs, BERT, and XLNet.

The third variation of the transformer model is the sequence-to-sequence model which utilizes both the encoder and decoder portions of the transformer and can be trained in multiple ways. One of the methods is span corruption and reconstruction. These models are, generally, best suited for language translation. The T5 and BART family of models are examples of sequence-to-sequence models.

Figure 12:
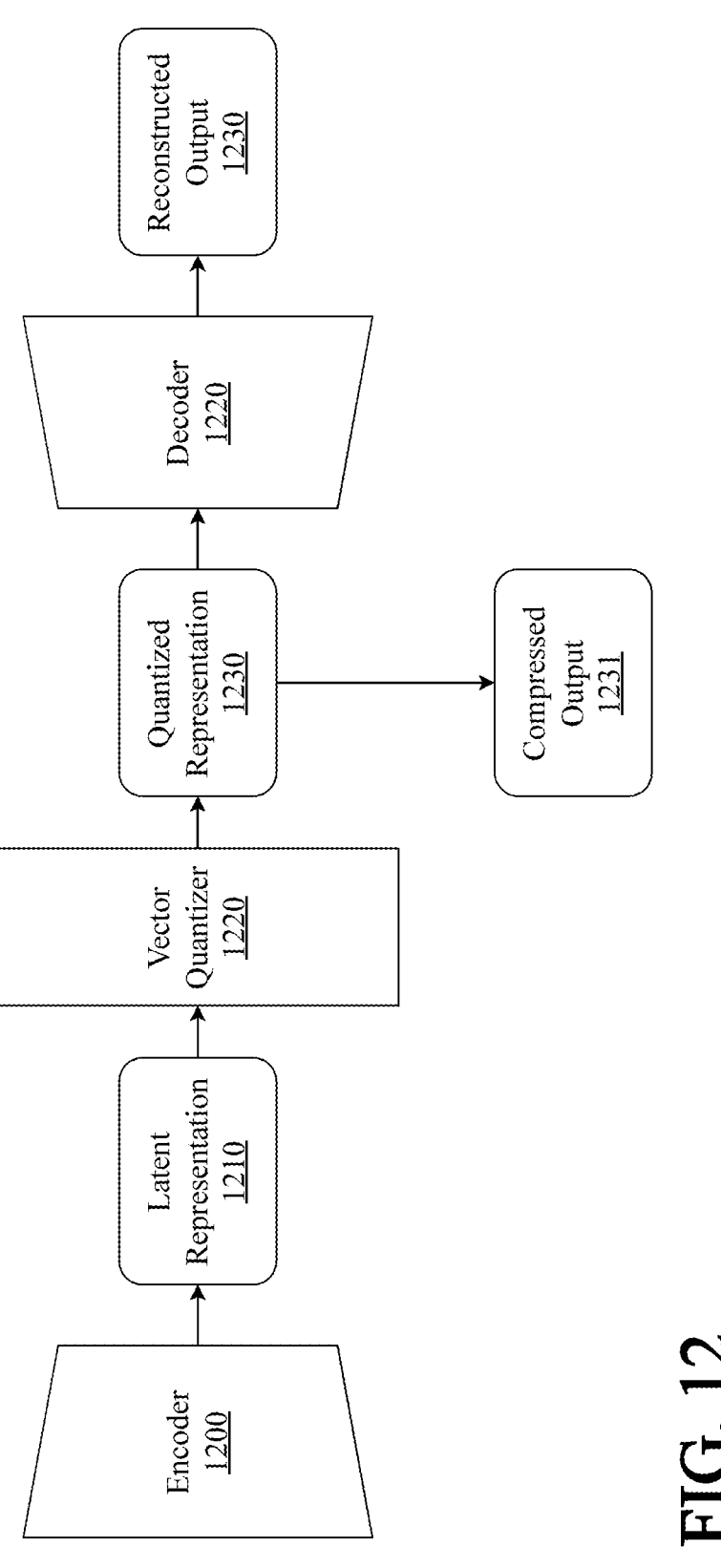
FIG. 12 is a block diagram illustrating an exemplary architecture for a subsystem of a system for federated two-stage compression with federated joint learning, a Variatitional Autoencoder with Vector Quantization (VAE-VQ) based compression network.

FIG. 12 is a block diagram illustrating an exemplary architecture for a subsystem of a system for federated two-stage compression with federated joint learning, a Variatitional Autoencoder with Vector Quantization (VAE-VQ) based compression network. The system begins with an encoder 1200, which is a key component of the Variational Autoencoder VAE architecture. The encoder takes input data and maps it to a latent representation 1210. In a VAE, this latent representation is generally not a single point in the latent space, but rather a probability distribution, typically modeled as a multivariate Gaussian. This probabilistic approach allows the VAE to capture uncertainty and variability in the input data, leading to more robust and generalizable representations.

The latent representation 1210 is then passed to the vector quantizer 1220. Vector Quantization (VQ) is a technique that maps continuous vectors to a finite set of discrete vectors, called a codebook. The vector quantizer compares the input latent representation to each vector in its codebook and selects the closest match. This process effectively discretizes the continuous latent space, creating a quantized representation 1230. The use of VQ introduces a form of lossy compression, as the continuous input is mapped to a finite set of discrete values.

The quantized representation 1230 serves two purposes in this system. First, it is used as the compressed output 1231, which can be efficiently stored or transmitted. This compressed form significantly reduces the data size while preserving the most important features of the original input.

Secondly, the quantized representation 1230 may be fed into a decoder 1220. The decoder, another component of the VAE architecture, is trained to reconstruct the original input data from the latent representation. In this case, it works with the quantized version of the latent representation. The decoder outputs a reconstructed output 1230, which aims to closely match the original input data.

The VAE-VQ system is trained end-to-end to minimize two main types of loss: reconstruction loss, which measures how closely the reconstructed output matches the original input, and a commitment loss, which encourages the encoder to produce latent representations that can be accurately quantized. Additionally, the vector quantizer's codebook may updated during training to better represent the distribution of the latent space.

This combination of VAE and VQ offers several advantages. The VAE component allows for learning of meaningful, continuous latent representations that capture the underlying structure of the data. The VQ component then provides a way to discretize this continuous space, enabling more efficient compression. Together, they create a powerful system for generating compact, information-rich representations of complex data, making it particularly useful for applications in data compression, feature learning, and generative modeling.

FIG. 13 is a flow diagram illustrating an exemplary method for federated two-state compression with federated joint learning using a VAE-VQ and a transformer. In a first step 1300, a trained VAE-VQ encoder compression network is initialized and deployed on an edge server. This step involves setting up a sophisticated compression network that combines a Variational Autoencoder (VAE) with Vector Quantization (VQ). The VAE component learns to encode input data into a meaningful latent space representation, while the VQ component discretizes this representation for more efficient compression. This network is pre-trained on relevant data to ensure it can effectively compress the specific types of input the edge server will encounter.

In a step 1310, the compression network is used to process input data on the edge server into compressed data. This step involves feeding raw input data through the VAE-VQ network. The encoder part of the VAE maps the input to a latent representation, which is then quantized by the VQ component. This process significantly reduces the data size while preserving essential features and structure of the original input. The resulting compressed data is a compact, discrete representation of the original input, suitable for efficient storage or transmission.

In a step 1320, the compressed data is sent from the edge server to a midserver where it may be further transmitted to a cloud. This step facilitates the movement of compressed data through the system's hierarchy. The midserver acts as an intermediary, potentially performing additional processing or aggregation of data from multiple edge servers before forwarding it to the cloud. This multi-tier approach allows for efficient data handling and reduces the bandwidth required between the edge and the cloud.

In a step 1330, the aggregated compressed data is used to train and deploy a large codeword model, where the core of the large codeword model may be a variety of deep learning architectures. This step takes place in the cloud environment, leveraging its superior computational resources. The compressed data from multiple sources is aggregated and used to train a sophisticated model that can understand and generate these compressed representations. The core of this model could be implemented using various architectures, such as Transformers, which excel at processing sequential data and capturing long-range dependencies; Diffusion models, which have shown promise in generative tasks; or other custom deep learning architectures tailored to the specific requirements of the system. This large codeword model serves as the central intelligence of the system, capable of performing complex tasks or generating outputs based on the compressed input data.

This method outlines a powerful approach to distributed, efficient data processing and model training. It leverages edge computing for initial data compression, uses midservers for data aggregation and transmission, and employs cloud resources for sophisticated model training and deployment. This hierarchical structure allows for efficient use of resources at each level while enabling the development of powerful, data-driven models.

Figure 15:
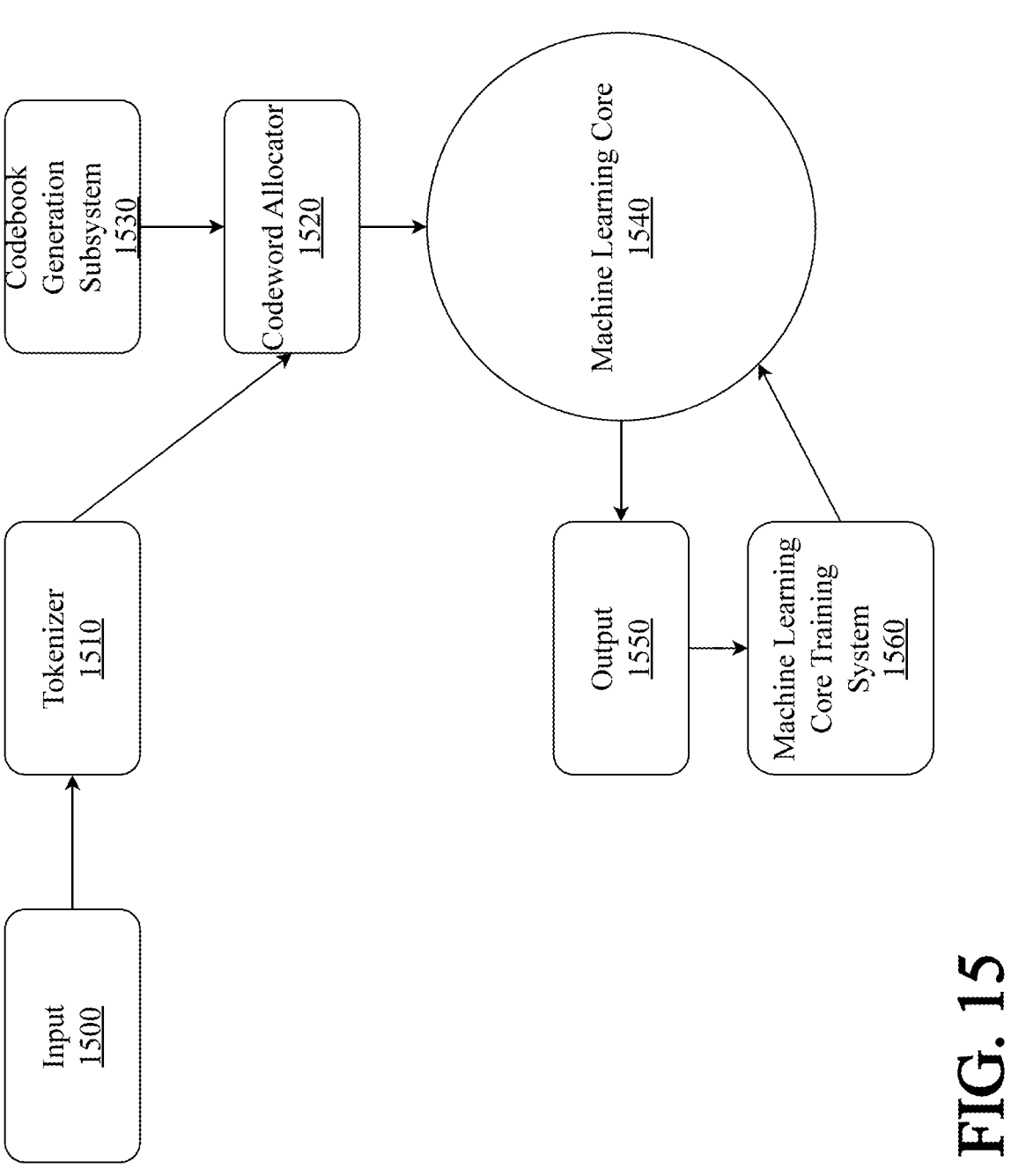
FIG. 15 is a block diagram illustrating an exemplary system architecture for a large codeword model for deep learning.

FIG. 15 is a block diagram illustrating an exemplary system architecture for a large codeword model for deep learning. An input 1500 represents the raw data that needs to be processed by the LCM. This data can be in various modalities, such as text, images, audio, time series, or any other structured or unstructured format. The input data is fed into the tokenizer 1510 for further processing.

A tokenizer 1510 is responsible for splitting the input data into meaningful semantic units called sourceblocks. This process, known as semantic splitting, aims to capture the inherent structure and patterns in the data. The tokenizer can employ various techniques to identify the optimal sourceblocks, such as rule-based splitting, statistical methods, or machine learning approaches. For textual data, the tokenizer may use subword tokenization methods like Byte-Pair Encoding (BPE) or WordPiece, which break down words into smaller, more frequently occurring units. For images, the tokenizer may use approaches such as but not limited to a patch-approach, where the image is divided into fixed-size patches or regions. The specific tokenization method can be chosen based on the data modality and the characteristics of the domain. For example, the first paragraph of Leo Tolstoy's War and Peace which reads, "Well, Prince, so Genoa and Lucca are now just family estates of the Buonapartes," may be tokenized into ['Well', ',', 'Prince', ',', 'so', 'Gen', 'oa', 'and', 'Luc', 'ca', 'are', 'now', 'just', 'family', 'estates', 'of', 'the', 'Buon', 'apar', 'tes', '.'].

In one embodiment, the tokenizer may utilize Huffman coding to split the data into sourceblocks. The Huffman coding-based tokenizer enables efficient and semantically meaningful splitting of the input data into sourceblocks. Huffman coding is a well-known data compression algorithm that assigns variable-length codes to symbols based on their frequency of occurrence. In the context of the LCM, the Huffman coding-based tokenizer adapts this principle to perform semantic splitting of the input data.

With Huffman coding, the tokenizer starts by analyzing the input data and identifying the basic units of meaning, such as words, phrases, or subwords, depending on the specific data modality and the desired level of granularity. These basic units form the initial set of sourceblocks. The tokenizer then performs a frequency analysis of the sourceblocks, counting the occurrences of each sourceblock in the input data. Based on the frequency analysis, the tokenizer constructs a Huffman tree, which is a binary tree that represents the probability distribution of the sourceblocks. The Huffman tree is built by iteratively combining the two least frequent sourceblocks into a single node, assigning binary codes to the branches, and repeating the process until all sourceblocks are included in the tree. The resulting Huffman tree has the property that sourceblocks with higher frequencies are assigned shorter codes, while sourceblocks with lower frequencies are assigned longer codes.

The Huffman coding-based tokenizer then uses the constructed Huffman tree to perform semantic splitting of the input data. It traverses the input data and matches the sequences of symbols against the sourceblocks represented in the Huffman tree. When a sourceblock is identified, the tokenizer assigns the corresponding Huffman code to that sourceblock, effectively compressing the data while preserving its semantic structure. The use of Huffman coding for semantic splitting offers several advantages. It allows for variable-length sourceblocks, enabling the tokenizer to capture meaningful units of varying sizes. This is particularly useful for handling data with different levels of complexity and granularity, such as text with compound words or images with hierarchical structures.

A Huffman coding-based approach optimizes the representation of the sourceblocks based on their frequency of occurrence. By assigning shorter codes to more frequent sourceblocks and longer codes to less frequent ones, the tokenizer achieves data compression while still preserving the semantic information. This compression reduces the overall size of the data and improves the efficiency of subsequent processing stages. Additionally, the Huffman tree construction process inherently captures the statistical properties and patterns within the input data. The resulting sourceblocks and their assigned codes reflect the underlying structure and relationships present in the data. This semantic awareness enhances the ability of the LCM to learn and generate meaningful representations.

After the semantic splitting process, the resulting sourceblocks and their assigned Huffman codes are passed to the codeword allocator. The codeword allocator maps each sourceblock to a unique codeword, which is a compact representation used by the subsequent components of the LCM architecture. The codeword mapping can be based on various schemes, such as a fixed-length binary encoding or a learned embedding space.

Once the input data is tokenized into sourceblocks, the codeword allocator 120 assigns a unique codeword to each sourceblock. The codewords are discrete, compressed representations of the sourceblocks, designed to capture the essential information in a compact form. The codeword allocator can use various mapping schemes to assign codewords to sourceblocks, such as hash functions, lookup tables, or learned mappings. For example, a simple approach could be to use a hash function that maps each sourceblock to a fixed-length binary code. Alternatively, another approach may involve learning a mapping function that assigns codewords based on the semantic similarity of the sourceblocks.

The codebook generation subsystem 130 is responsible for creating and maintaining the codebook, which is a collection of all the unique codewords used by the LCM. The codebook can be generated offline, before the actual processing begins, or it can be updated dynamically as new sourceblocks are encountered during processing. The codebook generation subsystem can use various techniques to create a compact and efficient codebook, such as frequency-based pruning, clustering, or vector quantization. The size of the codebook can be adjusted based on the desired trade-off between compression and information preservation. Going back to the War and Peace example, the string of tokens ['Well', ',', 'Prince', ',', 'so', 'Gen', 'oa', 'and', 'Luc', 'ca', 'are', 'now', 'just', 'family', 'estates', 'of', 'the', 'Buon', 'apar', 'tes', '.'] may be given codewords such as [12, 5, 78, 5, 21, 143, 92, 8, 201, 45, 17, 33, 49, 62, 87, 11, 2, 179, 301, 56, 4], where each token is assigned a unique codeword, which is represented as an integer. The mapping between tokens and codewords is determined by the codebook generated by the LCM system.

The machine learning core 1540 is the central component of the LCM architecture, where the actual learning and processing take place. The core operates on the codewords generated by the codeword allocator, learning to process, generate, and manipulate the compressed representations. The machine learning core can be implemented using various configurations, depending on the specific task and data modality. Some possible variations include:

In one embodiment, the machine learning core 1540 may be a Transformer-based core. The Transformer-based core consists of several key components. An embedding layer maps the codewords to dense vector representations, capturing their semantic and syntactic properties. Positional encoding is used to incorporate positional information into the codeword embeddings, enabling the Transformer to distinguish the relative positions of the codewords in the input sequence. The multi-head attention mechanism, which is the core building block of the Transformer, allows the model to attend to different parts of the input sequence simultaneously, capturing complex dependencies and relationships between codewords. Feed-forward networks are used to introduce non-linearity and increase the expressive power of the model. Residual connections and layer normalization are employed to facilitate the flow of information and stabilize the training process.

The transformer-based core can be implemented using an encoder-decoder architecture. The encoder processes the input codewords and generates contextualized representations, while the decoder takes the encoder's output and generates the target codewords or the desired output sequence. The encoder and decoder are composed of multiple layers of multi-head attention and feed-forward networks, allowing for deep and expressive processing of the codeword representations.

One of the key advantages of the transformer-based core in the LCM architecture is its ability to capture long-range dependencies between codewords. Unlike recurrent neural networks (RNNs), which process the input sequentially, the transformer can attend to all codewords in parallel, enabling it to effectively capture relationships and dependencies that span across the entire input sequence. This is useful for processing long and complex data sequences, where capturing long-range dependencies is crucial for understanding the overall context. Another advantage of the Transformer-based core is its parallelization capability. The self-attention mechanism in the Transformer allows for efficient parallel processing of the codewords on hardware accelerators like GPUs. This parallelization enables faster training and inference times, making the LCM architecture suitable for processing large amounts of data in real-time applications.

The Transformer-based core also generates contextualized representations of the codewords, where each codeword's representation is influenced by the surrounding codewords in the input sequence. This contextualization allows the model to capture the semantic and syntactic roles of the codewords based on their context, enabling a deeper understanding of the relationships and meanings within the data. The scalability of the Transformer-based core is another significant advantage in the LCM architecture. By increasing the number of layers, attention heads, and hidden dimensions, the Transformer can learn more complex patterns and representations from large-scale datasets. This scalability has been demonstrated by models like GPT-3, which has billions of parameters and can perform a wide range of tasks with impressive performance.

In another embodiment, the machine learning core 1540 may utilize a Variational Autoencoder (VAE)-based core. A VAE-based core consists of two main components: an encoder and a decoder. The encoder takes the codewords as input and maps them to a lower-dimensional latent space representation. The encoder is typically implemented as a neural network, such as a multi-layer perceptron (MLP) or a convolutional neural network (CNN), depending on the nature of the codewords and the data modality. The encoder learns to compress the codewords into a compact latent representation while capturing the essential features and relationships within the data.

The decoder, on the other hand, takes the latent space representation and reconstructs the original codewords. The decoder is also implemented as a neural network, typically the inverse architecture of the encoder. The decoder learns to map the latent space representation back to the codeword space, generating codewords that closely resemble the original input. One of the key advantages of the VAE-based core in the LCM architecture is its ability to learn a continuous and structured latent space representation of the codewords. The latent space captures the underlying patterns and relationships within the data, allowing for smooth interpolation and generation of new codewords. By sampling from the latent space, the VAE-based core can generate novel and meaningful codewords that are similar to the original data distribution.

The VAE-based core also enables efficient compression of the codewords. By encoding the codewords into a lower-dimensional latent space, the VAE reduces the storage and computational requirements of the LCM. The compact latent representation can be used for various downstream tasks, such as data compression, similarity search, or data generation. The VAE-based core in the LCM architecture offers several advantages over traditional data processing techniques. It enables the learning of a compact and expressive latent representation of the codewords, capturing the essential features and relationships within the data. The continuous latent space allows for smooth interpolation and generation of new codewords, enabling tasks such as data augmentation, anomaly detection, and creative content generation.

The LCM architecture with the VAE-based core has a wide range of applications across various domains. In natural language processing, it can be used for tasks such as language modeling, text generation, and text compression. In computer vision, the VAE-based core can be applied to image compression, image generation, and unsupervised representation learning. The architecture can also be used for audio and speech processing, where the codewords represent audio features, enabling tasks such as audio compression, speech synthesis, and music generation.

In another embodiment, the machine learning core 1540 may be a Recurrent Neural Network (RNN)-based core. The RNN-based core consists of one or more recurrent layers, such as Long Short-Term Memory (LSTM) or Gated Recurrent Unit (GRU) layers. These recurrent layers maintain an internal state that allows them to remember and process information from previous time steps, enabling the capture of long-term dependencies and context within the codeword sequences.

The RNN-based core takes a sequence of codewords as input and processes them one at a time. At each time step, the RNN-based core updates its internal state based on the current input codeword and the previous state. This allows the core to learn and encode the temporal dependencies and patterns within the codeword sequences.

The RNN-based core can be used for various tasks, such as codeword sequence prediction, codeword generation, and sequence-to-sequence mapping. In codeword sequence prediction, the RNN-based core learns to predict the next codeword in a sequence given the previous codewords. This enables tasks such as language modeling, time series forecasting, and predictive maintenance.

In codeword generation, the RNN-based core can be trained to generate new codeword sequences based on a learned probability distribution. By sampling from this distribution, the core can generate novel and coherent codeword sequences that resemble the training data. This has applications in tasks such as text generation, music composition, and synthetic data generation. Sequence-to-sequence mapping involves using two RNN-based cores, an encoder and a decoder, to map an input codeword sequence to an output codeword sequence. The encoder RNN processes the input sequence and generates a fixed-length context vector that captures the essential information. The decoder RNN takes the context vector and generates the output codeword sequence step by step. This architecture has been successfully applied to tasks such as machine translation, speech recognition, and image captioning.

The RNN-based core in the LCM architecture offers several advantages over traditional data processing techniques. It enables the capture and modeling of temporal dependencies and sequential patterns within the codeword sequences, which is crucial for processing and generating sequential data. The RNN-based core can learn and adapt to the specific characteristics and patterns of the data, allowing for more accurate and contextually relevant processing and generation. Furthermore, the RNN-based core can handle variable-length sequences, making it suitable for processing data with different lengths and temporal resolutions. The recurrent nature of the RNN allows it to maintain and propagate information over long sequences, enabling the capture of long-term dependencies and context.

In another embodiment, the core can be implemented as a hybrid of multiple architectures, combining the strengths of different approaches. For example, a Transformer-VAE hybrid can be used, where the Transformer encoder generates contextualized representations of the codewords, and the VAE decoder generates new codewords based on the learned latent space. The specific choice of the machine learning core can be tailored to the requirements of the task and the characteristics of the data. The modular nature of the LCM architecture allows for easy experimentation and adaptation of different core configurations.

After processing the codewords, the machine learning core generates the output 150 in the desired format. The output can be in the form of codewords, which can be mapped back to the corresponding sourceblocks or tokens using the inverse mapping scheme. Alternatively, the output can be directly generated in the target modality, such as text, images, or audio, depending on the specific application.

The LCM architecture offers several advantages over traditional deep learning approaches. By operating on compressed codewords instead of raw tokens, the LCM can reduce the computational and memory requirements, making it more efficient and scalable. The semantic splitting and codeword representation also allow the LCM to capture the inherent structure and patterns in the data, enabling more effective learning and generalization. Moreover, the modular nature of the LCM architecture allows for easy adaptation to different data modalities and tasks, making it a versatile and flexible framework for various applications.

Figure 16:
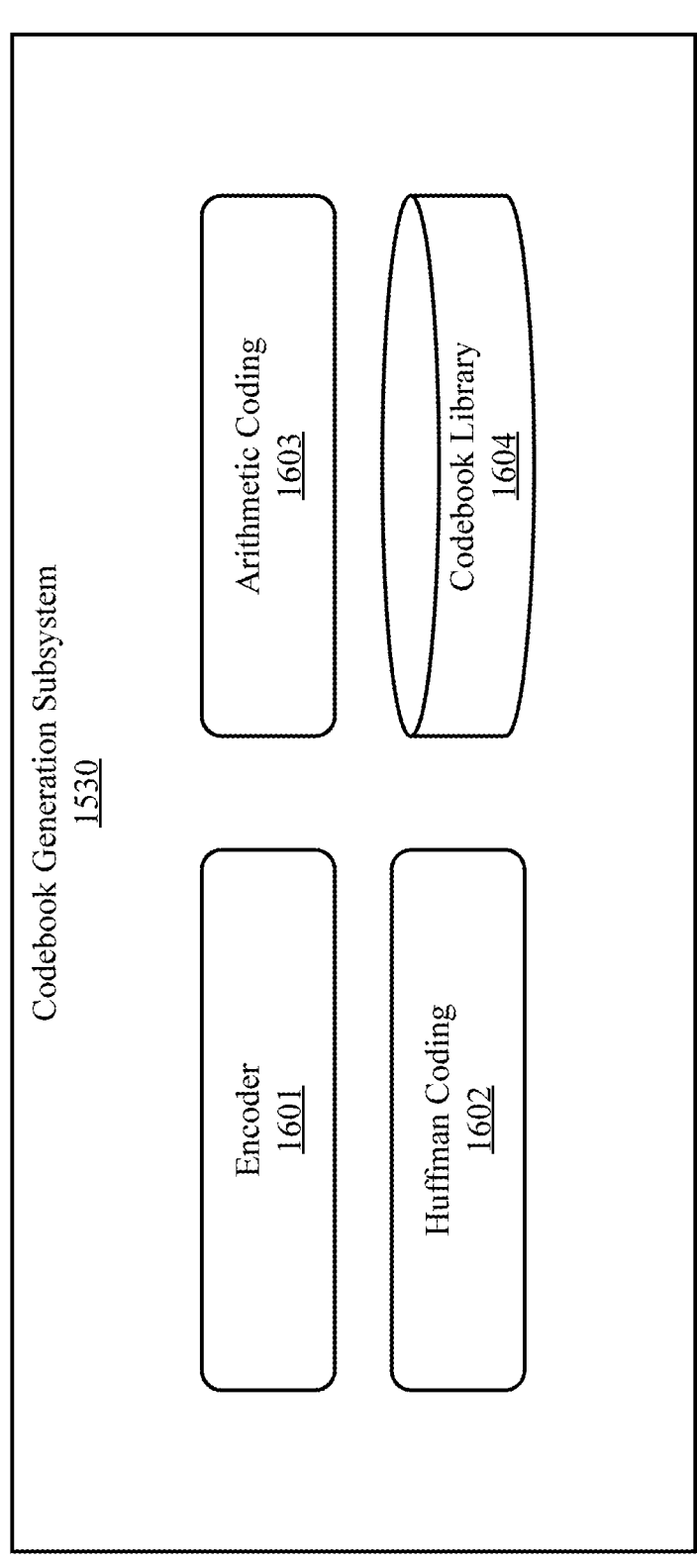
FIG. 16 is a block diagram illustrating an aspect of system for a large codeword model for deep learning, a codeword generation subsystem.

FIG. 16 is a block diagram illustrating an aspect of system and method for a large codeword model for deep learning, a codeword generation subsystem. According to the aspect, codebook generation subsystem 1530 is configured to generate one or more codebooks for a collection of input data using various techniques, such as Huffman coding or arithmetic coding.

The codebook is an important component of the codebook-based homomorphic compression system. According to the embodiment, it is a collection of codewords, where each codeword corresponds to a sourceblock in the tokenized input. The codebook may generate based on the frequency distribution of the tokenized inputs, assigning shorter codewords to more frequently occurring tokens and longer codewords to less frequent tokens. There are several techniques for generating the codebook, with the goal of minimizing the average codeword length while maintaining the uniqueness of the codewords. Two common techniques are Huffman coding 1602 and arithmetic coding 1603. Huffman coding 1602 is a variable-length coding technique that assigns codewords based on the frequency of occurrence of each symbol (sourceblock). It constructs a binary tree, known as the Huffman tree, where each leaf node represents a symbol and the path from the root to the leaf determines the codeword. More frequent symbols are assigned shorter codewords, while less frequent symbols receive longer codewords. Huffman coding guarantees an optimal prefix code, meaning no codeword is a prefix of any other codeword. For example, consider the quantized temperature data from the previous example. Let's say the frequency distribution of the intervals is as follows:

Sourceblock 0: 5%
Sourceblock 1: 10%
Sourceblock 2: 20%
Sourceblock 3: 15%
Sourceblock 4: 50%

Using Huffman coding, the codebook generation subsystem 1530 can generate the following codebook:

Sourceblock 0: 1100
Sourceblock 1: 101
Sourceblock 2: 00
Sourceblock 3: 01
Sourceblock 4: 11

The most frequent tokenized input (Sourceblock 4) receives the shortest codeword (11), while the least frequent tokenized input (Sourceblock 0) receives the longest codeword (1100).

Arithmetic coding 1603 is another entropy coding technique that assigns codewords to sourceblocks based on their probability distribution. Unlike Huffman coding, arithmetic coding does not assign fixed codewords to symbols. Instead, it represents the entire message as a single fractional number between 0 and 1. The interval [0, 1) is recursively divided based on the probabilities of the symbols, and the final codeword is a binary fraction that falls within the subinterval corresponding to the entire message. Arithmetic coding achieves near-optimal compression rates but requires more computational complexity compared to Huffman coding. For example, using the same quantized temperature data and frequency distribution as before, arithmetic coding would assign subintervals to each symbol based on their probabilities:

Sourceblock 0: [0.00, 0.05)
Sourceblock 1: [0.05, 0.15)
Sourceblock 2: [0.15, 0.35)

Sourceblock 3: [0.35, 0.50)

Sourceblock 4: [0.50, 1.00)

To encode a message sequence like [Sourceblock 4, Sourceblock 2, Sourceblock 1], arithmetic coding would recursively subdivide the interval [0, 1) based on the probabilities of the symbols, resulting in a final subinterval. The codeword would be a binary fraction that lies within this final subinterval.

According to an embodiment, an encoder component 1601 is present and configured to implement one or more deep learning techniques for generating codewords for quantized data. Deep learning techniques can be employed to generate effective codewords for the quantized data. One approach is to use deep learning-based autoencoder models to learn compact and meaningful representations of the quantized data. Autoencoders are neural network architectures that consist of an encoder and a decoder, where the encoder learns to compress the input data into a lower-dimensional latent space, and the decoder reconstructs the original data from the latent representation.

Here are a few exemplary deep learning encoding techniques that can be implemented for creating codewords of the quantized data, according to an embodiment. Convolutional autoencoders (CAEs) leverage convolutional neural networks (CNNs) in the encoder and decoder parts of the autoencoder. CNNs are particularly effective in capturing spatial dependencies and hierarchical features in data, making them well-suited for encoding structured data such as images or time series. In the context of the codebook-based homomorphic compression, a CAE can be trained on the quantized data. The encoder part of the CAE learns to compress the quantized data into a compact latent representation, which serves as the codeword. The decoder part learns to reconstruct the quantized data from the codeword. As an example, consider an example of using a CAE for encoding quantized sensor data. The quantized data is represented as a 2D matrix, where each row corresponds to a sensor reading, and each column represents a time step. The CAE encoder consists of convolutional layers followed by pooling layers, which gradually reduce the spatial dimensions of the input and extract meaningful features. The output of the encoder is a compact latent representation, which serves as the codeword. The CAE decoder consists of upsampling layers and convolutional layers, which reconstruct the original quantized data from the codeword.

Another form of deep learning coding includes recurrent autoencoders (RAEs). Recurrent autoencoders utilize recurrent neural networks (RNNs) in the encoder and decoder parts of the autoencoder. RNNs are well-suited for processing sequential data, such as time series or natural language, as they can capture temporal dependencies and context. An RAE can be used to encode quantized sequential data. The encoder part of the RAE consists of recurrent layers, such as Long Short-Term Memory (LSTM) or Gated Recurrent Unit (GRU) layers, which process the input sequence and generate a fixed-length latent representation, serving as the codeword. The decoder part of the RAE takes the codeword and reconstructs the original quantized sequence. For example, consider an example of using an RAE for encoding quantized audio data. The quantized audio signal is represented as a sequence of amplitude values. The RAE encoder consists of LSTM layers that process the input sequence and generate a fixed-length latent representation, which serves as the codeword. The RAE decoder, also consisting of LSTM layers, takes the codeword and reconstructs the original quantized audio sequence.

Another form of deep learning coding includes variational autoencoders (VAEs). Variational autoencoders extend the concept of autoencoders by introducing a probabilistic framework. VAEs learn to encode the input data into a probability distribution in the latent space, rather than a single point. The encoder part of the VAE learns to map the input data to the parameters of a probability distribution (e.g., mean and variance of a Gaussian distribution), and the decoder part learns to reconstruct the original data from samples drawn from this distribution. A VAE can be used to generate codewords that capture the underlying probability distribution of the quantized data. The encoder part of the VAE learns to map the quantized data to the parameters of a probability distribution in the latent space. The codewords are then obtained by sampling from this distribution. The decoder part of the VAE learns to reconstruct the original quantized data from the sampled codewords. Consider an example of using a VAE for encoding quantized image data. The quantized images are fed into the VAE encoder, which learns to map each image to the parameters of a Gaussian distribution in the latent space. The codewords are obtained by sampling from this distribution. The VAE decoder takes the sampled codewords and reconstructs the original quantized images.

Another form of deep learning coding includes deep belief networks (DBNs). Deep Belief Networks are generative models that consist of multiple layers of restricted Boltzmann machines (RBMs). DBNs can learn hierarchical representations of the input data by training each layer in an unsupervised manner, followed by fine-tuning the entire network using supervised learning. DBNs can be used to generate codewords that capture the hierarchical structure of the quantized data. The DBN is trained on the quantized data, and the activations of the hidden layers serve as the codewords. The hierarchical nature of DBNs allows for capturing complex patterns and dependencies in the data. Consider an example of using a DBN for encoding quantized text data. The quantized text is represented as a binary vector, where each element corresponds to the presence or absence of a specific word. The DBN is trained on the quantized text data, and the activations of the hidden layers serve as the codewords. The DBN learns to capture the hierarchical structure and semantic relationships in the text data.

These are just a few examples of deep learning encoding techniques that can be explored for creating codewords of the quantized data in a LCM. The choice of the specific deep learning architecture depends on the nature of the data and the desired properties of the codewords. It's important to note that the deep learning encoding process should be designed to generate codewords that are suitable for homomorphic operations. The codewords should exhibit certain properties, such as being compatible with the homomorphic encryption scheme's plaintext space and allowing for efficient homomorphic computations.

During the training process of the deep learning models, the objective function should be designed to capture the desired properties of the codewords, such as minimizing the reconstruction error while ensuring the codewords are suitable for homomorphic operations. Additionally, regularization techniques can be employed to encourage sparsity or other desirable properties in the codewords. Once the deep learning models are trained, the encoder part can be used to generate codewords for new quantized data. The generated codewords can then be used in the codebook-based homomorphic compression scheme, enabling efficient and privacy-preserving computations on the compressed data.

Experimental evaluation and performance analysis can be conducted to assess the effectiveness of the deep learning encoding techniques in generating codewords that achieve good compression ratios, maintain low approximation errors, and enable efficient homomorphic operations. The choice of the deep learning architecture and hyperparameters can be fine-tuned based on the specific requirements and characteristics of the data.

According to the aspect, a codebook library 1604 is present and configured to store a plurality of codewords (i.e., a codebook) generated by one or more of the techniques described herein. When it comes to storing the codewords and codebook in the codebook-based homomorphic compression system, several database systems and data storage solutions can be considered. The choice of the storage system depends on factors such as the size of the codebook, the frequency of updates, the retrieval and query requirements, and the overall system architecture. In some implementations key-value stores may be used, Key-value stores are a type of NoSQL database that provide a simple and efficient way to store and retrieve data based on a unique key. Examples of key-value stores include Redis, Memcached, and Amazon DynamoDB. For storing the codewords and codebook, key-value stores can be used to store each codeword as a key-value pair, where the key represents the codeword, and the value represents the corresponding data or metadata associated with the codeword. The codebook can be stored as a collection of key-value pairs, allowing for fast retrieval of codewords based on their keys. Key-value stores offer high performance, low latency, and scalability, making them suitable for scenarios where fast retrieval of codewords is critical.

Document databases, such as MongoDB or Couchbase, store data as flexible, semi-structured documents in formats like JSON or BSON. They provide a schema-less design and allow for easy modification of the data structure. For storing the codewords and codebook, document databases can be used to store each codeword as a document, along with its associated data or metadata. The codebook can be stored as a collection of documents, where each document represents a codeword and its related information. Document databases offer flexibility in terms of data structure, allowing for easy addition or modification of codeword attributes. They also provide querying capabilities based on document fields, enabling efficient retrieval of codewords based on specific criteria.

Relational databases, such as MySQL, PostgreSQL, or Oracle, can also be used to store the codewords and codebook. In a relational database, the codewords can be stored in a table with columns representing the codeword and its associated data or metadata. The codebook can be stored in a separate table, with each row representing a codeword and its corresponding information. Relational databases provide structured querying capabilities using SQL, allowing for efficient retrieval and filtering of codewords based on specific conditions. Relational databases offer strong consistency, ACID properties, and support for complex queries, making them suitable for scenarios where data integrity and structured querying are important.

Graph databases, such as Neo4j or Amazon Neptune, store data as nodes and edges in a graph structure. They are designed to efficiently handle complex relationships and connections between data entities. For storing the codewords and codebook, graph databases can be used to represent the relationships between codewords and their associated data or metadata. Each codeword can be represented as a node in the graph, with edges connecting related codewords or linking codewords to their corresponding data. Graph databases provide efficient traversal and querying capabilities based on the graph structure, allowing for fast retrieval of connected codewords and exploration of relationships between codewords.

Distributed key-value stores, such as Apache Cassandra or Apache HBase, are designed to handle large-scale data and provide high scalability and fault tolerance. They distribute data across multiple nodes in a cluster, allowing for horizontal scaling. For storing the codewords and codebook, distributed key-value stores can be used to store codewords as key-value pairs, similar to regular key-value stores. The codebook can be partitioned and distributed across multiple nodes in the cluster, enabling high scalability and performance. Distributed key-value stores offer eventual consistency, high write throughput, and the ability to handle large volumes of data, making them suitable for scenarios where scalability and fault tolerance are critical.

Figure 17:
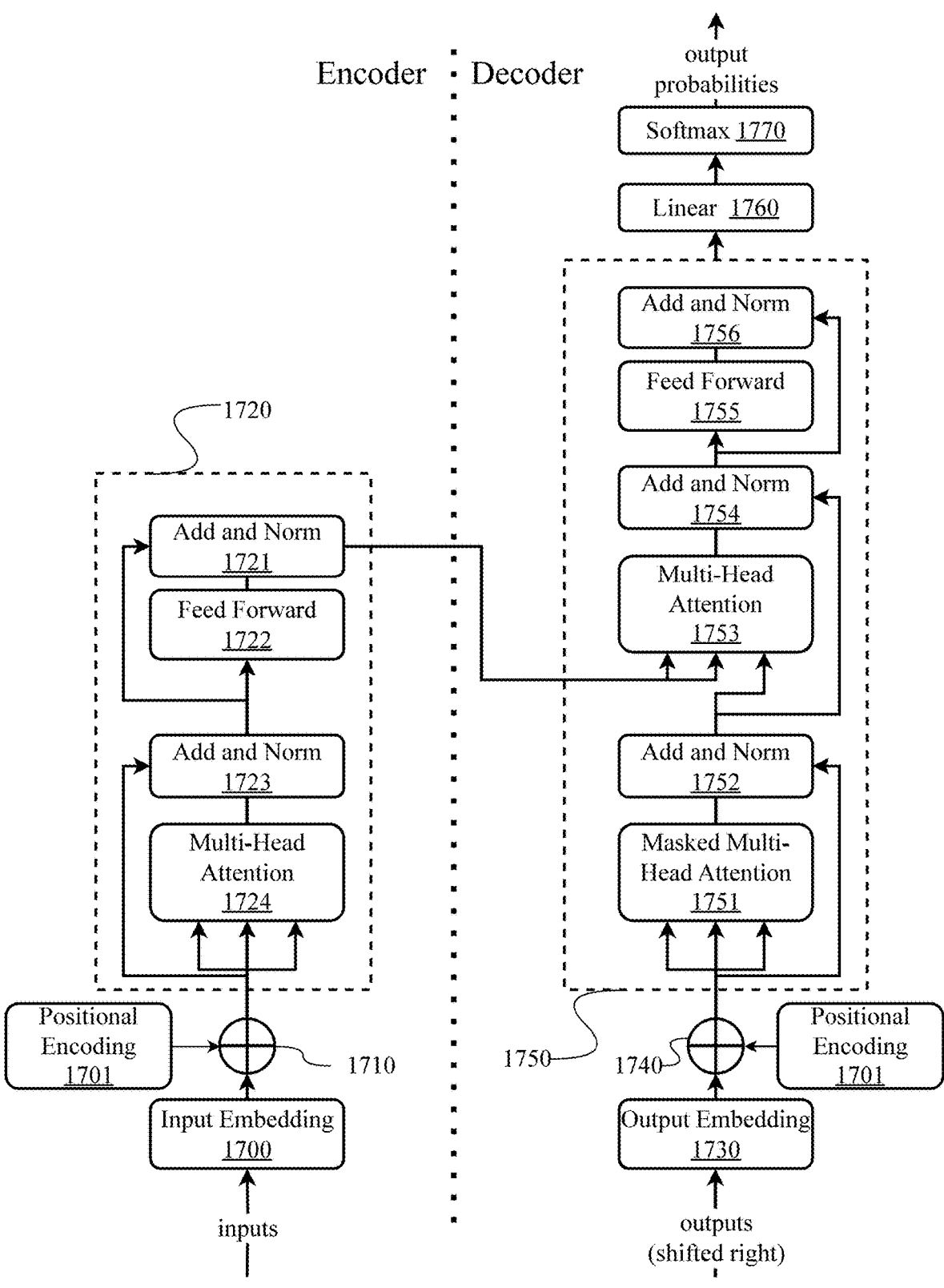
FIG. 17 is a block diagram illustrating an embodiment of the system for a large codeword model for deep learning, where the machine learning core is a transformer-based core.

FIG. 17 is a block diagram illustrating an embodiment of the system and method for a large codeword model for deep learning, where the machine learning core is a Transformer-based core. A Transformer generally comprises an Encoder (the components on the left side of the illustration) and a Decoder (the components on the right side of the illustration).

The illustrated Transformer comprises an Encoder and a Decoder. The Encoder takes input embeddings and processes them through a stack of layers (represented as dashed box 1720). Each layer consists of: positional encoding, which adds position information to the input embeddings; multi-head attention, which allows the model to attend to different parts of the input sequence; add and norm, which applies residual connection and layer normalization; feed forward, which is a fully connected feed-forward network; and add and norm which is another residual connection and layer normalization.

The power of the transformer model lies in the self-attention mechanism. This mechanism contributes to accelerated learning compared to traditional models such as long short-term memory models. Self-attention empowers the transformer model with the remarkable capability to meticulously scrutinize distinct segments of a given sequence or even encompass the entire contextual essence of a sentence. This profound contextual awareness enables the model to make predictions with an elevated degree of accuracy and relevance.

The input embedding 1700 to the Encoder is a sequence of tokens, typically represented as integers. Each token is mapped to a learnable embedding vector of a fixed size. The embedding layer is a lookup table that converts each token into its corresponding dense vector representation. The embeddings are learned during training and capture semantic and syntactic relationships between tokens.

A dense vector representation, also known as a dense embedding or a continuous vector representation, is a way of representing data, particularly words or tokens, as dense vectors in a high-dimensional continuous space. In the context of natural language processing (NLP) and language models, dense vector representations are used to capture semantic and syntactic information about words or tokens. Each word or token is mapped to a fixed-size vector of real numbers, typically with hundreds or thousands of dimensions. Each word or token is represented by a vector of a fixed size, regardless of the length of the input sequence. The size of the vector is a hyperparameter that is determined during model design. The vectors exist in a continuous high-dimensional space, where each dimension represents a latent feature or aspect of the word or token. The continuous nature allows for capturing fine-grained relationships and similarities between words. The dense vector representations are learned during the training process of the model. The model learns to assign similar vectors to words that have similar meanings or occur in similar contexts. The dense vector representations aim to capture semantic and syntactic relationships between words. Words that have similar meanings or are used in similar contexts tend to have similar vector representations. Dense vector representations allow for performing algebraic operations on words, such as addition and subtraction. These operations can capture analogies and relationships between words, such as "prince"–"man"+"woman"≈"princess". Dense vector representations serve as input features for various downstream NLP tasks, such as text classification, sentiment analysis, named entity recognition, and machine translation. The dense representations provide a rich and informative input to the models, enabling them to learn patterns and make predictions. Some popular examples of dense vector representations include, but are not limited to, Word2Vec, Global Vectors for Word Representations (GloVe), FastText, and BERT.

After the input embedding layer, positional encoding 1701 is added to the input embedding to provide position information to the model. The positional encoding 1701 and the input embedding 1700 may be added using a function 1710. Since the Transformer architecture doesn't have inherent recurrence or convolution, positional encodings help capture the order and relative positions of tokens. The positional encodings are typically sine and cosine functions of different frequencies, allowing the model to learn relative positions. The positional encodings have the same dimensionality as the input embeddings and are summed with them.

The Encoder utilizes a multi-head attention mechanism 1724 which is a key component of the Transformer architecture. It allows the Encoder to attend to different parts of the input sequence and capture dependencies between tokens. The attention mechanism computes three matrices: Query (Q), Key (K), and Value (V). The Query, Key, and Value matrices are obtained by linearly projecting the input embeddings using learned weight matrices. The attention scores are computed by taking the dot product of the Query matrix with the transpose of the Key matrix, followed by scaling and applying a softmax function. The attention scores determine the importance of each token in the input sequence for a given position. The Value matrix is then multiplied with the attention scores to obtain the weighted sum of the values, which forms the output of the attention mechanism. Multi-Head Attention splits the Query, Key, and Value matrices into multiple heads, allowing the model to attend to different aspects of the input simultaneously. The outputs from each head are concatenated and linearly projected to obtain the final output of the Multi-Head Attention layer 324.

After the Multi-Head Attention layer, a residual connection is applied, followed by Layer Normalization at add and norm 1723. The residual connection adds the input embeddings to the output of the attention layer, helping the model learn faster and deeper. Layer Normalization normalizes the activations across the features, stabilizing the training process.

The Feed Forward layer 1722 is a fully connected neural network applied to each position of the Encoder's hidden states. It consists of two linear transformations with a Rectified Linear Unit (ReLU) activation function in between. The purpose of the Feed Forward layer is to introduce non-linearity and increase the model's capacity to learn complex representations. The output of the Feed Forward layer has the same dimensionality as the input embeddings. A residual connection and Layer Normalization 1721 are applied after the Feed Forward layer.

The Encoder layers 1720 are stacked Nx times, where N is a hyperparameter that determines the depth of the Encoder. Each layer follows the same structure: Multi-Head Attention, Add & Norm, Feed Forward, and Add & Norm. By stacking multiple Encoder layers, the model can capture hierarchical and long-range dependencies in the input sequence. The output of the final Encoder layer represents the encoded input sequence, which is then passed to the Decoder for generating the output sequence.

The Decoder generates the output probabilities. It has a similar structure to the Encoder, with a few additions. The Decoder takes output embeddings and processes them through a stack of layers (represented as dashed box 1750). The output embedding layer 1730 takes the previous output tokens (shifted right by one position) and converts them into dense vectors. Each token is mapped to a learnable embedding vector of a fixed size. The embedding vectors capture semantic and syntactic relationships between tokens.

Positional encoding 1701 is added to the output embedding 1730 to provide position information to the model. Positional encoding 1701 may be added to the output embedding 1730 through a function 1740. Since the Transformer architecture does not have inherent recurrence or convolution, positional encodings help capture the order and relative positions of tokens. The positional encodings are typically sine and cosine functions of different frequencies, allowing the model to learn relative positions.

The masked multi-head attention 1751 mechanism prevents the model form attending to future tokens. This layer performs self-attention on the Decoder's input sequence. It allows the Decoder to attend to different parts of its own input sequence. The attention is "masked" to prevent the Decoder from attending to future tokens, ensuring that the predictions are based only on the previously generated tokens. Multi-head attention splits the input into multiple heads, allowing the model to attend different aspect of the input simultaneously.

After the masked multi-head attention, a residual connection is applied follows by layer normalization via add and norm 1752. The residual connection adds the input to the output of the attention layer, helping the model learn faster and deeper. Layer normalization normalizes the activations across the features, stabilizing the training process.

The multi-head attention 1753 layer performs attention between the Decoder's hidden states and the Encoder's output. It allows the Decoder to attend to relevant parts of the input sequence based on the Encoder's representations. The attention weights are computed based on the compatibility between the Decoder's hidden states and Encoder's outputs.

Another add and norm 1754 layer is then followed by feed forward network 1755. This a fully connected feed-forward network applied to each position of the Decoder's hidden states. It consists of two linear transformations with a Rectified Linear Unit (ReLU) activation in between. The feed forward layer helps the model capture non-linear interactions and increases the model's capacity.

Another add and norm 1756 layer is followed by linear 1760 and softmax 1770 layers. The final hidden states of the Decoder are passed through a linear transformation to project them into the vocabulary space. Vocabulary space refers to the set of all unique tokens or words that the model can generate or predict. In the context of language models, the vocabulary is a predefined set of tokens that the model is trained on and can output. When the Decoder's final hidden states are passed through a linear transformation, they are projected into a vector space with the same dimensionality as the size of the vocabulary. Each dimension in this space corresponds to a specific token in the vocabulary. For example, the model has a vocabulary of 10,000 unique tokens. The linear transformation would project the Decoder's hidden states into a 10,000-dimensional vector space. Each element in this vector represents the model's predicted probability or score for the corresponding token in the vocabulary.

A softmax function is applied to the projected values (vectors) to generate output probabilities over the vocabulary. The softmax function normalizes the values so that they sum up to 1, representing a probability distribution over the vocabulary. Each probability indicates the likelihood of a specific token being the next output token. The token with the highest probability is selected as the next output token. During the model's training, the objective is to maximize the probability of the correct next token given the input sequence and the previously generated tokens. The model learns to assign higher probabilities to the tokens that are more likely to appear based on the context. At inference time, the token with the highest probability in the vocabulary space is selected as the next output token. This process is repeated iteratively, with the generated token being fed back into the Decoder as input for the next step, until a stopping criterion is met (e.g., reaching a maximum length or generating an end-of-sequence token). The size and composition of the vocabulary can vary depending on the specific task and the data the model is trained on. It can include words, sub-words, or even characters, depending on the tokenization strategy used.

The decoder layers 1750 can be stacked Nx times, allowing the model to capture complex dependencies and generate coherent output sequences.

This transformer architecture allows the model to process input sequences, capture long-range dependencies, and generate output sequence based on the encoded input and the previously generated codewords.

There are at least three variations of transformer architecture that may enable an LCM. A first such variation comprises Auto-Encoding Models. In autoencoders, the decoder portion of the transformer is discarded after pre-training and only the encoder is used to generate the output. The popular BERT and RoBERTa models are examples of models based on this architecture and perform well on sentiment analysis and text classification. These types of models may be trained using a process called masked language modeling (MLM).

The primary goal of an autoencoder is to learn efficient representations of input data by encoding the data into a lower-dimensional space and then reconstructing the original data from the encoded representation. Autoencoders are trained in an unsupervised manner, meaning they don't require labeled data. They learn to capture the underlying structure and patterns in the input data without explicit guidance. An autoencoder consists of two main components: an encoder and a decoder. The encoder takes the input data and maps it to a lower-dimensional representation, often referred to as the latent space or bottleneck. The decoder takes the latent representation and tries to reconstruct the original input data. Autoencoders can be used for dimensionality reduction by learning a compressed representation of the input data in the latent space. The latent space has a lower dimensionality than the input data, capturing the most salient features or patterns. The training objective of an autoencoder is to minimize the reconstruction error between the original input and the reconstructed output. The model learns to encode and decode the data in a way that preserves the essential information needed for reconstruction. Variants and extensions of autoencoders can include denoising autoencoders, variational autoencoders (VAEs) which introduce a probabilistic approach to autoencoders wherein they learn a probabilistic encoder and decoder, allowing for generating new samples from the learned latent space, and conditional autoencoders which incorporate additional conditions or labels as input to the encoder and decoder, enabling the generation of samples conditioned on specific attributes.

Autoencoders can have various applications. Autoencoders can be used to detect anomalies by measuring the reconstruction error. Anomalous samples tend to have higher reconstruction errors compared to normal samples. Autoencoders can be used as a pre-training step to learn meaningful features from unlabeled data. The learned features can then be used for downstream tasks like classification or clustering. Additionally, or alternatively, autoencoders, particularly VAEs, can be used as generative models to generate new samples similar to the training data by sampling from the learned latent space. It's worth noting that while autoencoders can be effective for certain tasks, they have some limitations. They may struggle to capture complex dependencies and may generate blurry or less sharp reconstructions compared to other generative models like Generative Adversarial Networks (GANs).

Another type of variation is the auto-regressive model which feature the use of only the decoder portion of the transformer architecture. In autoregressive architectures, the decoder portion of the transformer is retained and the encoder portion is not used after model pre-training. Auto-regressive models are a class of models that generate outputs by predicting the next element based on the previously generated elements. In the context of the Transformer architecture and language modeling, auto-regressive models are commonly used for tasks such as text generation, machine translation, and language understanding.

Auto-regressive models generate outputs sequentially, one element at a time. In the case of language modeling, the model predicts the next word or token based on the previous words or tokens in the sequence. The prediction of the next element is conditioned on the previously generated elements. The model learns the conditional probability distribution $P(x\_t|x\_1, x\_2, \ldots, x\_\{t-1\})$, where $x\_t$ is the element at position t, and $x\_1, x\_2, \ldots, x\_\{t-1\}$ are the previously generated elements. The Transformer architecture, particularly the Decoder component, is well-suited for auto-regressive modeling. The Decoder generates the output sequence one element at a time, conditioned on the previously generated elements and the encoded input sequence from the Encoder. In the Transformer Decoder, the self-attention mechanism is masked to prevent the model from attending to future positions during training. This masking ensures that the model relies only on the previously generated elements to make predictions, following the auto-regressive property. During training, the Transformer Decoder uses a technique called teacher forcing. Instead of feeding the model's own predictions as input for the next step, the ground truth target sequence is used. This helps the model learn to generate the correct output sequence based on the input sequence and the previous target tokens. During inference or generation, the Transformer Decoder generates the output sequence one element at a time. At each step, the model takes the previously generated elements as input and predicts the next element. This process continues until a stopping criterion is met, such as reaching a maximum sequence length or generating an end-of-sequence token. Auto-regressive models, including the Transformer, have achieved state-of-the-art performance in language modeling tasks. They excel at capturing the statistical properties and dependencies in sequential data, making them effective for generating coherent and fluent text.

While text generation is the most suitable use case of auto-regressors, they perform exceptionally well on a wide variety of tasks. Most modern LLMs are auto-regressors including, for example, the popular GPT series of LLMs, BERT, and XLNet.

The third variation of the transformer model is the sequence-to-sequence model which utilizes both the encoder and decoder portions of the transformer and can be trained in multiple ways. One of the methods is span corruption and reconstruction. These models are, generally, best suited for language translation. The T5 and BART family of models are examples of sequence-to-sequence models.

Figure 18:
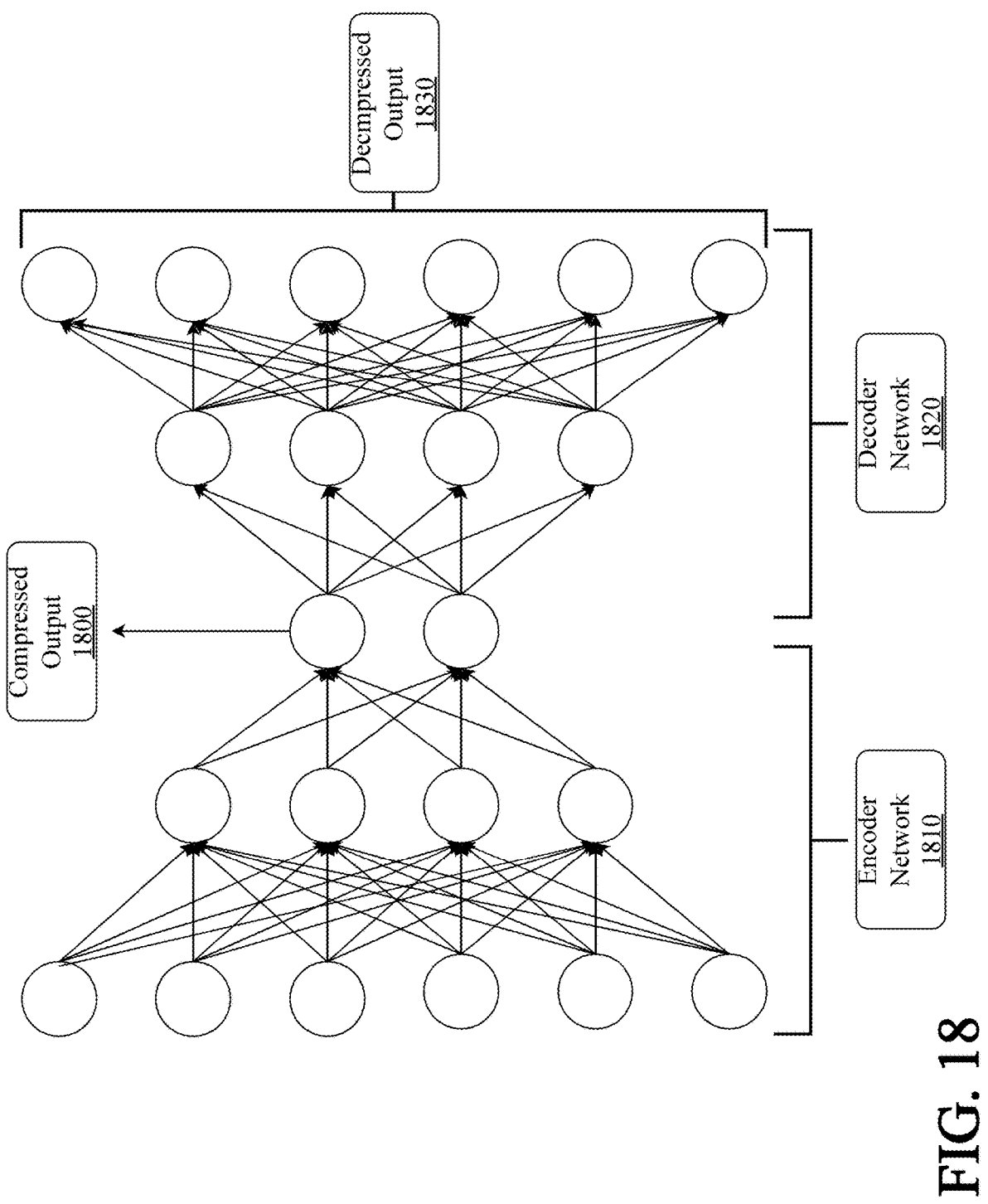
FIG. 18 is a block diagram illustrating an embodiment of the system and method for a large codeword model for deep learning, where the machine learning core is a VAE-based core.

FIG. 18 is a block diagram illustrating an embodiment of the system and method for a large codeword model for deep learning, where the machine learning core is a VAE-based core. An autoencoder network comprises an encoder network 1810 or a decoder network 1820 that work together to encode and decode data effectively. The encoder network 1810 and decoder network 1820 within the autoencoder network is comprised of a plurality of layers that contribute to the encoding and decoding process. These layers include, but are not limited to, convolutional layers, pooling layers, and a bottleneck layer. Some embodiments also include functions that operate on information including but not limited to rectified linear unit functions, sigmoid functions, and skip connections.

The convolutional layers are responsible for extracting meaningful features from the input data. They apply convolutional operations using learnable filters to capture spatial patterns and hierarchical representations of the data. The convolutional layers can have different numbers of filters, kernel sizes, and strides to capture features at various scales and resolutions. Skip connections are employed to facilitate the flow of information across different layers of the auto-encoder. Skip connections allow the output of a layer to be directly added to the output of a subsequent layer, enabling the network to learn residual mappings and mitigate the vanishing gradient problem. Skip connections help in preserving fine-grained details and improving the training stability of the autoencoder.

Pooling layers are used to downsample the feature maps generated by the convolutional layers. They reduce the spatial dimensions of the feature maps while retaining the most salient information. Common pooling operations include but are not limited to max pooling and average pooling. Pooling layers help in achieving translation invariance, reducing computational complexity, and controlling the receptive field of the autoencoder. Rectified Linear Unit (ReLU) functions introduce non-linearity into the autoencoder by applying a ReLU activation function element-wise to the output of the previous layer. ReLU functions help in capturing complex patterns and relationships in the data by allowing the network to learn non-linear transformations. They also promote sparsity and alleviate the vanishing gradient problem. The bottleneck layer represents the most compressed representation of the input data. The bottleneck layer has a significantly reduced dimensionality compared to the input and output layers of the autoencoder. It forces the network to learn a compact and meaningful encoding of the data, capturing the essential features and discarding redundant information. In one embodiment, the multi-layer auto-encoder network is comprised of a plurality of the previously mentioned layers where the sequence and composition of the layers may vary depending on a user's preferences and goals. The bottleneck layer is where the compressed output 1800 is created. Each layer previous to the bottleneck layer creates a more and more compressed version of the original input. The layers after the bottleneck layer represent the decoder network 1830 where a plurality of layers operate on a compressed input to decompress a data set. Decompression results in a version of the original input which is largely similar but has some lost data from the transformations.

Figure 19:
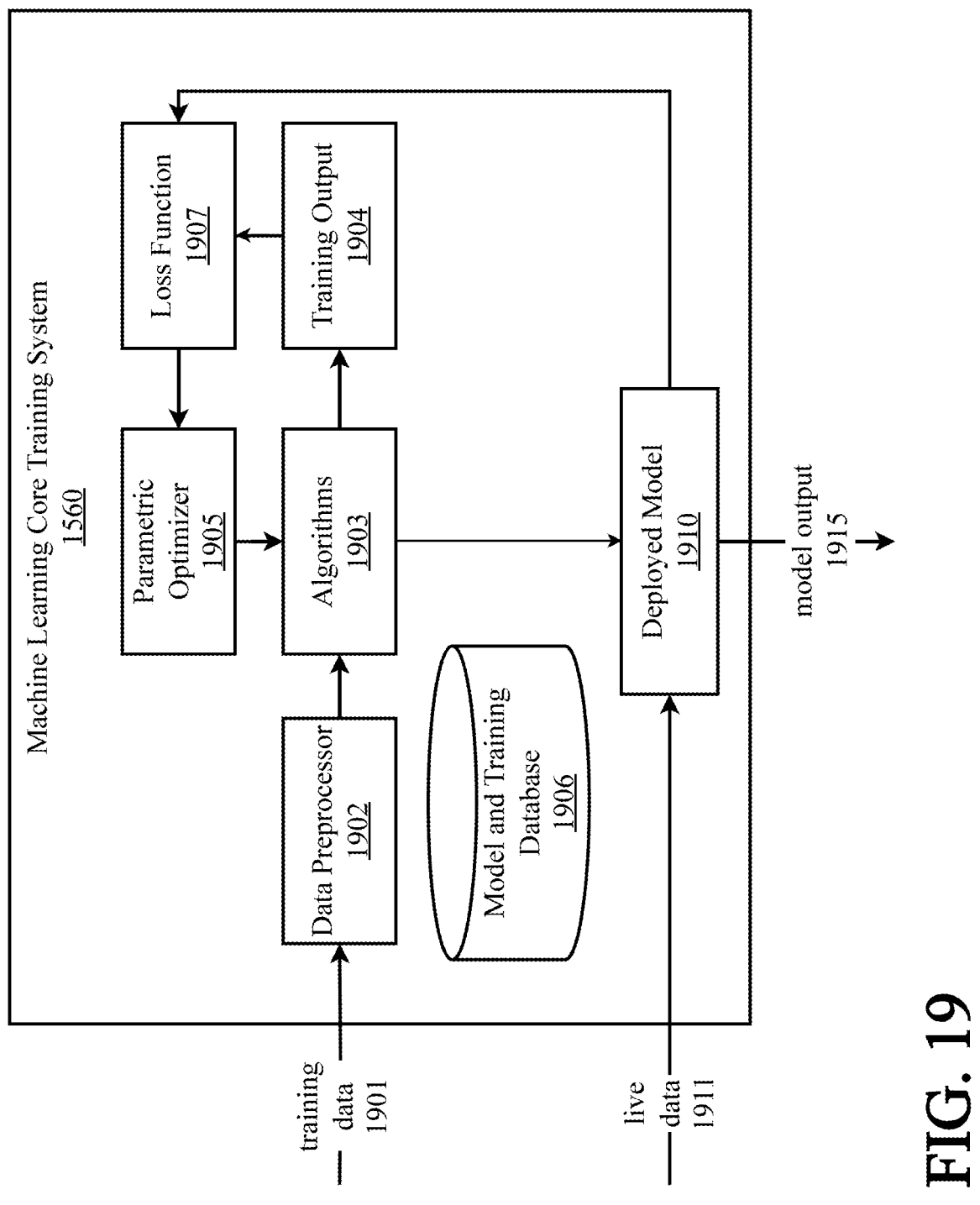
FIG. 19 is a block diagram illustrating an aspect of system and method for a large codeword model for deep learning, a machine learning core training system.

FIG. 19 is a block diagram illustrating an aspect of system and method for a large codeword model for deep learning, a machine learning core training system. According to the embodiment, the machine learning core training system 1560 may comprise a model training stage comprising a data preprocessor 1902, one or more machine and/or deep learning algorithms 1903, training output 1904, and a parametric optimizer 1905, and a model deployment stage comprising a deployed and fully trained model 1910 configured to perform tasks described herein such as processing codewords through a large codeword model. The machine learning core training system 1560 may be used to train and deploy a plurality of machine learning architectures in order to support the services provided by the large codeword model for deep learning.

At the model training stage, a plurality of training data 1901 may be received by the generative AI training system 1950. Data preprocessor 1902 may receive the input data (e.g., codewords, sourceblocks) and perform various data preprocessing tasks on the input data to format the data for further processing. For example, data preprocessing can include, but is not limited to, tasks related to data cleansing, data deduplication, data normalization, data transformation, handling missing values, feature extraction and selection, mismatch handling, and/or the like. Data preprocessor 1902 may also be configured to create training dataset, a validation dataset, and a test set from the plurality of input data 1901. For example, a training dataset may comprise 80% of the preprocessed input data, the validation set 10%, and the test dataset may comprise the remaining 10% of the data. The preprocessed training dataset may be fed as input into one or more machine and/or deep learning algorithms 1903 to train a predictive model for object monitoring and detection.

During model training, training output 1904 is produced and used to measure the accuracy and usefulness of the predictive outputs. During this process a parametric optimizer 1905 may be used to perform algorithmic tuning between model training iterations. Model parameters and hyperparameters can include, but are not limited to, bias, train-test split ratio, learning rate in optimization algorithms (e.g., gradient descent), choice of optimization algorithm (e.g., gradient descent, stochastic gradient descent, of Adam optimizer, etc.), choice of activation function in a neural network layer (e.g., Sigmoid, ReLu, Tanh, etc.), the choice of cost or loss function the model will use, number of hidden layers in a neural network, number of activation unites in each layer, the drop-out rate in a neural network, number of iterations (epochs) in a training the model, number of clusters in a clustering task, kernel or filter size in convolutional layers, pooling size, batch size, the coefficients (or weights) of linear or logistic regression models, cluster centroids, and/or the like. Parameters and hyperparameters may be tuned and then applied to the next round of model training. In this way, the training stage provides a machine learning training loop.

In some implementations, various accuracy metrics may be used by the machine learning core training system 1560 to evaluate a model's performance. Metrics can include, but are not limited to, word error rate (WER), word information loss, speaker identification accuracy (e.g., single stream with multiple speakers), inverse text normalization and normalization error rate, punctuation accuracy, timestamp accuracy, latency, resource consumption, custom vocabulary, sentence-level sentiment analysis, multiple languages supported, cost-to-performance tradeoff, and personal identifying information/payment card industry redaction, to name a few. In one embodiment, the system may utilize a loss function 1907 to measure the system's performance. The loss function 1907 compares the training outputs with an expected output and determined how the algorithm needs to be changed in order to improve the quality of the model output. During the training stage, all outputs may be passed through the loss function 1907 on a continuous loop until the algorithms 1903 are in a position where they can effectively be incorporated into a deployed model 1915.

The test dataset can be used to test the accuracy of the model outputs. If the training model is establishing correlations that satisfy a certain criterion such as but not limited to quality of the correlations and amount of restored lost data, then it can be moved to the model deployment stage as a fully trained and deployed model 1910 in a production environment making predictions based on live input data 1911 (e.g., interest factor data, incentive data). Further, model correlations and restorations made by deployed model can be used as feedback and applied to model training in the training stage, wherein the model is continuously learning over time using both training data and live data and predictions. A model and training database 1906 is present and configured to store training/test datasets and developed models. Database 1906 may also store previous versions of models.

According to some embodiments, the one or more machine and/or deep learning models may comprise any suitable algorithm known to those with skill in the art including, but not limited to: LLMs, generative transformers, transformers, supervised learning algorithms such as: regression (e.g., linear, polynomial, logistic, etc.), decision tree, random forest, k-nearest neighbor, support vector machines, Naïve-Bayes algorithm; unsupervised learning algorithms such as clustering algorithms, hidden Markov models, singular value decomposition, and/or the like. Alternatively, or additionally, algorithms 1903 may comprise a deep learning algorithm such as neural networks (e.g., recurrent, convolutional, long short-term memory networks, etc.).

In some implementations, the machine learning core training system 1560 automatically generates standardized model scorecards for each model produced to provide rapid insights into the model and training data, maintain model provenance, and track performance over time. These model scorecards provide insights into model framework(s) used, training data, training data specifications such as chip size, stride, data splits, baseline hyperparameters, and other factors. Model scorecards may be stored in database(s) 1906.

Figure 20A:
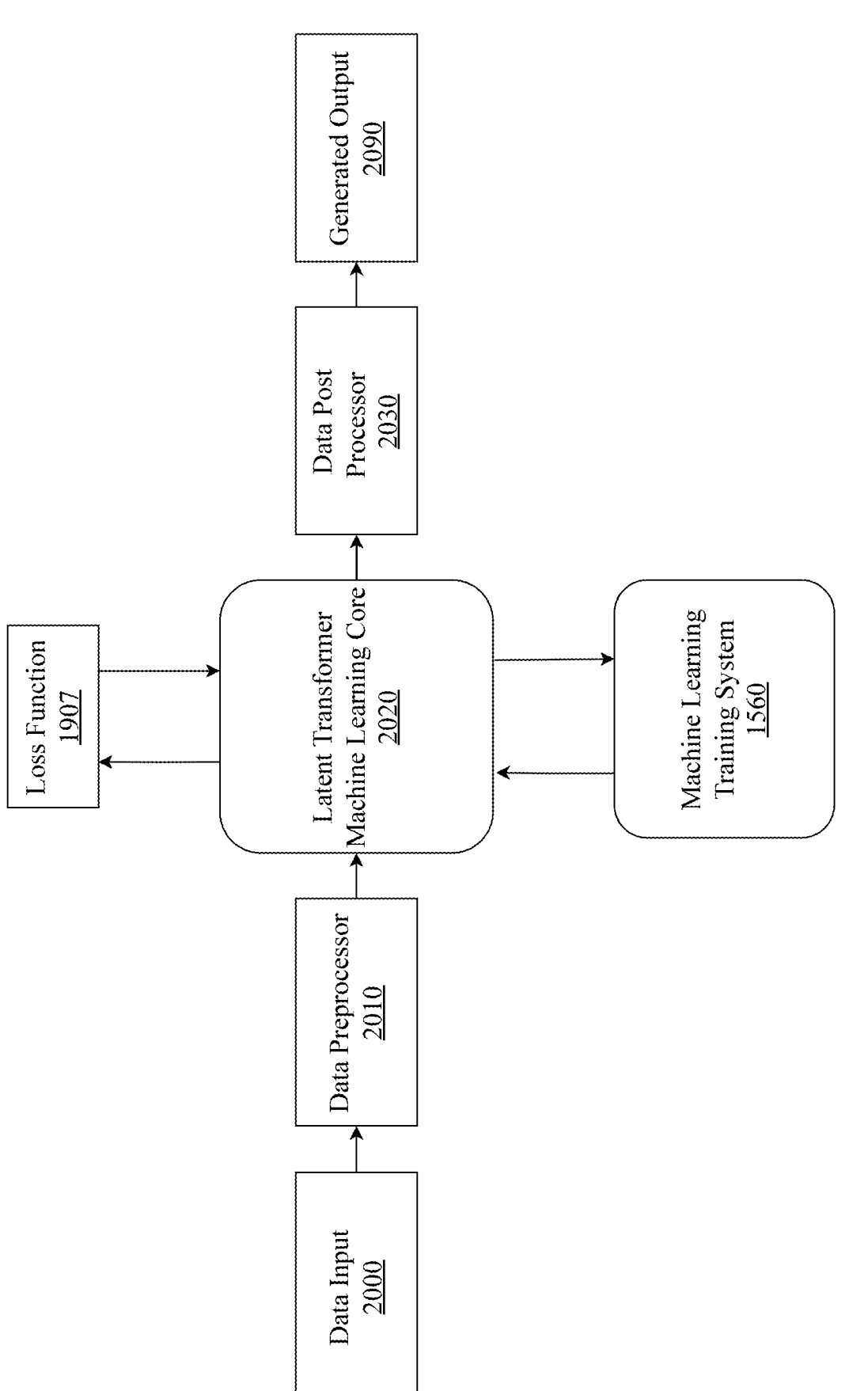
FIG. 20A is a block diagram illustrating an exemplary system architecture for a latent transformer core for a large codeword model.

FIG. 20A is a block diagram illustrating an exemplary system architecture for a Latent Transformer core for a Large Codeword Model. The attached figure presents a streamlined view of the Latent Transformer Large Codeword Model (LCM) system, focusing on the core components and their interactions. This simplified representation highlights the essential elements of the system and illustrates the flow of data from input to output, along with the training process that enables the system to learn and generate meaningful results.

The system is fed a data input 2000, which represents the raw data that needs to be processed and analyzed. This data can come from various sources and domains, such as time series, text, images, or any other structured or unstructured format. The data input 2000 is fed into a data preprocessor 2010, which is responsible for cleaning, transforming, and preparing the data for further processing. The data preprocessor 2010 may perform tasks such as normalization, feature scaling, missing value imputation, or any other necessary preprocessing steps to ensure the data is in a suitable format for the machine learning core 2020.

Once the data is preprocessed, it is passed to a latent transformer machine learning core 2020. The machine learning core 2020 employs advanced techniques such as self-attention mechanisms and multi-head attention to learn the intricate patterns and relationships within the data. It operates in a latent space, where the input data is encoded into a lower-dimensional representation that captures the essential features and characteristics. By working in this latent space, the machine learning core 2020 can efficiently process and model the data, enabling it to generate accurate and meaningful outputs.

The generated outputs from the machine learning core 2020 are then passed through a data post processor 2030. The data post processor 2030 is responsible for transforming the generated outputs into a format that is suitable for the intended application or user. It may involve tasks such as denormalization, scaling back to the original data range, or any other necessary post-processing steps to ensure the outputs are interpretable and usable.

The processed outputs are provided as a generated output 2090, which represents the final result of the latent transformer LCM system. The generated output 2090 can take various forms, depending on the specific task and domain. It could be predicted values for time series forecasting, generated text for language modeling, synthesized images for computer vision tasks, or any other relevant output format.

To train and optimize the latent transformer machine learning core 2020, the system includes a machine learning training system 1560. The training system 1560 is responsible for updating the parameters and weights of the machine learning core 2020 based on the observed performance and feedback. The training system 1560 outputs from the machine learning core 2020 and processes the outputs to be reinserted back through the machine learning core 2020 as a testing and training data set. After processing the testing and training data set, the machine learning core 2020 may output a testing and training output data set. This output may be passed through a loss function 1907. The loss function 1907 may be employed to measure the discrepancy between the generated outputs and the desired outcomes. The loss function 1907 quantifies the error or dissimilarity between the predictions and the ground truth, providing a signal for the system to improve its performance.

The training process is iterative, where the system generates outputs, compares them to the desired outcomes using the loss function 1907, and adjusts the parameters of the machine learning core 2020 accordingly.

Through the iterative training process, the latent transformer machine learning core 2020 learns to capture the underlying patterns and relationships in the data, enabling it to generate accurate and meaningful outputs. The training process aims to minimize the loss and improve the system's performance over time, allowing it to adapt and generalize to new and unseen data.

Figure 20B:
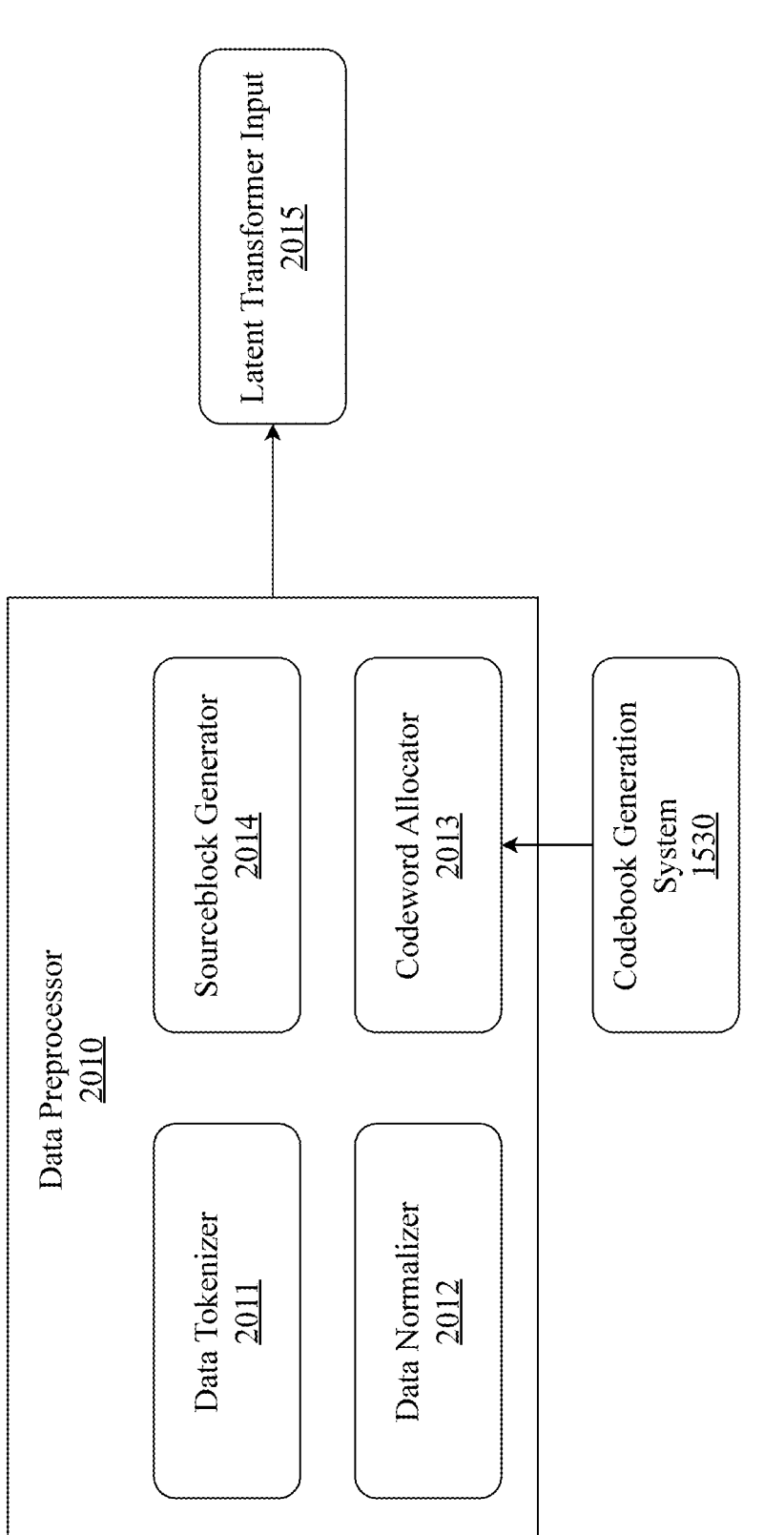
FIG. 20B is a block model illustrating an aspect of a system for a large codeword model for deep learning, a data preprocessor.

FIG. 20B is a block model illustrating an aspect of a system for a large codeword model for deep learning, a data preprocessor. The data preprocessor 2010 plays a role in preparing the input data for further processing by the latent transformer machine learning core 2020. It consists of several subcomponents that perform specific preprocessing tasks, ensuring that the data is in a suitable format and representation for effective learning and generation.

The data preprocessor 2010 receives the raw input data and applies a series of transformations and operations to clean, normalize, and convert the data into a format that can be efficiently processed by the subsequent components of the system. The preprocessing pipeline include but is not limited to subcomponents such as a data tokenizer, a data normalizer, a codeword allocator, and a sourceblock generator. A data tokenizer 2011 is responsible for breaking down the input data into smaller, meaningful units called tokens. The tokenization process varies depending on the type of data being processed. For textual data, the tokenizer may split the text into individual words, subwords, or characters. For time series data, the tokenizer may divide the data into fixed-length windows or segments. The goal of tokenization is to convert the raw input into a sequence of discrete tokens that can be further processed by the system.

A data normalizer 2012 is responsible for scaling and normalizing the input data to ensure that it falls within a consistent range. Normalization techniques, such as min-max scaling or z-score normalization, are applied to the data to remove any biases or variations in scale. Normalization helps in improving the convergence and stability of the learning process, as it ensures that all features or dimensions of the data contribute equally to the learning algorithm. A codeword allocator 2013 assigns unique codewords to each token generated by the data tokenizer 2011. Additionally, codewords may be directly assigned to sourceblocks that are generated from inputs rather than from tokens. The codewords are obtained from a predefined codebook, which is generated and maintained by the codebook generation system 1530. The codebook contains a mapping between the tokens and their corresponding codewords, enabling efficient representation and processing of the data. The codeword allocator 2013 replaces each token, sourceblock, or input with its assigned codeword, creating a compressed and encoded representation of the input data.

A sourceblock generator 2014 combines the codewords assigned by the codeword allocator 113 into larger units called sourceblocks. sourceblocks are formed by grouping together a sequence of codewords based on predefined criteria, such as a fixed number of codewords or semantic coherence. The formation of sourceblocks helps in capturing higher-level patterns and relationships within the data, as well as reducing the overall sequence length for more efficient processing by the latent transformer machine learning core 2020.

A codebook generation system 2040 is a component that works in conjunction with the data preprocessor 2010. It is responsible for creating and maintaining the codebook used by the codeword allocator 2013. The codebook is generated based on the statistical properties and frequency of occurrence of the tokens in the training data. It aims to assign shorter codewords to frequently occurring tokens and longer codewords to rare tokens, optimizing the compression and representation of the data.

After the data has undergone the preprocessing steps performed by the data preprocessor 2010, the resulting output is the latent transformer input 2015. The latent transformer input 2015 represents the preprocessed and encoded data that is ready to be fed into the latent transformer machine learning core 2020 for further processing and learning.

When dealing with time series prediction, the codeword allocator 2013 may take a sequence of time series data points as input. In one example the input sequence consists of 1000 data points. The codeword allocator 2013 performs the necessary data preparation steps to create a suitable input vector for the autoencoder. It truncates the last 50 data points from the input sequence, resulting in a sequence of 950 elements. This truncated sequence represents the historical data that will be used to predict the future values. The codeword allocator 2013 then creates a 1000-element vector, where the first 950 elements are the truncated sequence, and the last 50 elements are filled with zeros. This input vector serves as the input to the variational autoencoder encoder subsystem 2050, which compresses the data into a lower-dimensional latent space representation.

By performing this data preparation step, the codeword allocator 2013 ensures that the input data is in a format that is compatible with the autoencoder's training process. During training, the autoencoder learns to reconstruct the complete 1000-element sequence from the truncated input vector. By setting the last 50 elements to zero, the autoencoder is forced to learn the patterns and dependencies in the historical data and use that information to predict the missing values. This approach enables the Latent Transformer LCM system to effectively handle time series prediction tasks by leveraging the power of autoencoders and the compressed latent space representation.

The codeword allocator 2013 may split the incoming data input 2000 meaningful units called sourceblocks. This process, known as semantic splitting, aims to capture the inherent structure and patterns in the data. The allocator 2013 may employ various techniques to identify the optimal sourceblocks, such as rule-based splitting, statistical methods, or machine learning approaches. In one embodiment, the codeword allocator 2013 may utilize Huffman coding to split the data into sourceblocks. The Huffman coding-based allocator enables efficient and semantically meaningful splitting of the input data into sourceblocks. Huffman coding is a well-known data compression algorithm that assigns variable-length codes to symbols based on their frequency of occurrence. In the context of the LCM, the Huffman coding-based allocator adapts this principle to perform semantic splitting of the input data.

With Huffman coding, the allocator 2013 starts by analyzing the input data and identifying the basic units of meaning, such as words, phrases, or subwords, depending on the specific data modality and the desired level of granularity. This process may not be necessary for numerical or time series data sets. These basic units form the initial set of sourceblocks. The codeword allocator 130 then performs a frequency analysis of the sourceblocks, counting the occurrences of each sourceblock in the input data. Based on the frequency analysis, the allocator 2013 constructs a Huffman tree, which is a binary tree that represents the probability distribution of the sourceblocks. The Huffman tree is built by iteratively combining the two least frequent sourceblocks into a single node, assigning binary codes to the branches, and repeating the process until all sourceblocks are included in the tree. The resulting Huffman tree has the property that sourceblocks with higher frequencies are assigned shorter codes, while sourceblocks with lower frequencies are assigned longer codes.

The Huffman coding-based codeword allocator 2013 then uses the constructed Huffman tree to perform semantic splitting of the input data. It traverses the input data and matches the sequences of symbols against the sourceblocks represented in the Huffman tree. When a sourceblock is identified, the allocator 2013 assigns the corresponding Huffman code to that sourceblock, effectively compressing the data while preserving its semantic structure. The use of Huffman coding for semantic splitting offers several advantages. It allows for variable-length sourceblocks, enabling the codeword allocator 2013 to capture meaningful units of varying sizes. This is particularly useful for handling data with different levels of complexity and granularity, such as text with compound words or images with hierarchical structures.

After the sourceblock generation process, the codeword allocator 2013 assigns a unique codeword to each sourceblock. The codewords are discrete, compressed representations of the sourceblocks, designed to capture the essential information in a compact form. The codeword allocator can use various mapping schemes to assign codewords to sourceblocks, such as hash functions, lookup tables, or learned mappings. For example, a simple approach could be to use a hash function that maps each sourceblock to a fixed-length binary code. Alternatively, another approach may involve learning a mapping function that assigns codewords based on the semantic similarity of the sourceblocks.

The codebook generation subsystem 1530 is responsible for creating and maintaining the codebook, which is a collection of all the unique codewords used by the LCM. The codebook can be generated offline, before the actual processing begins, or it can be updated dynamically as new sourceblocks are encountered during processing. The codebook generation subsystem can use various techniques to create a compact and efficient codebook, such as frequency-based pruning, clustering, or vector quantization. The size of the codebook can be adjusted based on the desired trade-off between compression and information preservation. Going back to the War and Peace example, the string of sourceblocks ['Well', ',', 'Prince', ',', 'so', 'Gen', 'oa', 'and', 'Luc', 'ca', 'are', 'now', 'just', 'family', 'estates', 'of', 'the', 'Buon', 'apar', 'tes', '.'] may be given codewords such as [12, 5, 78, 5, 21, 143, 92, 8, 201, 45, 17, 33, 49, 62, 87, 11, 2, 179, 301, 56, 4], where each sourceblock is assigned a unique codeword, which is represented as an integer. The mapping between tokens and codewords is determined by the codebook generated by the LCM system.

Once the input data is allocated codewords, it is passed through the variational autoencoder encoder subsystem 2050. This subsystem utilizes a VAE encoder to compress the codewords into a lower-dimensional latent space representation. The VAE encoder learns to capture the essential features and variations of the input data, creating compact and informative latent space vectors. The machine learning training system 1560 is responsible for training the VAE encoder using appropriate objective functions and optimization techniques.

The latent space vectors generated by the VAE encoder are then fed into the latent transformer subsystem 2070. This subsystem is a modified version of the traditional transformer architecture, where the embedding and positional encoding layers are removed. By operating directly on the latent space vectors, the Latent Transformer can process and generate data more efficiently, without the need for explicit embedding or positional information. The transformer training system is used to train the Latent Transformer, leveraging techniques such as self-attention and multi-head attention to capture dependencies and relationships within the latent space.

The Latent Transformer comprises of several key components. Latent space vectors may be passed directly through a multi-head attention mechanism. The multi-head attention mechanism, which is the core building block of the Transformer, allows the model to attend to different parts of the input sequence simultaneously, capturing complex dependencies and relationships between codewords. Feed-forward networks are used to introduce non-linearity and increase the expressive power of the model. Residual connections and layer normalization are employed to facilitate the flow of information and stabilize the training process.

The Latent Transformer-based core can be implemented using an encoder-decoder architecture. The encoder processes the input codewords and generates contextualized representations, while the decoder takes the encoder's output and generates the target codewords or the desired output sequence. The encoder and decoder are composed of multiple layers of multi-head attention and feed-forward networks, allowing for deep and expressive processing of the codeword representations.

One of the key advantages of the Transformer in the LCM architecture is its ability to capture long-range dependencies between codewords. Unlike recurrent neural networks (RNNs), which process the input sequentially, the Transformer can attend to all codewords in parallel, enabling it to effectively capture relationships and dependencies that span across the entire input sequence. This is useful for processing long and complex data sequences, where capturing long-range dependencies is crucial for understanding the overall context. Another advantage of the Transformer-based core is its parallelization capability. The self-attention mechanism in the Transformer allows for efficient parallel processing of the codewords on hardware accelerators like GPUs. This parallelization enables faster training and inference times, making the LCM architecture suitable for processing large amounts of data in real-time applications.

The Latent Transformer-based core also generates contextualized representations of the codewords, where each codeword's representation is influenced by the surrounding codewords in the input sequence. This contextualization allows the model to capture the semantic and syntactic roles of the codewords based on their context, enabling a deeper understanding of the relationships and meanings within the data. The scalability of the Transformer-based core is another significant advantage in the LCM architecture. By increasing the number of layers, attention heads, and hidden dimensions, the Transformer can learn more complex patterns and representations from large-scale datasets. This scalability has been demonstrated by models like GPT-3, which has billions of parameters and can perform a wide range of tasks with impressive performance.

After being processed by the Latent Transformer, the latent space vectors are passed through the Variational Autoencoder Decode Subsystem 2080. The VAE decoder takes the processed latent vectors and reconstructs the original data or generates new data based on the learned representations. The machine learning training subsystem 1560 is responsible for training the VAE decoder to accurately reconstruct or generate data from the latent space. In some embodiments, the Decode Subsystem 2080 may be used to create time series predictions about a particular data input.

The reconstructed or generated data is then output 2090, which can be in the same format as the original input data or in a different modality altogether. This flexibility allows the Latent Transformer LCM to handle various tasks, such as data compression, denoising, anomaly detection, and data generation, across multiple domains.

Moreover, the modular design of the system enables each subsystem to be trained independently or jointly, depending on the specific requirements and available resources. The machine learning training system 1560 may provide the necessary mechanisms to optimize the performance of each component and ensure the overall effectiveness of the Latent Transformer LCM.

Figure 20C:
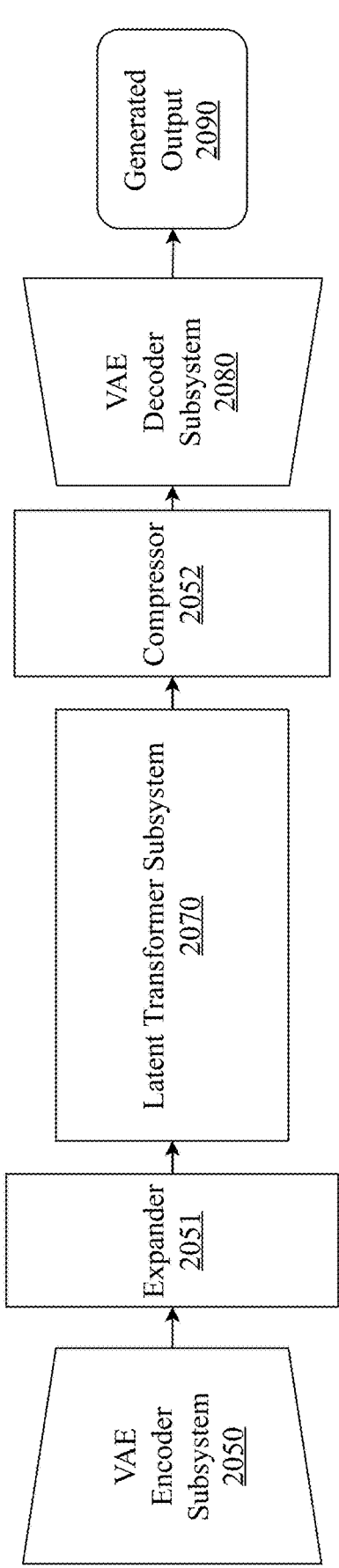
FIG. 20C is a block model illustrating an aspect of a system for a large codeword model for deep learning, a latent transformer machine learning core.

FIG. 20C is a block model illustrating an aspect of a system for a large codeword model for deep learning, a latent transformer machine learning core. At the heart of the system is a Latent Transformer Subsystem 2070, which serves as the central processing unit responsible for learning the underlying patterns, relationships, and dependencies within the input data. The Latent Transformer Subsystem 2070 leverages advanced techniques such as self-attention mechanisms and multi-head attention to capture the complex interactions and sequences in the data, enabling it to generate accurate and context-aware outputs.

The input to the Latent Transformer Subsystem 2070 is provided by a VAE Encoder Subsystem 2050. The VAE Encoder Subsystem 2050 is responsible for encoding the preprocessed input data into a lower-dimensional latent space representation. An input is passed through the VAE Encoder Subsystem 2050, which learns to compress the data into a compact latent space representation while preserving the essential features and characteristics of the input. Latent space vectors produced by the VAE Encoder Subsystem 2050 may be further processed by an expander 151, which increases the dimensionality of the input data to a point where the vectors can be efficiently processed by the Latent Transformer Subsystem 2070.

The latent space representation generated by the VAE Encoder Subsystem 2050 serves as the input to the Latent Transformer Subsystem 1200. The Latent Transformer Subsystem 2070 operates in this latent space, leveraging the compressed and informative representation to learn the complex patterns and relationships within the data. By working in the latent space, the Latent Transformer Subsystem 2070 can efficiently process and model the data, capturing the intricate dependencies and generating accurate and meaningful outputs.

Once the Latent Transformer Subsystem 2070 has processed the latent space representation, the generated output is passed through the VAE Decoder Subsystem 2080. The VAE Decoder Subsystem 2080 is responsible for decoding the latent space representation back into the original data space. Prior to processing by the VAE Decoder Subsystem 2080, Latent Transformer In some implementations, subsystem outputs may be compressed back to an original size before being processed by the (optional) expander 2051 by being processed by an (optional) compressor 2052. The VAE Decoder Subsystem 2080 learns to reconstruct the original data from the latent space representation, ensuring that the generated output is coherent and meaningful.

The reconstructed output from the VAE Decoder Subsystem 2080 is provided as the generated output 2090. The generated output 1200 represents the final result of the Latent Transformer LCM system, which can take various forms depending on the specific task and domain. It could be predicted values for time series forecasting, generated text for language modeling, synthesized images for computer vision tasks, or any other relevant output format.

The VAE Encoder Subsystem 2050 and VAE Decoder Subsystem 2080 play large roles in the overall functioning of the Latent Transformer LCM system. The VAE Encoder Subsystem 2050 enables the system to learn a compressed and informative representation of the input data in the latent space, while the VAE Decoder Subsystem 2080 ensures that the generated output is coherent and meaningful by reconstructing it back into the original data space. The combination of these subsystems allows the Latent Transformer Subsystem 2070 to focus on learning the complex patterns and relationships within the data, leading to accurate and context-aware outputs.

The specific architectures and parameters of the VAE Encoder Subsystem 2050, Latent Transformer Subsystem 2070, and VAE Decoder Subsystem 2080 can be customized and adapted based on the characteristics and requirements of the input data and the specific task at hand. The modular design of the system allows for flexibility and extensibility, enabling the integration of different architectures, attention mechanisms, and training techniques to optimize the performance and efficiency of the Latent Transformer LCM system.

Figure 20D:
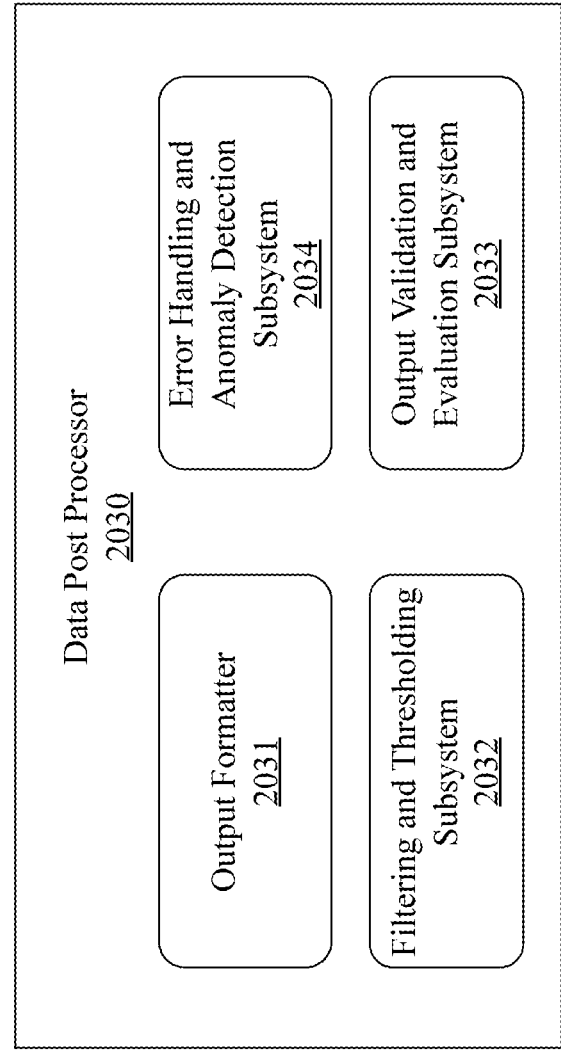
FIG. 20D is a block model illustrating an aspect of a system for a large codeword model for deep learning, a data post processor.

FIG. 20D is a block model illustrating an aspect of a system for a large codeword model for deep learning, a data post processor. The data post processor 2030 receives the generated output from the Latent Transformer Machine Learning Core 2020 and applies a series of transformations and operations to adapt it to the desired format and characteristics. The post-processing system may include, but is not limited to an output formatter, a filtering and thresholding subsystem, an output validation and evaluation subsystem, and an error handling and anomaly detection subsystem.

An output formatter 2031 is responsible for converting the generated output into a specific format required by the application or user. It applies formatting rules and conventions to enhance the readability, coherence, and usability of the generated output. For example, in the case of generated text, the output formatter 2031 may apply capitalization, punctuation, or line breaks to improve the clarity and structure of the text. In the case of generated time series data, the output formatter 2031 may convert the values into the desired unit of measurement or apply specific formatting conventions to ensure consistency with the expected output format.

A filtering and thresholding subsystem 2032 applies specific criteria or thresholds to filter or select the most relevant or reliable generated outputs. It helps to refine the generated output based on predefined rules, constraints, or user preferences. For example, in a recommendation system, the filtering and thresholding subsystem 2032 may filter out generated recommendations that fall below a certain relevance threshold or exclude items that have already been recommended to the user. This subsystem ensures that only the most pertinent and valuable outputs are presented to the user or passed on for further processing.

An output validation and evaluation subsystem 2033 assesses the quality and performance of the generated output against predefined metrics or ground truth data. It applies validation techniques to ensure that the generated output meets the expected criteria and conforms to the desired characteristics. This subsystem may include automatic evaluation methods, such as calculating similarity scores, perplexity, or domain-specific metrics, to measure the accuracy, coherence, or effectiveness of the generated output. By continuously monitoring and evaluating the generated output, the output validation and evaluation subsystem 2033 provides valuable insights for model improvement and fine-tuning.

An error handling and anomaly detection subsystem 2034 identifies and handles any errors, anomalies, or unexpected patterns in the generated output. It incorporates techniques for detecting and correcting syntactic or semantic errors, identifying out-of-distribution samples, or flagging potential issues that require human intervention. This subsystem plays a critical role in maintaining the quality and reliability of the generated output by proactively identifying and addressing any problems or inconsistencies. It helps to prevent the propagation of errors downstream and ensures that the generated output is trustworthy and dependable.

The data post processor 2030 works seamlessly with the other components of the Latent Transformer LCM system to deliver high-quality and reliable generated outputs. It receives the generated output from the Latent Transformer Machine Learning Core 2020, which has learned the underlying patterns, relationships, and dependencies within the input data. The post-processing subsystems within the data post processor 2030 then refine, format, validate, and ensure the quality of the generated output, making it suitable for the intended application or user.

The specific configuration and parameters of each subsystem within the Data Post Processor 130 can be customized and adapted based on the requirements of the application domain and the nature of the generated output. The modular design of the post-processor allows for the integration of additional subsystems or the modification of existing ones to meet the specific needs of the task at hand.

Figure 21:
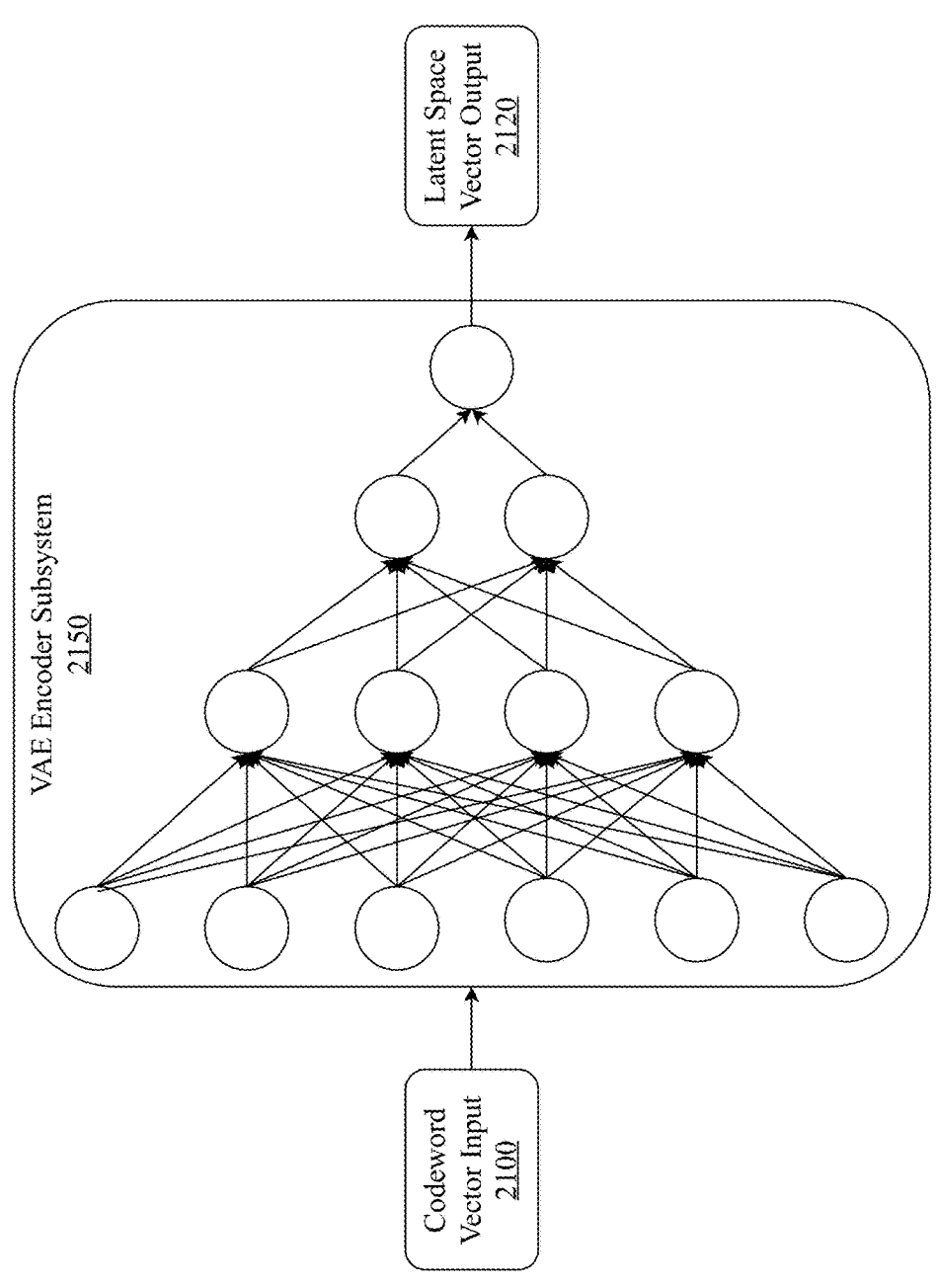
FIG. 21 is a block diagram illustrating a component of the system for a latent transformer core for a large codeword model, a variational autoencoder encoder subsystem.

FIG. 21 is a block diagram illustrating a component of the system for a latent transformer core for a large codeword model, a variational autoencoder encoder subsystem. A VAE Encode Subsystem is responsible for compressing the input codeword vectors into a lower-dimensional latent space representation, enabling efficient processing and data generation.

The VAE Encoder Subsystem 2150 takes a codeword vector input 2100 as its input. This codeword vector is generated by the codeword allocator 2013, which converts the raw input data into a sequence of codewords based on the codebook maintained by the codebook generation subsystem 1530. The codeword vector represents the input data in a compact and discrete form, capturing the essential information and structure of the original data. Inside the VAE Encode Subsystem 2150, the codeword vector input 2100 undergoes a series of transformations to map it into the latent space. The encoder architecture typically consists of multiple layers of neural networks, such as fully connected layers or convolutional layers, depending on the nature of the input data.

A layer of the encoder takes the codeword vector and applies a linear transformation to project it into a higher-dimensional space. This transformation is learned during the training process and helps to capture the complex patterns and relationships within the input data. The output of this layer may be passed through a non-linear activation function, such as the rectified linear unit (ReLU), to introduce non-linearity and enhance the representational power of the encoder.

As the codeword vector input 2100 progresses through the subsequent layers of the encoder, the dimensionality of the representation is gradually reduced. Each layer applies a linear transformation followed by a non-linear activation function, allowing the encoder to learn hierarchical features and abstract representations of the input data.

The VAE Encoder Subsystem 2150 in the Latent Transformer LCM system can be trained independently or jointly with the other machine learning components, such as the Latent Transformer Subsystem 2070 and the VAE Decoder Subsystem 2080. The flexibility in training allows for optimizing the VAE encoder based on specific requirements and available resources. When trained individually, the VAE encoder can focus on learning the optimal compression and representation of the input codeword vectors in the latent space. The Encoder Training System is responsible for updating the encoder's parameters using techniques like gradient descent and backpropagation, minimizing the reconstruction loss and the KL divergence. Individual training enables the encoder to specialize in mapping the input data to a meaningful latent space representation.

On the other hand, joint training of the VAE encoder 2150 with the Latent Transformer 2070 and VAE decoder 2080 allows for end-to-end optimization of the entire system. By training all components simultaneously, the VAE encoder 2150 can learn to generate latent space vectors that are well-suited for processing by the Latent Transformer and decoding by the VAE decoder 2080. Joint training enables the system to capture the dependencies and interactions between the different components, leading to improved overall performance. However, joint training may be more computationally intensive and require careful coordination between the training systems. The choice between individual or joint training depends on factors such as the complexity of the data, the desired performance, and the available computational resources. Experimentation and evaluation can help determine the most suitable training approach for a given scenario.

Once the VAE Encoder Subsystem 2150 is trained, it can map the input codeword vector to a lower-dimensional latent space representation. This latent space vector captures the essential features and characteristics of the input data in a compressed form. The dimensionality of the latent space vector is typically much smaller than the original codeword vector, allowing for efficient storage and processing.

The latent space vector output 2120 serves as the input to the Latent Transformer Subsystem 2070, which further processes and generates data based on the learned latent space representation. By compressing the input data into a compact latent space, the VAE Encoder Subsystem 2150 enables the Latent Transformer LCM system to handle large-scale and complex datasets efficiently, while preserving the essential information and structure of the data.

Latent space vectors possess the property of continuous differentiability. This means that the latent space formed by these vectors is a smooth and continuous manifold, allowing for smooth interpolation and gradual transitions between different points in the latent space. The continuous differentiability of latent space vectors has important implications for the similarity and relatedness of the outputs generated by the LCM system. In the latent space, outputs that are more proximate to one another, i.e., closer in terms of their latent vector representations, tend to exhibit higher levels of similarity. This is because the VAE Encoder Subsystem 2150 learns to map similar input data points to nearby regions in the latent space, capturing their shared characteristics and underlying patterns.

As a result, when the Latent Transformer Subsystem 2070 operates on the latent space vectors and generates outputs, the proximity of the latent vectors directly influences the similarity of the generated outputs. Outputs corresponding to latent vectors that are close to each other in the latent space are more likely to share common features, styles, or semantics. This property enables smooth interpolation between different outputs, allowing for the generation of intermediate or blended results that exhibit gradual variations along the latent space. The continuous differentiability of latent space vectors also facilitates the learning and optimization process of the LCM system. During training, the gradients can be computed and propagated smoothly through the latent space, enabling efficient updates of the model parameters. This allows the system to learn meaningful and coherent representations of the input data, capturing the underlying structure and relationships.

Moreover, the proximity-based similarity of latent space vectors opens up possibilities for various applications and use cases. For example, in the context of image generation, interpolating between latent vectors of different images can lead to the generation of smooth transitions or morphs between the corresponding visual contents. Similarly, in the domain of text generation, interpolating between latent vectors of different sentences or paragraphs can result in the generation of semantically coherent and gradually varying textual outputs. The continuous differentiability and proximity-based similarity of latent space vectors in the LCM system provide a powerful tool for exploring and manipulating the generated outputs. By navigating and interpolating within the latent space, users can discover novel and meaningful variations of the data, generate diverse and creative outputs, and gain insights into the underlying structure and relationships captured by the model.

In the Variational Autoencoder (VAE) Encoder and Decoder subsystems of the Latent Transformer Large Codeword Model (LCM) system, the shape of the tensors undergoes transformations as they are compressed and decompressed. The VAE Encoder Subsystem 2150 is responsible for compressing the input data into a lower-dimensional latent space representation, while the VAE Decoder Subsystem 2080 decompresses the latent representation back into the original data space. The specific shape and dimensionality of the tensors at each stage of the encoding and decoding process can be adjusted based on the goals and requirements of the system.

The VAE Encoder Subsystem 2150 takes the preprocessed input data, which is typically in the form of a high-dimensional vector or tensor, and applies a series of transformations to reduce its dimensionality. The shape of the tensor at each layer of the VAE Encoder Subsystem 2150 can be customized based on the desired level of compression and the complexity of the input data. For example, after passing through the first layer of the encoder, the expanded input vector may be reduced to a tensor with 1000 elements. This compression step aims to capture the most salient features and patterns in the input data while reducing its dimensionality. The subsequent layers of the encoder can further compress the tensor, reducing it to even lower dimensions, such as 50 or 10 elements, depending on the specific training parameters and the desired level of compression.

The choice of the target dimensionality for the latent space representation depends on various factors, such as the nature of the input data, the complexity of the patterns and relationships to be captured, and the available computational resources. A smaller latent space dimensionality can lead to higher compression rates and more efficient processing, but it may also result in a loss of information and reduced expressiveness. On the other hand, a larger latent space dimensionality allows for more detailed and nuanced representations but may require more computational resources and longer training times.

Once the input data is compressed into the latent space representation, it is passed through the Latent Transformer Subsystem 2070, where the self-attention mechanisms and multi-head attention operate on the compressed representation. The Latent Transformer Subsystem 2070 learns the underlying patterns, relationships, and dependencies within the latent space, enabling it to generate accurate and context-aware outputs. If the shape of the latent space representation is not large enough to be effectively processed by the Latent Transformer Subsystem 2070, the latent space vectors may be processed by an expander 2051, which increases the dimensionality of the vector allowing for a richer and more expressive representation.

The generated output from the Latent Transformer Subsystem 2070 is then fed into the VAE Decoder Subsystem 2080, which is responsible for decompressing the latent representation back into the original data space. The VAE Decoder Subsystem 2080 applies a series of transformations to gradually increase the dimensionality of the tensor, eventually reconstructing it into the desired output shape. Similar to the encoding process, the shape of the tensor at each layer of the VAE Decoder Subsystem 2080 can be customized based on the desired output characteristics and the requirements of the application.

The flexibility in tensor shapes throughout the encoding and decoding process allows the Latent Transformer LCM system to adapt to various data types, input sizes, and output requirements. By adjusting the compression and decompression parameters, the system can be optimized for different goals, such as achieving high compression rates, preserving important details, or generating outputs with specific dimensions or characteristics.

The ability to customize the tensor shapes in the VAE Encoder and Decoder subsystems enables the Latent Transformer LCM system to handle a wide range of data modalities and tasks, from time series forecasting and language modeling to image generation and beyond. It provides the flexibility to tailor the system to the specific needs of each application, balancing the trade-offs between compression, expressiveness, and computational efficiency.

Figure 22:
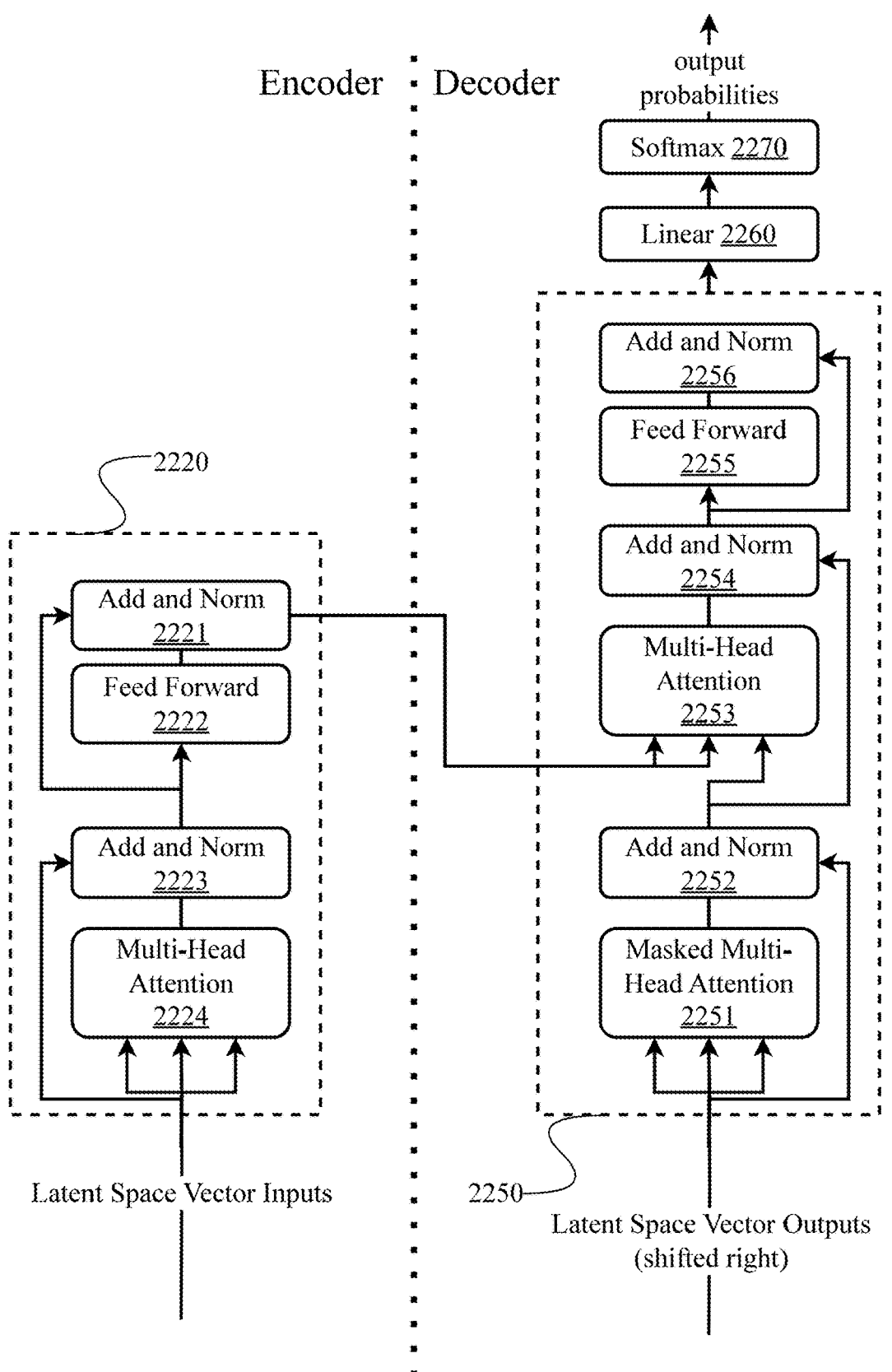
FIG. 22 is a block diagram illustrating a component of the system and method for a latent transformer core for a large codeword model, a latent transformer.

FIG. 22 is a block diagram illustrating a component of the system and method for a large codeword model for deep learning, a Latent Transformer. A Transformer generally comprises an Encoder (the components on the left side of the illustration) and a Decoder (the components on the right side of the illustration).

The illustrated Latent Transformer comprises an Encoder and a Decoder. The Encoder takes latent space vector inputs and processes them through a stack of layers (represented as dashed box 420). Each layer consists of: multi-head attention, which allows the model to attend to different parts of the input sequence; add and norm, which applies residual connection and layer normalization; feed forward, which is a fully connected feed-forward network; and add and norm which is another residual connection and layer normalization.

The power of the transformer model lies in the self-attention mechanism. This mechanism contributes to accelerated learning compared to traditional models such as long short-term memory models. Self-attention empowers the transformer model with the remarkable capability to meticulously scrutinize distinct segments of a given sequence or even encompass the entire contextual essence of a sentence. This profound contextual awareness enables the model to make predictions with an elevated degree of accuracy and relevance.

Contrary to a standard transformer architecture, in a Latent Transformer, an input embedding layer and a positional encoding layer are not necessary. This is because rather than processing data inputs, a Latent Transformer processes latent space vectors which have been processed by a Variational Autoencoder encoder.

This latent space representation captures the essential features and characteristics of the input data, including both the content and positional information. By encoding the input data into a compact latent vector, the VAE effectively combines the roles of the embedding layer and positional encoding layer. The latent vectors generated by the VAE encoder already contain the necessary information for the Transformer to process and learn from, without the need for explicit embedding or positional encoding. This streamlined approach simplifies the Transformer architecture and reduces the computational overhead associated with maintaining separate embedding and positional encoding layers. As a result, the Latent Transformer LCM system can efficiently process and generate data in the latent space, leveraging the power of the Transformer architecture while benefiting from the compressed representation learned by the VAE.

The Encoder utilizes a multi-head attention mechanism 2224 which allows the Encoder to attend to different parts of the input sequence and capture dependencies between vectors. The attention mechanism computes three matrices: Query (Q), Key (K), and Value (V). The Query, Key, and Value matrices are obtained by linearly projecting the input embeddings using learned weight matrices. The attention scores are computed by taking the dot product of the Query matrix with the transpose of the Key matrix, followed by scaling and applying a softmax function. The attention scores determine the importance of each vector in the input sequence for a given position. The Value matrix is then multiplied with the attention scores to obtain the weighted sum of the values, which forms the output of the attention mechanism. Multi-Head Attention splits the Query, Key, and Value matrices into multiple heads, allowing the model to attend to different aspects of the input simultaneously. The outputs from each head are concatenated and linearly projected to obtain the final output of the Multi-Head Attention layer 2224.

In the Latent Transformer LCM system, the number of attention heads used by the Encoder can be adjusted based on the complexity and nature of the relationships within the input data. The attention mechanism allows the Encoder to focus on different aspects of the input and capture dependencies between elements at various positions. When dealing with datasets where the relationships between elements are weaker or more subtle, increasing the number of attention heads can be beneficial. By having more attention heads, the Encoder can learn and capture a wider range of patterns and dependencies within the data. Each attention head can attend to different parts of the input sequence, allowing the model to capture fine-grained relationships and nuances that may be difficult to detect with fewer attention heads. This is particularly useful when working with complex or heterogeneous datasets, where the relationships between elements may not be immediately apparent. By increasing the number of attention heads, the Latent Transformer LCM system can more effectively learn and represent the underlying structure and dependencies in the data, leading to improved performance and generalization. However, it's important to strike a balance, as having an excessive number of attention heads can increase computational complexity and may lead to overfitting. Experimentation and evaluation on specific tasks can help determine the optimal number of attention heads for a given dataset and desired outcome.

After the Multi-Head Attention layer, a residual connection is applied, followed by Layer Normalization at add and norm 2223. The residual connection adds the input embeddings to the output of the attention layer, helping the model learn faster and deeper. Layer Normalization normalizes the activations across the features, stabilizing the training process.

The Feed Forward layer 2222 is a fully connected neural network applied to each position of the Encoder's hidden states. It consists of two linear transformations with a Rectified Linear Unit (ReLU) activation function in between. The purpose of the Feed Forward layer is to introduce non-linearity and increase the model's capacity to learn complex representations. The output of the Feed Forward layer has the same dimensionality as the input embeddings. A residual connection and Layer Normalization 2221 are applied after the Feed Forward layer.

The Encoder layers 2220 are stacked Nx times, where N is a hyperparameter that determines the depth of the Encoder. Each layer follows the same structure: Multi-Head Attention, Add & Norm, Feed Forward, and Add & Norm. By stacking multiple Encoder layers, the model can capture hierarchical and long-range dependencies in the input sequence. The output of the final Encoder layer represents the encoded input sequence, which is then passed to the Decoder for generating the output sequence.

The Decoder generates the output probabilities. It has a similar structure to the Encoder, with a few additions. The Decoder takes output embeddings and processes them through a stack of layers (represented as dashed box 2250). The latent space vector output layer takes the previous output vectors (shifted right by one position) and processes them through a plurality of layers.

The masked multi-head attention 2251 mechanism prevents the model form attending to future vectors. This layer performs self-attention on the Decoder's input sequence. It allows the Decoder to attend to different parts of its own input sequence. The attention is "masked" to prevent the Decoder from attending to future vectors, ensuring that the predictions are based only on the previously generated vectors. Multi-head attention splits the input into multiple heads, allowing the model to attend different aspect of the input simultaneously.

After the masked multi-head attention, a residual connection is applied follows by layer normalization via add and norm 2252. The residual connection adds the input to the output of the attention layer, helping the model learn faster and deeper. Layer normalization normalizes the activations across the features, stabilizing the training process.

The multi-head attention 2253 layer performs attention between the Decoder's hidden states and the Encoder's output. It allows the Decoder to attend to relevant parts of the input sequence based on the Encoder's representations. The attention weights are computed based on the compatibility between the Decoder's hidden states and Encoder's outputs.

In the Latent Transformer LCM system, the number of attention heads used by the Decoder can be adjusted based on the complexity and nature of the relationships within the input data. The attention mechanism allows the Decoder to focus on different aspects of the input and capture dependencies between elements at various positions. When dealing with datasets where the relationships between elements are weaker or more subtle, increasing the number of attention heads can be beneficial. By having more attention heads, the Decoder can learn and capture a wider range of patterns and dependencies within the data. Each attention head can attend to different parts of the input sequence, allowing the model to capture fine-grained relationships and nuances that may be difficult to detect with fewer attention heads. This is particularly useful when working with complex or heterogeneous datasets, where the relationships between elements may not be immediately apparent. By increasing the number of attention heads, the Latent Transformer LCM system can more effectively learn and represent the underlying structure and dependencies in the data, leading to improved performance and generalization. However, it's important to strike a balance, as having an excessive number of attention heads can increase computational complexity and may lead to overfitting. Experimentation and evaluation on specific tasks can help determine the optimal number of attention heads for a given dataset and desired outcome.

Another add and norm 2254 layer is then followed by feed forward network 2255. This a fully connected feed-forward network applied to each position of the Decoder's hidden states. It consists of two linear transformations with a Rectified Linear Unit (ReLU) activation in between. The feed forward layer helps the model capture non-linear interactions and increases the model's capacity.

Another add and norm 2256 layer is followed by linear 2260 and softmax 2270 layers. The final hidden states of the Decoder are passed through a linear transformation to project them into the vocabulary space. Vocabulary space refers to the set of all unique codewords or words that the model can generate or predict. In the context of language models, the vocabulary is a predefined set of codewords that the model is trained on and can output. When the Decoder's final hidden states are passed through a linear transformation, they are projected into a vector space with the same dimensionality as the size of the vocabulary. Each dimension in this space corresponds to a specific codeword in the vocabulary.

A softmax function is applied to the projected values (vectors) to generate output probabilities over the vocabulary. The softmax function normalizes the values so that they sum up to 1, representing a probability distribution over the vocabulary. Each probability indicates the likelihood of a specific vector being the next output vector. The vector with the highest probability is selected as the next output vector. During the model's training, the objective is to maximize the probability of the correct next vector given the input sequence and the previously generated vector. The model learns to assign higher probabilities to the vector that are more likely to appear based on the context. At inference time, the vector with the highest probability in the vocabulary space is selected as the next output vector. This process is repeated iteratively, with the generated vector being fed back into the Decoder as input for the next step, until a stopping criterion is met (e.g., reaching a maximum length or generating an end-of-sequence vector). The size and composition of the vocabulary can vary depending on the specific task and the data the model is trained on. It can include words, sub-words, or even characters, depending on the codeword strategy used.

The Decoder layers 2250 can be stacked Nx times, allowing the model to capture complex dependencies and generate coherent output sequences.

This transformer architecture allows the model to process input sequences, capture long-range dependencies, and generate output sequence based on the encoded input and the previously generated codewords.

Another type of variation is the auto-regressive model which feature the use of only the decoder portion of the transformer architecture. In autoregressive architectures, the decoder portion of the transformer is retained and the encoder portion is not used after model pre-training. Auto-regressive models are a class of models that generate outputs by predicting the next element based on the previously generated elements. In the context of the Transformer architecture and language modeling, auto-regressive models are commonly used for tasks such as text generation, machine translation, and language understanding.

Auto-regressive models generate outputs sequentially, one element at a time. In the case of language modeling, the model predicts the next word or vector based on the previous words or vector in the sequence. The prediction of the next element is conditioned on the previously generated elements. The model learns the conditional probability distribution $P(x\_t|x\_1, x\_2, \ldots, x\_\{t-1\})$, where $x\_t$ is the element at position t, and $x\_1, x\_2, \ldots, x\_\{t-1\}$ are the previously generated elements. The Transformer architecture, particularly the Decoder component, is well-suited for auto-regressive modeling. The Decoder generates the output sequence one element at a time, conditioned on the previously generated elements and the encoded input sequence from the Encoder. In the Transformer Decoder, the self-attention mechanism is masked to prevent the model from attending to future positions during training. This masking ensures that the model relies only on the previously generated elements to make predictions, following the auto-regressive property. During training, the Transformer Decoder uses a technique called teacher forcing. Instead of feeding the model's own predictions as input for the next step, the ground truth target sequence is used. This helps the model learn to generate the correct output sequence based on the input sequence and the previous target vectors. During inference or generation, the Transformer Decoder generates the output sequence one element at a time. At each step, the model takes the previously generated elements as input and predicts the next element. This process continues until a stopping criterion is met, such as reaching a maximum sequence length or generating an end-of-sequence vector. Auto-regressive models, including the Transformer, have achieved state-of-the-art performance in language modeling tasks. They excel at capturing the statistical properties and dependencies in sequential data, making them effective for generating coherent and fluent text.

While text generation is the most suitable use case of auto-regressors, they perform exceptionally well on a wide variety of tasks. Most modern LLMs are auto-regressors including, for example, the popular GPT series of LLMs, BERT, and XLNet.

The third variation of the transformer model is the sequence-to-sequence model which utilizes both the encoder and decoder portions of the transformer and can be trained in multiple ways. One of the methods is span corruption and reconstruction. These models are, generally, best suited for language translation. The T5 and BART family of models are examples of sequence-to-sequence models.

Figure 23:
FIG. 23 is a flow diagram illustrating an exemplary method for performing federated deep learning, according to an embodiment.

FIG. 23 is a flow diagram illustrating an exemplary method 2300 for performing federated deep learning, according to an embodiment. According to the embodiment, the process begins with the initialization of a central server (e.g., platform 1400) and multiple client devices (e.g., 1410*a-n*). Each client device preprocesses its local dataset at step 2301, converting it into codewords using a locally generated codebook. These codewords may be homomorphically encrypted to ensure data privacy. In an embodiment, the homomorphic encryption process comprises using a dyadic distribution-based algorithm. At step 2302 the central server initializes a deep learning core, which can be either a conventional transformer or a latent transformer architecture, depending upon the embodiment. In the training phase, the server sends the current model parameters to the client devices at step 2303. Each client performs local training on their encrypted codewords at step 2304, computing gradients without decrypting the data. The clients then send these encrypted gradients back to the server at step 2305. The server aggregates the encrypted updates, applying techniques such as differential privacy to further enhance security. The global model is updated based on these aggregated gradients. This process repeats for multiple rounds until the model converges or a predefined number of iterations is reached.

As an example use case, consider a consortium of hospitals collaborating to develop a diagnostic model for a rare disease. Each hospital has a small local dataset of patient records, which are highly sensitive and cannot be shared directly. Using this federated deep learning platform, each hospital can convert its patient data into codewords and encrypt them. The central server, operated by a neutral third party, trains a diagnostic model on these encrypted codewords. The hospitals contribute to the model's training by providing encrypted updates, but never expose their raw patient data. The resulting model benefits from the combined knowledge of all participating hospitals, potentially improving diagnostic accuracy for the rare disease, while maintaining strict patient privacy and compliance with data protection regulations.

Exemplary Computing Environment

Figure 24:
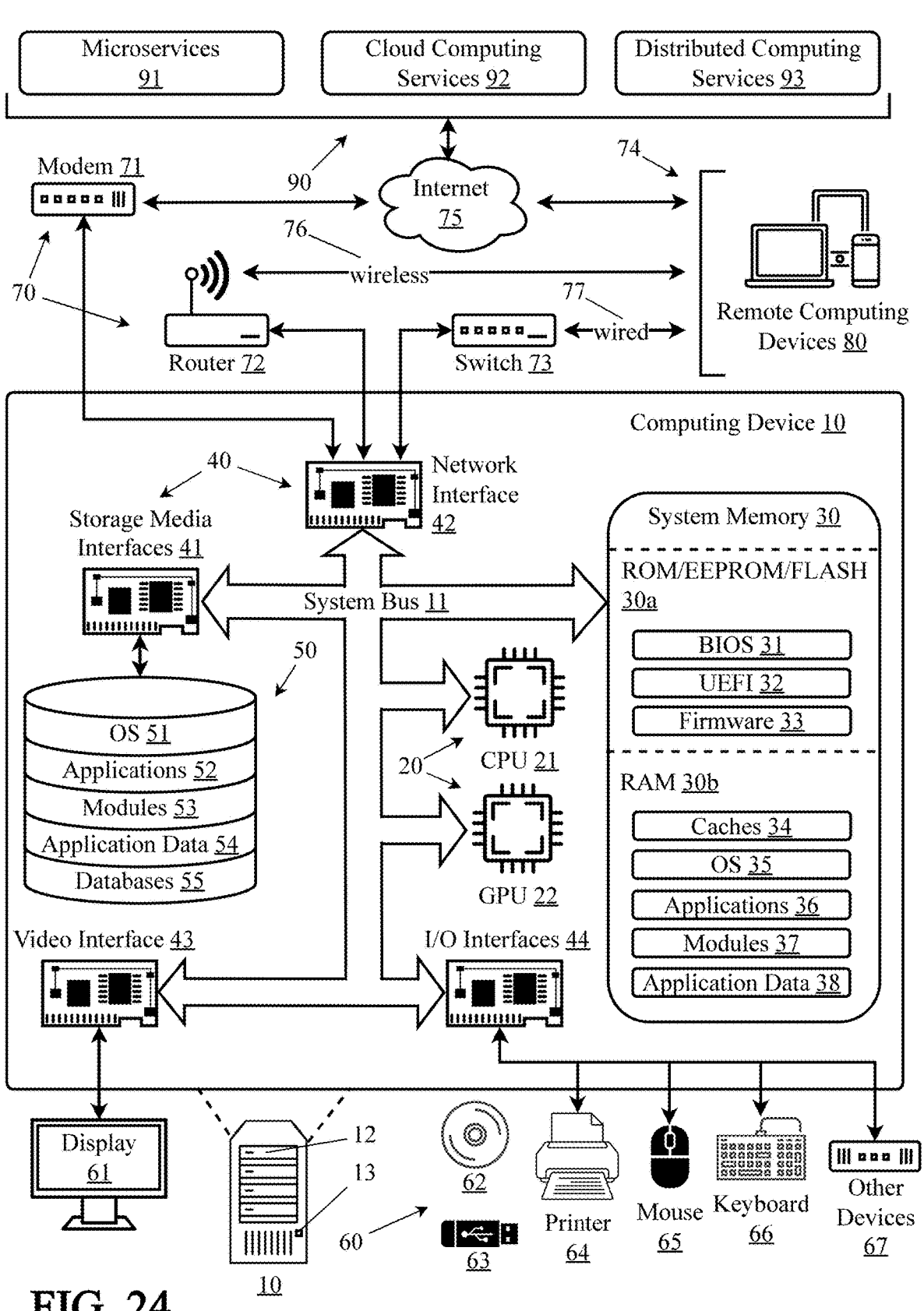
FIG. 24 illustrates an exemplary computing environment on which an embodiment described herein may be implemented, in full or in part.

FIG. 24 illustrates an exemplary computing environment on which an embodiment described herein may be implemented, in full or in part. This exemplary computing environment describes computer-related components and processes supporting enabling disclosure of computer-implemented embodiments. Inclusion in this exemplary computing environment of well-known processes and computer components, if any, is not a suggestion or admission that any embodiment is no more than an aggregation of such processes or components. Rather, implementation of an embodiment using processes and components described in this exemplary computing environment will involve programming or configuration of such processes and components resulting in a machine specially programmed or configured for such implementation. The exemplary computing environment described herein is only one example of such an environment and other configurations of the components and processes are possible, including other relationships between and among components, and/or absence of some processes or components described. Further, the exemplary computing environment described herein is not intended to suggest any limitation as to the scope of use or functionality of any embodiment implemented, in whole or in part, on components or processes described herein.

The exemplary computing environment described herein comprises a computing device 10 (further comprising a system bus 11, one or more processors 20, a system memory 30, one or more interfaces 40, one or more non-volatile data storage devices 50), external peripherals and accessories 60, external communication devices 70, remote computing devices 80, and cloud-based services 90.

System bus 11 couples the various system components, coordinating operation of and data transmission between those various system components. System bus 11 represents one or more of any type or combination of types of wired or wireless bus structures including, but not limited to, memory busses or memory controllers, point-to-point connections, switching fabrics, peripheral busses, accelerated graphics ports, and local busses using any of a variety of bus architectures. By way of example, such architectures include, but are not limited to, Industry Standard Architecture (ISA) busses, Micro Channel Architecture (MCA) busses, Enhanced ISA (EISA) busses, Video Electronics Standards Association (VESA) local busses, a Peripheral Component Interconnects (PCI) busses also known as a Mezzanine busses, or any selection of, or combination of, such busses. Depending on the specific physical implementation, one or more of the processors 20, system memory 30 and other components of the computing device 10 can be physically co-located or integrated into a single physical component, such as on a single chip. In such a case, some or all of system bus 11 can be electrical pathways within a single chip structure.

Computing device may further comprise externally-accessible data input and storage devices 12 such as compact disc read-only memory (CD-ROM) drives, digital versatile discs (DVD), or other optical disc storage for reading and/or writing optical discs 62; magnetic cassettes, magnetic tape, magnetic disk storage, or other magnetic storage devices; or any other medium which can be used to store the desired content and which can be accessed by the computing device 10. Computing device may further comprise externally-accessible data ports or connections 12 such as serial ports, parallel ports, universal serial bus (USB) ports, and infrared ports and/or transmitter/receivers. Computing device may further comprise hardware for wireless communication with external devices such as IEEE 1394 ("Firewire") interfaces, IEEE 802.11 wireless interfaces, BLUETOOTH® wireless interfaces, and so forth. Such ports and interfaces may be used to connect any number of external peripherals and accessories 60 such as visual displays, monitors, and touch-sensitive screens 61, USB solid state memory data storage drives (commonly known as "flash drives" or "thumb drives") 63, printers 64, pointers and manipulators such as mice 65, keyboards 66, and other devices 67 such as joysticks and gaming pads, touchpads, additional displays and monitors, and external hard drives (whether solid state or disc-based), microphones, speakers, cameras, and optical scanners.

Processors 20 are logic circuitry capable of receiving programming instructions and processing (or executing) those instructions to perform computer operations such as retrieving data, storing data, and performing mathematical calculations. Processors 20 are not limited by the materials from which they are formed or the processing mechanisms employed therein, but are typically comprised of semiconductor materials into which many transistors are formed together into logic gates on a chip (i.e., an integrated circuit or IC). The term processor includes any device capable of receiving and processing instructions including, but not limited to, processors operating on the basis of quantum computing, optical computing, mechanical computing (e.g., using nanotechnology entities to transfer data), and so forth. Depending on configuration, computing device 10 may comprise more than one processor. For example, computing device 10 may comprise one or more central processing units (CPUs) 21, each of which itself has multiple processors or multiple processing cores, each capable of independently or semi-independently processing programming instructions based on technologies like complex instruction set computer (CISC) or reduced instruction set computer (RISC). Further, computing device 10 may comprise one or more specialized processors such as a graphics processing unit (GPU) 22 configured to accelerate processing of computer graphics and images via a large array of specialized processing cores arranged in parallel. Further computing device 10 may be comprised of one or more specialized processes such as Intelligent Processing Units, field-programmable gate arrays or application-specific integrated circuits for specific tasks or types of tasks. The term processor may further include: neural processing units (NPUs) or neural computing units optimized for machine learning and artificial intelligence workloads using specialized architectures and data paths; tensor processing units (TPUs) designed to efficiently perform matrix multiplication and convolution operations used heavily in neural networks and deep learning applications; application-specific integrated circuits (ASICs) implementing custom logic for domain-specific tasks; application-specific instruction set processors (ASIPs) with instruction sets tailored for particular applications; field-programmable gate arrays (FPGAs) providing reconfigurable logic fabric that can be customized for specific processing tasks; processors operating on emerging computing paradigms such as quantum computing, optical computing, mechanical computing (e.g., using nanotechnology entities to transfer data), and so forth. Depending on configuration, computing device 10 may comprise one or more of any of the above types of processors in order to efficiently handle a variety of general purpose and specialized computing tasks. The specific processor configuration may be selected based on performance, power, cost, or other design constraints relevant to the intended application of computing device 10.

System memory 30 is processor-accessible data storage in the form of volatile and/or nonvolatile memory. System memory 30 may be either or both of two types: non-volatile memory and volatile memory. Non-volatile memory 30a is not erased when power to the memory is removed, and includes memory types such as read only memory (ROM), electronically-erasable programmable memory (EEPROM), and rewritable solid state memory (commonly known as "flash memory"). Non-volatile memory 30a is typically used for long-term storage of a basic input/output system (BIOS) 31, containing the basic instructions, typically loaded during computer startup, for transfer of information between components within computing device, or a unified extensible firmware interface (UEFI), which is a modem replacement for BIOS that supports larger hard drives, faster boot times, more security features, and provides native support for graphics and mouse cursors. Non-volatile memory 30a may also be used to store firmware comprising a complete operating system 35 and applications 36 for operating computer-controlled devices. The firmware approach is often used for purpose-specific computer-controlled devices such as appliances and Internet-of-Things (IoT) devices where processing power and data storage space is limited. Volatile memory 30b is erased when power to the memory is removed and is typically used for short-term storage of data for processing. Volatile memory 30b includes memory types such as random-access memory (RAM), and is normally the primary operating memory into which the operating system 35, applications 36, program modules 37, and application data 38 are loaded for execution by processors 20. Volatile memory 30b is generally faster than non-volatile memory 30a due to its electrical characteristics and is directly accessible to processors 20 for processing of instructions and data storage and retrieval. Volatile memory 30b may comprise one or more smaller cache memories which operate at a higher clock speed and are typically placed on the same IC as the processors to improve performance.

There are several types of computer memory, each with its own characteristics and use cases. System memory 30 may be configured in one or more of the several types described herein, including high bandwidth memory (HBM) and advanced packaging technologies like chip-on-wafer-on-substrate (CoWoS). Static random access memory (SRAM) provides fast, low-latency memory used for cache memory in processors, but is more expensive and consumes more power compared to dynamic random access memory (DRAM). SRAM retains data as long as power is supplied. DRAM is the main memory in most computer systems and is slower than SRAM but cheaper and more dense. DRAM requires periodic refresh to retain data. NAND flash is a type of non-volatile memory used for storage in solid state drives (SSDs) and mobile devices and provides high density and lower cost per bit compared to DRAM with the trade-off of slower write speeds and limited write endurance. HBM is an emerging memory technology that provides high bandwidth and low power consumption which stacks multiple DRAM dies vertically, connected by through-silicon vias (TSVs). HBM offers much higher bandwidth (up to 1 TB/s) compared to traditional DRAM and may be used in high-performance graphics cards, AI accelerators, and edge computing devices. Advanced packaging and CoWoS are technologies that enable the integration of multiple chips or dies into a single package. CoWoS is a 2.5D packaging technology that interconnects multiple dies side-by-side on a silicon interposer and allows for higher bandwidth, lower latency, and reduced power consumption compared to traditional PCB-based packaging. This technology enables the integration of heterogeneous dies (e.g., CPU, GPU, HBM) in a single package and may be used in high-performance computing, AI accelerators, and edge computing devices.

Interfaces 40 may include, but are not limited to, storage media interfaces 41, network interfaces 42, display interfaces 43, and input/output interfaces 44. Storage media interface 41 provides the necessary hardware interface for loading data from non-volatile data storage devices 50 into system memory 30 and storage data from system memory 30 to non-volatile data storage device 50. Network interface 42 provides the necessary hardware interface for computing device 10 to communicate with remote computing devices 80 and cloud-based services 90 via one or more external communication devices 70. Display interface 43 allows for connection of displays 61, monitors, touchscreens, and other visual input/output devices. Display interface 43 may include a graphics card for processing graphics-intensive calculations and for handling demanding display requirements. Typically, a graphics card includes a graphics processing unit (GPU) and video RAM (VRAM) to accelerate display of graphics. In some high-performance computing systems, multiple GPUs may be connected using NVLink bridges, which provide high-bandwidth, low-latency interconnects between GPUs. NVLink bridges enable faster data transfer between GPUs, allowing for more efficient parallel processing and improved performance in applications such as machine learning, scientific simulations, and graphics rendering. One or more input/output (I/O) interfaces 44 provide the necessary support for communications between computing device 10 and any external peripherals and accessories 60. For wireless communications, the necessary radio-frequency hardware and firmware may be connected to I/O interface 44 or may be integrated into I/O interface 44. Network interface 42 may support various communication standards and protocols, such as Ethernet and Small Form- Factor Pluggable (SFP). Ethernet is a widely used wired networking technology that enables local area network (LAN) communication. Ethernet interfaces typically use RJ45 connectors and support data rates ranging from 10 Mbps to 100 Gbps, with common speeds being 100 Mbps, 1 Gbps, 10 Gbps, 25 Gbps, 40 Gbps, and 100 Gbps. Ethernet is known for its reliability, low latency, and cost-effectiveness, making it a popular choice for home, office, and data center networks. SFP is a compact, hot-pluggable transceiver used for both telecommunication and data communications applications. SFP interfaces provide a modular and flexible solution for connecting network devices, such as switches and routers, to fiber optic or copper networking cables. SFP transceivers support various data rates, ranging from 100 Mbps to 100 Gbps, and can be easily replaced or upgraded without the need to replace the entire network interface card. This modularity allows for network scalability and adaptability to different network requirements and fiber types, such as single-mode or multi-mode fiber.

Non-volatile data storage devices 50 are typically used for long-term storage of data. Data on non-volatile data storage devices 50 is not erased when power to the non-volatile data storage devices 50 is removed. Non-volatile data storage devices 50 may be implemented using any technology for non-volatile storage of content including, but not limited to, CD-ROM drives, digital versatile discs (DVD), or other optical disc storage; magnetic cassettes, magnetic tape, magnetic disc storage, or other magnetic storage devices; solid state memory technologies such as EEPROM or flash memory; or other memory technology or any other medium which can be used to store data without requiring power to retain the data after it is written. Non-volatile data storage devices 50 may be non-removable from computing device 10 as in the case of internal hard drives, removable from computing device 10 as in the case of external USB hard drives, or a combination thereof, but computing device will typically comprise one or more internal, non-removable hard drives using either magnetic disc or solid state memory technology. Non-volatile data storage devices 50 may be implemented using various technologies, including hard disk drives (HDDs) and solid-state drives (SSDs). HDDs use spinning magnetic platters and read/write heads to store and retrieve data, while SSDs use NAND flash memory. SSDs offer faster read/write speeds, lower latency, and better durability due to the lack of moving parts, while HDDs typically provide higher storage capacities and lower cost per gigabyte. NAND flash memory comes in different types, such as Single-Level Cell (SLC), Multi-Level Cell (MLC), Triple-Level Cell (TLC), and Quad-Level Cell (QLC), each with trade-offs between performance, endurance, and cost. Storage devices connect to the computing device 10 through various interfaces, such as SATA, NVMe, and PCIe. SATA is the traditional interface for HDDs and SATA SSDs, while NVMe (Non-Volatile Memory Express) is a newer, high-performance protocol designed for SSDs connected via PCIe. PCIe SSDs offer the highest performance due to the direct connection to the PCIe bus, bypassing the limitations of the SATA interface. Other storage form factors include M.2 SSDs, which are compact storage devices that connect directly to the motherboard using the M.2 slot, supporting both SATA and NVMe interfaces. Additionally, technologies like Intel Optane memory combine 3D XPoint technology with NAND flash to provide high-performance storage and caching solutions. Non-volatile data storage devices 50 may be non-removable from computing device 10, as in the case of internal hard drives, removable from computing device 10, as in the case of external USB hard drives, or a combination thereof. However, computing devices will typically comprise one or more internal, non-removable hard drives using either magnetic disc or solid-state memory technology. Non-volatile data storage devices 50 may store any type of data including, but not limited to, an operating system 51 for providing low-level and mid-level functionality of computing device 10, applications 52 for providing high-level functionality of computing device 10, program modules 53 such as containerized programs or applications, or other modular content or modular programming, application data 54, and databases 55 such as relational databases, non-relational databases, object oriented databases, NoSQL databases, vector databases, knowledge graph databases, key-value databases, document oriented data stores, and graph databases.

Applications (also known as computer software or software applications) are sets of programming instructions designed to perform specific tasks or provide specific functionality on a computer or other computing devices. Applications are typically written in high-level programming languages such as C, C++, Scala, Erlang, GoLang, Java, Scala, Rust, and Python, which are then either interpreted at runtime or compiled into low-level, binary, processor-executable instructions operable on processors 20. Applications may be containerized so that they can be run on any computer hardware running any known operating system. Containerization of computer software is a method of packaging and deploying applications along with their operating system dependencies into self-contained, isolated units known as containers. Containers provide a lightweight and consistent runtime environment that allows applications to run reliably across different computing environments, such as development, testing, and production systems facilitated by specifications such as containerd.

The memories and non-volatile data storage devices described herein do not include communication media. Communication media are means of transmission of information such as modulated electromagnetic waves or modulated data signals configured to transmit, not store, information. By way of example, and not limitation, communication media includes wired communications such as sound signals transmitted to a speaker via a speaker wire, and wireless communications such as acoustic waves, radio frequency (RF) transmissions, infrared emissions, and other wireless media.

External communication devices 70 are devices that facilitate communications between computing device and either remote computing devices 80, or cloud-based services 90, or both. External communication devices 70 include, but are not limited to, data modems 71 which facilitate data transmission between computing device and the Internet 75 via a common carrier such as a telephone company or internet service provider (ISP), routers 72 which facilitate data transmission between computing device and other devices, and switches 73 which provide direct data communications between devices on a network or optical transmitters (e.g., lasers). Here, modem 71 is shown connecting computing device 10 to both remote computing devices 80 and cloud-based services 90 via the Internet 75. While modem 71, router 72, and switch 73 are shown here as being connected to network interface 42, many different network configurations using external communication devices 70 are possible. Using external communication devices 70, networks may be configured as local area networks (LANs) for a single location, building, or campus, wide area networks (WANs) comprising data networks that extend over a larger geographical area, and virtual private networks (VPNs)

which can be of any size but connect computers via encrypted communications over public networks such as the Internet 75. As just one exemplary network configuration, network interface 42 may be connected to switch 73 which is connected to router 72 which is connected to modem 71 which provides access for computing device 10 to the Internet 75. Further, any combination of wired 77 or wireless 76 communications between and among computing device 10, external communication devices 70, remote computing devices 80, and cloud-based services 90 may be used. Remote computing devices 80, for example, may communicate with computing device through a variety of communication channels 74 such as through switch 73 via a wired 77 connection, through router 72 via a wireless connection 76, or through modem 71 via the Internet 75. Furthermore, while not shown here, other hardware that is specifically designed for servers or networking functions may be employed. For example, secure socket layer (SSL) acceleration cards can be used to offload SSL encryption computations, and transmission control protocol/internet protocol (TCP/IP) offload hardware and/or packet classifiers on network interfaces 42 may be installed and used at server devices or intermediate networking equipment (e.g., for deep packet inspection).

In a networked environment, certain components of computing device 10 may be fully or partially implemented on remote computing devices 80 or cloud-based services 90. Data stored in non-volatile data storage device 50 may be received from, shared with, duplicated on, or offloaded to a non-volatile data storage device on one or more remote computing devices 80 or in a cloud computing service 92. Processing by processors 20 may be received from, shared with, duplicated on, or offloaded to processors of one or more remote computing devices 80 or in a distributed computing service 93. By way of example, data may reside on a cloud computing service 92, but may be usable or otherwise accessible for use by computing device 10. Also, certain processing subtasks may be sent to a microservice 91 for processing with the result being transmitted to computing device 10 for incorporation into a larger processing task. Also, while components and processes of the exemplary computing environment are illustrated herein as discrete units (e.g., OS 51 being stored on non-volatile data storage device 51 and loaded into system memory 35 for use) such processes and components may reside or be processed at various times in different components of computing device 10, remote computing devices 80, and/or cloud-based services 90. Also, certain processing subtasks may be sent to a microservice 91 for processing with the result being transmitted to computing device 10 for incorporation into a larger processing task. Infrastructure as Code (IaaC) tools like Terraform can be used to manage and provision computing resources across multiple cloud providers or hyperscalers. This allows for workload balancing based on factors such as cost, performance, and availability. For example, Terraform can be used to automatically provision and scale resources on AWS spot instances during periods of high demand, such as for surge rendering tasks, to take advantage of lower costs while maintaining the required performance levels. In the context of rendering, tools like Blender can be used for object rendering of specific elements, such as a car, bike, or house. These elements can be approximated and roughed in using techniques like bounding box approximation or low-poly modeling to reduce the computational resources required for initial rendering passes. The rendered elements can then be integrated into the larger scene or environment as needed, with the option to replace the approximated elements with higher-fidelity models as the rendering process progresses.

In an implementation, the disclosed systems and methods may utilize, at least in part, containerization techniques to execute one or more processes and/or steps disclosed herein. Containerization is a lightweight and efficient virtualization technique that allows you to package and run applications and their dependencies in isolated environments called containers. One of the most popular containerization platforms is containerd, which is widely used in software development and deployment. Containerization, particularly with open-source technologies like containerd and container orchestration systems like Kubernetes, is a common approach for deploying and managing applications. Containers are created from images, which are lightweight, standalone, and executable packages that include application code, libraries, dependencies, and runtime. Images are often built from a containerfile or similar, which contains instructions for assembling the image. Containerfiles are configuration files that specify how to build a container image. Systems like Kubernetes natively support containerd as a container runtime. They include commands for installing dependencies, copying files, setting environment variables, and defining runtime configurations. Container images can be stored in repositories, which can be public or private. Organizations often set up private registries for security and version control using tools such as Harbor, JFrog Artifactory and Bintray, GitLab Container Registry, or other container registries. Containers can communicate with each other and the external world through networking. Containerd provides a default network namespace, but can be used with custom network plugins. Containers within the same network can communicate using container names or IP addresses.

Remote computing devices 80 are any computing devices not part of computing device 10. Remote computing devices 80 include, but are not limited to, personal computers, server computers, thin clients, thick clients, personal digital assistants (PDAs), mobile telephones, watches, tablet computers, laptop computers, multiprocessor systems, microprocessor based systems, set-top boxes, programmable consumer electronics, video game machines, game consoles, portable or handheld gaming units, network terminals, desktop personal computers (PCs), minicomputers, mainframe computers, network nodes, virtual reality or augmented reality devices and wearables, and distributed or multi-processing computing environments. While remote computing devices 80 are shown for clarity as being separate from cloud-based services 90, cloud-based services 90 are implemented on collections of networked remote computing devices 80.

Cloud-based services 90 are Internet-accessible services implemented on collections of networked remote computing devices 80. Cloud-based services are typically accessed via application programming interfaces (APIs) which are software interfaces which provide access to computing services within the cloud-based service via API calls, which are pre-defined protocols for requesting a computing service and receiving the results of that computing service. While cloud-based services may comprise any type of computer processing or storage, three common categories of cloud-based services 90 are serverless logic apps, microservices 91, cloud computing services 92, and distributed computing services 93.

Microservices 91 are collections of small, loosely coupled, and independently deployable computing services. Each microservice represents a specific computing functionality and runs as a separate process or container. Microservices promote the decomposition of complex applications into smaller, manageable services that can be developed, deployed, and scaled independently. These services communicate with each other through well-defined application programming interfaces (APIs), typically using lightweight protocols like HTTP, protobuffers, gRPC or message queues such as Kafka. Microservices 91 can be combined to perform more complex or distributed processing tasks. In an embodiment, Kubernetes clusters with containerized resources are used for operational packaging of system.

Cloud computing services 92 are delivery of computing resources and services over the Internet 75 from a remote location. Cloud computing services 92 provide additional computer hardware and storage on as-needed or subscription basis. Cloud computing services 92 can provide large amounts of scalable data storage, access to sophisticated software and powerful server-based processing, or entire computing infrastructures and platforms. For example, cloud computing services can provide virtualized computing resources such as virtual machines, storage, and networks, platforms for developing, running, and managing applications without the complexity of infrastructure management, and complete software applications over public or private networks or the Internet on a subscription or alternative licensing basis, or consumption or ad-hoc marketplace basis, or combination thereof.

Distributed computing services 93 provide large-scale processing using multiple interconnected computers or nodes to solve computational problems or perform tasks collectively. In distributed computing, the processing and storage capabilities of multiple machines are leveraged to work together as a unified system. Distributed computing services are designed to address problems that cannot be efficiently solved by a single computer or that require large-scale computational power or support for highly dynamic compute, transport or storage resource variance or uncertainty over time requiring scaling up and down of constituent system resources. These services enable parallel processing, fault tolerance, and scalability by distributing tasks across multiple nodes.

Although described above as a physical device, computing device 10 can be a virtual computing device, in which case the functionality of the physical components herein described, such as processors 20, system memory 30, network interfaces 40, NVLink or other GPU-to-GPU high bandwidth communications links and other like components can be provided by computer-executable instructions. Such computer-executable instructions can execute on a single physical computing device, or can be distributed across multiple physical computing devices, including being distributed across multiple physical computing devices in a dynamic manner such that the specific, physical computing devices hosting such computer-executable instructions can dynamically change over time depending upon need and availability. In the situation where computing device 10 is a virtualized device, the underlying physical computing devices hosting such a virtualized computing device can, themselves, comprise physical components analogous to those described above, and operating in a like manner. Furthermore, virtual computing devices can be utilized in multiple layers with one virtual computing device executing within the construct of another virtual computing device. Thus, computing device 10 may be either a physical computing device or a virtualized computing device within which computer-executable instructions can be executed in a manner consistent with their execution by a physical computing device. Similarly, terms referring to physical components of the computing device, as utilized herein, mean either those physical components or virtualizations thereof performing the same or equivalent functions.

The skilled person will be aware of a range of possible modifications of the various aspects described above. Accordingly, the present invention is defined by the claims and their equivalents.

What is claimed is:

1. A computer system comprising a hardware memory, wherein the computer system is configured to execute software instructions stored on nontransitory machine-readable storage media that, when executed by at least one processor, cause the computer system to:

orchestrate federated deep learning with a plurality of client devices by receiving a plurality of encrypted codewords from the plurality of client devices;

process the encrypted codewords using a deep learning core without decrypting the codewords; and generate as output an encrypted codeword response to the input using the deep learning core;

wherein the deep learning core comprises a latent transformer core that was initially trained on encrypted codeword inputs to predict a plurality of probable future encrypted codewords that extend the input sequence.

2. The system of claim 1, wherein the deep learning core comprises a latent transformer architecture.

3. The system of claim 2, wherein each client device further comprises a variational autoencoder encoder that generates latent space vectors from the plurality of codewords.

4. The system of claim 3, wherein the latent transformer architecture processes the latent space vectors.

5. The system of claim 1, wherein the plurality of programming instructions further cause the computing device to:

aggregate encrypted model updates from the plurality of client devices;

update the deep learning core based on the aggregated encrypted model updates; and facilitate federated learning by iteratively updating the deep learning core based on encrypted updates from the client devices.

6. The system of claim 5, wherein the plurality of programming instructions further cause the computing device to:

implement differential privacy by:

adding calibrated noise to the encrypted model updates before aggregation;

enforcing a privacy budget across multiple rounds of federated learning; and dynamically adjusting the level of noise based on the privacy budget consumption;

thereby enhancing privacy guarantees for individual client datasets while maintaining model utility.

7. A method for federated deep learning using homomorphically-compressed and encrypted data, comprising the steps of:

orchestrating federated deep learning with a plurality of client devices by receiving a plurality of encrypted codewords from the plurality of client devices;

processing the encrypted codewords using a deep learning core without decrypting the codewords; and generating as output an encrypted codeword response to the input using the deep learning core;

wherein the deep learning core comprises a latent transformer core that was initially trained on encrypted codeword inputs to predict a plurality of probable future encrypted codewords that extend the input sequence.

8. The method of claim 7, wherein the deep learning core comprises a latent transformer architecture.

9. The method of claim 8, wherein each client device further comprises a variational autoencoder encoder that generates latent space vectors from the plurality of codewords.

10. The method of claim 9, wherein the latent transformer architecture processes the latent space vectors.

11. The method of claim 10, further comprising the step of generating output vectors from processed latent space vectors using a variational autoencoder decoder.

12. The method of claim 7, further comprising the steps of:

aggregating encrypted model updates from the plurality of client devices;

updating the deep learning core based on the aggregated encrypted model updates; and facilitating federated learning by iteratively updating the deep learning core based on encrypted updates from the client devices.

13. The method of claim 12, further comprising the steps of:

implementing differential privacy by:

adding calibrated noise to the encrypted model updates before aggregation;

enforcing a privacy budget across multiple rounds of federated learning; and dynamically adjusting the level of noise based on the privacy budget consumption;

thereby enhancing privacy guarantees for individual client datasets while maintaining model utility.

* * * * *